(12) United States Patent
Toyooka

(10) Patent No.: US 10,747,376 B2
(45) Date of Patent: Aug. 18, 2020

(54) TRANSFER FILM, ELECTRODE PROTECTIVE FILM FOR ELECTROSTATIC CAPACITANCE-TYPE INPUT DEVICE, LAMINATE, AND ELECTROSTATIC CAPACITANCE-TYPE INPUT DEVICE

(71) Applicant: FUJIFILM Corporation, Tokyo (JP)

(72) Inventor: Kentaro Toyooka, Fujinomiya (JP)

(73) Assignee: FUJIFILM Corporation, Tokyo (JP)

(*) Notice: Subject to any disclaimer, the term of this patent is extended or adjusted under 35 U.S.C. 154(b) by 136 days.

(21) Appl. No.: 15/922,855

(22) Filed: Mar. 15, 2018

(65) Prior Publication Data
US 2018/0203548 A1 Jul. 19, 2018

Related U.S. Application Data

(63) Continuation of application No. PCT/JP2016/073814, filed on Aug. 15, 2016.

(30) Foreign Application Priority Data

Sep. 29, 2015 (JP) .................. 2015-191320

(51) Int. Cl.
*G06F 3/044* (2006.01)
*G03F 7/033* (2006.01)
(Continued)

(52) U.S. Cl.
CPC ............... *G06F 3/044* (2013.01); *B32B 7/02* (2013.01); *B32B 27/14* (2013.01); *B32B 27/18* (2013.01);
(Continued)

(58) Field of Classification Search
CPC ........ G06F 3/041; G06F 3/044; G06F 3/0488; G03F 7/033; G03F 7/092; G03F 7/0955; Y10T 428/24802
See application file for complete search history.

(56) References Cited

U.S. PATENT DOCUMENTS

| | | | |
|---|---|---|---|
| 2015/0109252 A1 | 4/2015 | Kanna et al. | |
| 2015/0116270 A1 | 4/2015 | Kanna et al. | |
| (Continued) | | | |

FOREIGN PATENT DOCUMENTS

| | | |
|---|---|---|
| CN | 104812569 | 7/2015 |
| JP | 2014-010814 | 1/2014 |
| (Continued) | | |

OTHER PUBLICATIONS

Machine translation of detailed description of JP 2014-108541 acquired on Oct. 11, 2019.*
(Continued)

*Primary Examiner* — Gerard Higgins
(74) *Attorney, Agent, or Firm* — JCIPRNET

(57) ABSTRACT

A transfer film includes a temporary support, a first transparent resin layer, and a second transparent resin layer in this order, the second transparent resin layer includes metal oxide particles and an organic component, and, in a case in which an area of a profile of a thickness-direction distribution of a ratio of metal atoms constituting the metal oxide particles to carbon atoms constituting the organic component in the second transparent resin layer is represented by A, and a peak height of the profile is represented by P, Expression (1) is satisfied.

$0.01\ (nm)^{-1} \leq P/A \leq 0.08\ (nm)^{-1}$      Expression (1)

15 Claims, 9 Drawing Sheets

(51) Int. Cl.
G03F 7/09 (2006.01)
G06F 3/041 (2006.01)
B32B 27/18 (2006.01)
B32B 7/02 (2019.01)
G03F 7/095 (2006.01)
B32B 27/14 (2006.01)
C08L 101/06 (2006.01)
G06F 3/0488 (2013.01)

(52) U.S. Cl.
CPC ............ *C08L 101/06* (2013.01); *G03F 7/033* (2013.01); *G03F 7/092* (2013.01); *G03F 7/0955* (2013.01); *G06F 3/041* (2013.01); *G06F 3/0488* (2013.01); *B32B 2264/102* (2013.01); *B32B 2457/208* (2013.01); *C08L 2203/20* (2013.01)

(56) References Cited

U.S. PATENT DOCUMENTS

2015/0251393 A1  9/2015 Kanna et al.
2018/0001606 A1  1/2018 Kanna et al.

FOREIGN PATENT DOCUMENTS

JP  2014-108541  6/2014
JP  2014-178922  9/2014
JP  2014-189604  10/2014

OTHER PUBLICATIONS

"International Search Report (Form PCT/ISA/210) of PCT/JP2016/073814", dated Nov. 15, 2016, with English translation thereof, pp. 1-4.

"Written Opinion (Form PCT/ISA/237)", dated Nov. 15, 2016, with English translation thereof, pp. 1-6.

"Office Action of Japan Counterpart Application," dated Oct. 30, 2018, with English translation thereof, p. 1-p. 5.

"Office Action of Taiwan Counterpart Application," with English translation thereof, dated Dec. 5, 2019, p. 1-p. 8.

* cited by examiner

TRANSFER FILM, ELECTRODE PROTECTIVE FILM FOR ELECTROSTATIC CAPACITANCE-TYPE INPUT DEVICE, LAMINATE, AND ELECTROSTATIC CAPACITANCE-TYPE INPUT DEVICE

CROSS-REFERENCE TO RELATED APPLICATIONS

This application is a Continuation of PCT International Application No. PCT/JP2016/73814, filed on Aug. 15, 2016, which claims priority under 35 U.S.C. § 119(a) to Japanese Patent Application No. 2015-191320, filed on Sep. 29, 2015. Each of the above application(s) is hereby expressly incorporated by reference, in its entirety, into the present application.

BACKGROUND OF THE INVENTION

1. Field of the Invention

The present invention relates to a transfer film, an electrode protective film for an electrostatic capacitance-type input device, a laminate, and an electrostatic capacitance-type input device. Specifically, the present invention relates to an electrostatic capacitance-type input device capable of detecting contact locations by fingers using changes in electrostatic capacitance and an electrode protective film for an electrostatic capacitance-type input device, a laminate, and a transfer film which can be used for the above-described electrostatic capacitance-type input device. More specifically, the present invention relates to a transfer film that can be used to produce a laminate in which defects of a transparent resin layer having metal oxide particles are not easily visible after being transferred and the transparent electrode pattern-masking property is favorable, an electrode protective film for an electrostatic capacitance-type input device and a laminate for which the above-described transfer film is used, and an electrostatic capacitance-type input device having the above-described laminate.

2. Description of the Related Art

Recently, in electronic devices such as mobile phones, car navigations, personal computers, ticket vending machines, and bank terminals, a tablet-type input device is disposed on the surface of a liquid crystal device or the like, and, with reference to command images displayed in image display regions in the liquid crystal device, places on which the command images are displayed are touched using fingers or styluses, thereby inputting information corresponding to the command images.

As the above-described input device (touch panel), there are resistance film-type input devices, electrostatic capacitance-type input devices, and the like. Electrostatic capacitance-type input devices have an advantage that a translucent conductive film needs to be formed only on one substrate. As such electrostatic capacitance-type input devices, for example, there are input devices in which electrode patterns are extended in mutually intersecting directions and input locations are detected by sensing changes in electrostatic capacitance between electrodes caused in a case in which the input devices are contacted by fingers or the like.

For the purpose of protecting guidance wires (for example, metal wires such as copper wires) arranged in electrode patterns or frame portions in the electrostatic capacitance-type input devices, a transparent resin layer is provided on a side opposite to a surface on which information is input using fingers or the like.

In the case of using the above-described electrostatic capacitance-type input devices, there has been a problem with the transparent electrode pattern-masking property, for example, in locations slightly away from a location in which a light source is regular-reflected, transparent electrode patterns become visible, and the appearance becomes poor.

In contrast, JP2014-108541A discloses a transfer film including a temporary support, a first curable transparent resin layer, and a second curable transparent resin layer disposed adjacent to the first curable transparent resin layer in this order, in which the refractive index of the second curable transparent resin layer is higher than the refractive index of the first curable transparent resin layer, and the refractive index of the second curable transparent resin layer is 1.6 or higher. JP2014-108541A describes that the problem of transparent electrode patterns becoming visible can be solved.

SUMMARY OF THE INVENTION

As a method for adjusting the refractive index of the second curable transparent resin layer to 1.6 or more, JP2014-108541A describes a method in which metal oxide particles are added.

As a result of the present inventors' studies regarding the characteristics of a transparent resin layer having the above-described metal oxide particles, it was found that there are cases in which a distribution of the metal oxide particles is caused in the transparent resin layer. Particularly, it was newly found that, in a case in which there are regions having a high metal oxide concentration in the depth direction of the transparent resin layer, linear defects (fissures) may be caused in the transparent resin layer during the formation of the transparent resin layer (for example, during coating and drying in a case in which the transparent resin layer is formed by means of coating) or during the lamination of the transparent resin layer from a transfer film having the transparent resin layer to a member to which the transparent resin layer is to be transferred. In a case in which linear defects are caused in the transparent resin layer, a defect of linear light leakage is caused during the use of the transparent resin layer as an electrode protective film in an electrostatic capacitance-type input device. Therefore, there is a demand not only for the production of a laminate having a favorable transparent electrode pattern-masking property but also for a transfer film in which defects of a transparent resin layer having metal oxide particles do not easily become visible after being transferred.

An object of the present invention is to provide a transfer film that can be used to produce a laminate in which defects of a transparent resin layer having metal oxide particles do not easily become visible after being transferred and the transparent electrode pattern-masking property is favorable.

The present inventors found that a laminate in which defects of a transparent resin layer having metal oxide particles do not easily become visible after being transferred and the transparent electrode pattern-masking property is favorable can be produced by determining the ratio between metal atoms constituting metal oxide particles in the transparent resin layer having the metal oxide particles and an organic component.

The present invention which is specific means for achieving the above-described object and preferred aspects of the present invention are as described below.

[1] A transfer film comprising: a temporary support; a first transparent resin layer; and a second transparent resin layer in this order, in which the second transparent resin layer includes metal oxide particles and an organic component, and, in a case in which an area of a profile of a thickness-direction distribution of a ratio of metal atoms constituting the metal oxide particles to carbon atoms constituting the organic component in the second transparent resin layer is represented by A, and a peak height of the profile is represented by P, Expression (1) is satisfied:

$$0.01 \text{ (nm)}^{-1} \leq P/A \leq 0.08 \text{ (nm)}^{-1} \quad \text{Expression (1)}.$$

[2] In the transfer film according to [1], in a case in which the area of the profile is represented by A, and the peak height of the profile is represented by P, Expression (2) is preferably satisfied:

$$0.02 \text{ (nm)}^{-1} \leq P/A \leq 0.05 \text{ (nm)}^{-1} \quad \text{Expression (2)}.$$

[3] In the transfer film according to [1] or [2], the peak height P of the profile is preferably 0.2 to 1.5.

[4] In the transfer film according to any one of [1] to [3], the peak height P of the profile is preferably 0.4 to 1.2.

[5] In the transfer film according to any one of [1] to [4], the first transparent resin layer and the second transparent resin layer are preferably alkali-soluble.

[6] In the transfer film according to any one of [1] to [5], it is preferable that the first transparent resin layer includes polymerizable compounds and a binder polymer, and a mass ratio of the polymerizable compounds to the binder polymer is 0.9 or less.

[7] In the transfer film according to [6], the binder polymer is preferably an alkali-soluble resin.

[8] In the transfer film according to any one of [1] to [7], it is preferable that the first transparent resin layer includes polymerizable compounds, and a molecular weight of a polymerizable compound having a minimal molecular weight among all of the polymerizable compounds included in the first transparent resin layer is 250 or more.

[9] In the transfer film according to any one of [1] to [8], it is preferable that the first transparent resin layer includes polymerizable compounds, and a ratio of a content of polymerizable compounds having a molecular weight of 300 or less to a content of all of the polymerizable compounds included in the first transparent resin layer is 30% or less.

[10] In the transfer film according to any one of [1] to [9], the metal oxide particles are preferably zirconium oxide particles or titanium oxide particles.

[11] In the transfer film according to any one of [1] to [10], the first transparent resin layer and the second transparent resin layer are preferably in direct contact with each other.

[12] An electrode protective film for an electrostatic capacitance-type input device which is obtained by removing the temporary support from the transfer film according to any one of [1] to [11].

[13] A laminate comprising: a substrate including an electrode of an electrostatic capacitance-type input device; a second transparent resin layer located on the substrate; and a first transparent resin layer in this order, in which the first transparent resin layer and the second transparent resin layer are formed by transferring the first transparent resin layer and the second transparent resin layer from the transfer film according to any one of [1] to [11] onto the substrate.

[14] An electrostatic capacitance-type input device comprising: the electrode protective film for an electrostatic capacitance-type input device according to [12] or the laminate according to [13].

According to the present invention, it is possible to provide a transfer film that can be used to produce a laminate in which defects of a transparent resin layer having metal oxide particles do not easily become visible after being transferred and the transparent electrode pattern-masking property is favorable.

BRIEF DESCRIPTION OF THE DRAWINGS

FIG. 14 is a schematic view illustrating an example of a state in which the transfer film of the present invention having the first transparent resin layer and a second transparent resin layer is laminated on the transparent electrode pattern in the electrostatic capacitance-type input device by means of lamination and is yet to be cured by means of exposure or the like.

DESCRIPTION OF THE PREFERRED EMBODIMENTS

Figure 1A:
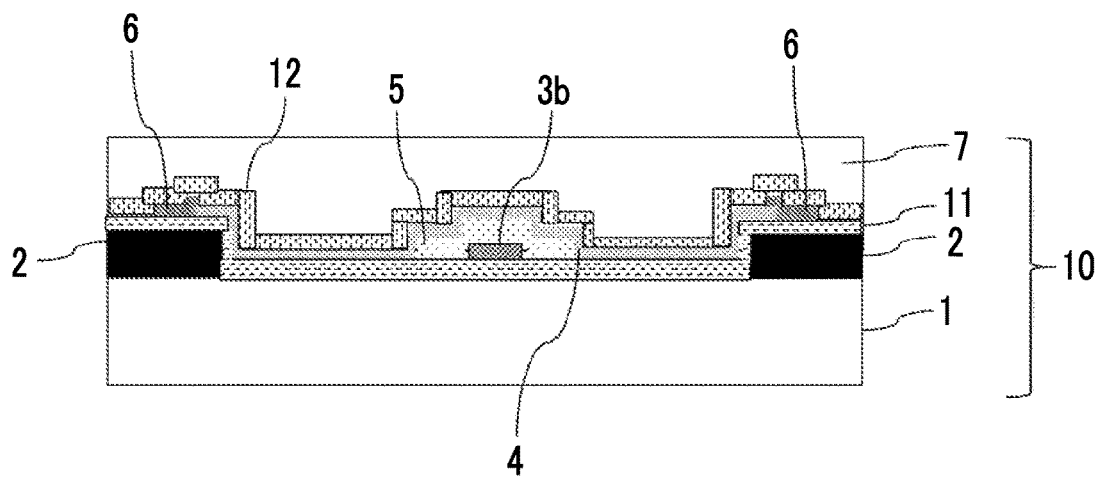
FIG. 1A is a schematic cross-sectional view illustrating an example of a constitution of an electrostatic capacitance-type input device of the present invention.

Hereinafter, the present invention will be described. Hereinafter, there are cases in which constituent requirements will be described on the basis of typical embodiments or specific examples of the present invention, but the present invention is not limited to such embodiments or specific examples. Meanwhile, in the present specification, numerical ranges expressed using "to" include numerical values before and after "to" as the lower limit value and the upper limit value. "(Meth)acryl" refers to both "methacryl" and "acryl", which is also true to other "(meth)" cases.

[Transfer Film]

A transfer film of the present invention is a transfer film having a temporary support, a first transparent resin layer, and a second transparent resin layer in this order, in which the second transparent resin layer includes metal oxide particles and an organic component, and, in a case in which an area of a profile of a thickness-direction distribution of a ratio of metal atoms constituting the metal oxide particles to carbon atoms constituting the organic component in the second transparent resin layer is represented by A, and a peak height of the profile is represented by P, Expression (1) is satisfied:

$$0.01\ (nm)^{-1} \leq P/A \leq 0.08\ (nm)^{-1} \qquad \text{Expression (1).}$$

Due to the above-described constitution, the transfer film of the present invention can be used to produce a laminate in which defects of a transparent resin layer having metal oxide particles do not easily become visible after being transferred and the transparent electrode pattern-masking property is favorable.

Although not related to any theories, the mechanism by which laminates having a favorable transparent electrode pattern-masking property can be produced in a case in which P/A is equal to or more than the lower limit value of Expression (1) is assumed that reflection on transparent electrode interfaces can be reduced by increasing the refractive index of the second transparent resin layer. The mechanism by which defects of the transparent resin layer having the metal oxide particles do not easily become visible after being transferred in a case in which P/A is equal to or less than the upper limit value of Expression (1) is assumed that the number of brittle regions causing fissures or ruptures is decreased by reducing regions having a high metal oxide concentration in the depth direction of the second transparent resin layer having the metal oxide particles.

Particularly, in a case in which, after the formation of the first transparent resin layer, the second transparent resin layer is laminated without sufficiently curing the first transparent resin layer, soaking between the first transparent resin layer and the second transparent resin layer slightly occurs during the lamination of the second transparent resin layer, and a distribution of the metal oxide particles is likely to be caused in the second transparent resin layer. The present invention is particularly effective in a case in which the second transparent resin layer is laminated without sufficiently curing the above-described first transparent resin layer. Meanwhile, the first transparent resin layer and the second transparent resin layer may be separated from each other by forming the first transparent resin layer by means of coating, then, curing the first transparent resin layer with ultraviolet (UV) light, and then forming the second transparent resin layer having the metal oxide particles by means of coating.

Hereinafter, a preferred aspect of the transfer film of the present invention will be described.

Figure 12:
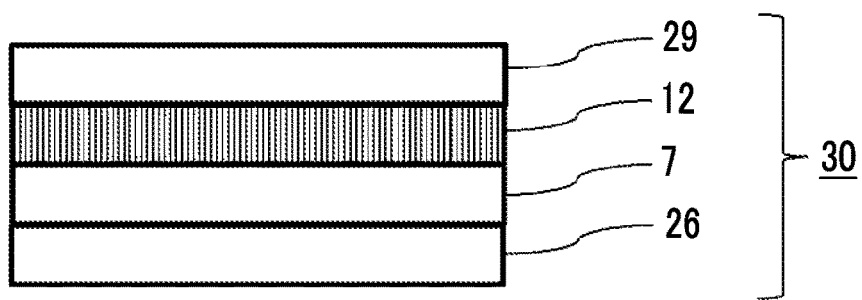
FIG. 12 is a schematic cross-sectional view illustrating an example of a constitution of a transfer film of the present invention.

FIG. 12 illustrates an example of a preferred constitution of the transfer film of the present invention. FIG. 12 is a schematic view of a transfer film 30 in which a temporary support 26, a first transparent resin layer 7, a second transparent resin layer 12, and a protective film 29 are laminated adjacent to each other in this order.

<Temporary Support>

The temporary support that is used in the transfer film is not particularly limited.

(Thickness)

The thickness of the temporary support is not particularly limited, but is generally in a range of 5 to 200 μm and particularly preferably in a range of 10 to 150 μm from the viewpoint of ease of handling, versatility, and the like.

(Material)

The temporary support is preferably a film and more preferably a resin film.

As the film that is used as the temporary support, it is possible to use flexible materials that do not significantly deform, contract, or extend under pressurization or under pressurization and heating. Examples of the above-described temporary support include polyethylene terephthalate films, triacetylcellulose films, polystyrene films, polycarbonate films, and the like, and, among these, biaxially-stretched polyethylene terephthalate films are particularly preferred.

In addition, the temporary support may be transparent and may contain dyed silicon, an alumina sol, a chromium salt, a zirconium salt, or the like.

In addition, the temporary support can be imparted with a conductive property using the method described in JP2005-221726A.

<Constitution of First Transparent Resin Layer>

The first transparent resin layer may be photocurable or thermocurable and photocurable. Among these, the first transparent resin layer and the second transparent resin layer described below are preferably thermocurable transparent resin layers and photocurable transparent resin layers since it is easy to produce the layers by means of photocuring after transfer and it is possible to impart the reliability of the layers by thermally curing the layers after being produced.

Meanwhile, in the present specification, for the convenience of description, in a case in which the first transparent resin layer and the second transparent resin layer of the transfer film of the present invention are transferred onto a transparent electrode pattern, and the layers are photocured and then lose the photocurable property, the layers will be continuously referred to as "first transparent resin layer" and "second transparent resin layer" regardless of whether or not the layers are thermocurable. Furthermore, there are also cases in which the layers are photocured and then thermally cured, and, even in these cases, the layers will be continuously referred to as "first transparent resin layer" and "second transparent resin layer" regardless of whether or not the layers are curable. Similarly, in case in which the first transparent resin layer and the second transparent resin layer of the transfer film of the present invention are transferred onto a transparent electrode pattern, and the layers are thermally cured and then lose the thermocurable property, the layers will be continuously referred to as "first transparent resin layer" and "second transparent resin layer" regardless of whether or not the layers are photocurable.

In the transfer film of the present invention, the first transparent resin layer is preferably alkali-soluble. The resin layer being alkali-soluble means that the resin layer is dissolved in a weak alkaline aqueous solution, and it is preferable that the resin layer can be developed using weak alkaline aqueous solutions.

(Thickness)

In the transfer film of the present invention, the thickness of the first transparent resin layer is preferably 1 to 20 μm, more preferably 2 to 15 μm, and particularly preferably 3 to 12 μm. The first transparent resin layer is preferably used in an image display portion of an electrostatic capacitance-type input device, and, in such a case, it is important to increase the transparency and the transmittance. In a case in which the thickness of the first transparent resin layer is sufficiently thin, the transmittance does not easily decrease due to the absorption by the first transparent resin layer, and yellow coloration does not easily occur since it becomes difficult to absorb short wavelengths.

(Refractive Index)

In the transfer film of the present invention, the refractive index of the first transparent resin layer is preferably 1.5 to 1.53, more preferably 1.5 to 1.52, and particularly preferably 1.51 to 1.52.

(Composition)

In the transfer film of the present invention, the first transparent resin layer may be a negative-type material or a positive-type material.

The transfer film of the present invention is preferably a negative-type material.

A method for controlling the refractive index of the first transparent resin layer is not particularly limited, and it is possible to singly use a transparent resin layer having a desired refractive index, use a transparent resin layer to which particles such as metal particles, or metal oxide particles are added, or use a complex of a metal salt and a macromolecule.

Furthermore, in the first transparent resin layer, additives may also be used. Examples of the additives include the surfactants described in Paragraph 0017 of JP4502784B and Paragraphs 0060 to 0071 of JP2009-237362A, well-known fluorine-based surfactants, the thermal polymerization inhibitors described in Paragraph 0018 of JP4502784B and, furthermore, other additives described in Paragraphs 0058 to 0071 of JP2000-310706A. Examples of additives that are preferably used in the first transparent resin layer include MEGAFACE F-551 (manufactured by DIC Corporation) which is a well-known fluorine-based surfactant.

Hitherto, the transfer film has been described mainly using the case in which the transfer film of the present invention is a negative-type material, but the transfer film of the present invention may also be a positive-type material.

—Binder Polymer—

In the transfer film of the present invention, the first transparent resin layer preferably includes a binder polymer.

In the transfer film of the present invention, the binder polymer in the first transparent resin layer is preferably an alkali-soluble resin.

The binder polymer in the first transparent resin layer is preferably an acrylic resin.

The acid value of the binder polymer is not particularly limited, but the binder polymer is preferably a carboxyl group-containing acrylic resin having an acid value of 60 mgKOH/g or more. It is assumed that, in a case in which a carboxyl group-containing resin is thermally crosslinked by adding a blocked isocyanate, the three-dimensional crosslinking density increases, an anhydride of the carboxyl group in the carboxyl group-containing resin is formed and hydrophobilized, or the like, which contributes to the improvement of the heat and moisture resistance after the supply of saline water.

The first transparent resin layer may also include other binder polymers other than the carboxyl group-containing acrylic resin having an acid value of 60 mgKOH/g or more.

As other binder polymers that are included in the first transparent resin layer, arbitrary polymer components can be used without any particular limitations, and, from the viewpoint of using the first transparent resin layer as transparent protective layers in electrostatic capacitance-type input devices, polymer components having high surface hardness and favorable heat resistance are preferred, alkali-soluble resins are more preferred, and, among alkali-soluble resins, well-known photosensitive siloxane resin materials and the like are preferably used.

The binder polymer that is included in organic solvent-based resin compositions that are used to form the first transparent resin layer is preferably a carboxyl group-containing acrylic resin having an acid value of 60 mgKOH/g or more. Both the binder polymer that is included in organic solvent-based resin compositions that are used to form the first transparent resin layer and a resin or binder polymer having an acidic group that is included in water-based resin compositions that are used to form the second transparent resin layer more preferably contain an acrylic resin from the viewpoint of enhancing interlaminar adhesion before and after the transfer of the first transparent resin layer and the second transparent resin layer. A preferred range of the binder polymer that is used in the first transparent resin layer will be specifically described.

The binder polymer which is a carboxyl group-containing acrylic resin having an acid value of 60 mgKOH/g or more (referred to as binder polymer) is not particularly limited within the scope of the gist of the present invention, can be appropriately selected from well-known binder polymers, and the binder polymer which is a carboxyl group-containing acrylic resin having an acid value of 60 mgKOH/g or more among the polymers described in Paragraph 0025 of JP2011-95716A and the binder polymer which is a carboxyl group-containing acrylic resin having an acid value of 60 mgKOH/g or more among the polymers described in Paragraphs 0033 to 0052 of JP2010-237589A are preferably used. In addition, as the binder polymer which is a carboxyl group-containing acrylic resin having an acid value of 60 mgKOH/g or more, Compound A and Compound B which are used in examples described below are particularly preferred.

The acid value of the binder polymer which is a carboxyl group-containing acrylic resin having an acid value of 60 mgKOH/g or more is preferably 60 to 200 mgKOH/g, more preferably 60 to 150 mgKOH/g, and particularly preferably 60 to 110 mgKOH/g.

As the acid value of the binder polymer, the value of a theoretical acid value computed using the calculation method described in the following documents and the like is used: [0063] of JP2004-149806A and [0070] of JP2012-211228A.

The first transparent resin layer may also include a polymer latex as the binder polymer. The polymer latex mentioned herein is a latex obtained by dispersing the particles of a water-insoluble polymer in water. The polymer latex is described in, for example, "Chemistry of high-molecular-weight latex (published by Kobunshi Kankokai (1973))" by Muroi Soichi.

Polymer particles that can be used are preferably polymer particles of a polymer such as an acrylic polymer, a vinyl acetate-based polymer, a rubber-based (for example, styrene-butadiene-based or chloroprene-based) polymer, an olefin-based polymer, a polyester-based polymer, a polyurethane-based polymer, a polystyrene-based polymer or a copolymer thereof.

It is preferable to strengthen the bonding forces between polymer chains constituting the polymer particles. Examples of means for strengthening the bonding forces between polymer chains include means for using interactions attributed to hydrogen bonds and methods for generating covalent bonds. Means for imparting the hydrogen bonding force is preferably the introduction of monomers having a polar group into polymer chains by means of copolymerization or graft polymerization.

Examples of the polar group in the binder polymer include carboxyl groups (included in acrylic acid, methacrylic acid, itaconic acid, fumaric acid, maleic acid, crotonic acid, partially-esterified maleic acid, and the like), primary, secondary, and tertiary amino groups, ammonium salt groups, sulfonic acid groups (styrenesulfonic acid), and the like, and the binder polymer which is a carboxyl group-containing acrylic resin having an acid value of 60 mgKOH/g or more preferably has at least a carboxyl group.

A preferred range of the copolymerization ratio of the monomers having a polar group is in a range of 5% to 50% by mass, more preferably 5% to 40% by mass, and still more preferably 20% to 30% by mass with respect to 100% by mass of the polymer. In the binder polymer which is a carboxyl group-containing acrylic resin having an acid value of 60 mgKOH/g or more, a preferred range of the copolymerization ratio of monomers having a carboxyl group is preferably 5% to 50% by mass, more preferably 5% to 40% by mass, and still more preferably in a range of 20% to 30% by mass with respect to 100% by mass of the polymer. Meanwhile, examples of means for generating covalent bonds include methods in which an epoxy compound, blocked isocyanate, isocyanate, a vinylsulfone compound, an aldehyde compound, a methylol compound, a carboxylic acid anhydride, or the like is reacted with a hydroxyl group, a carboxyl group, a primary or secondary amino group, an acetoacetyl group, a sulfonic acid group, or the like.

The weight-average molecular weight of the binder polymer is preferably 10,000 or more and more preferably 20,000 to 100,000.

The polymer latex that can be used in the present invention may be a polymer latex obtained by emulsification polymerization or a polymer latex obtained by emulsification. Methods for preparing the polymer latex are described in, for example, "Emulsion Latex Handbook" (edited by the emulsion latex handbook editorial committee, published by Taiseisha Ltd. (1975)).

Examples of the polymer latex that can be used in the present invention include polymer latexes obtained by ammonia-neutralizing and emulsifying alkyl acrylate copolymer-ammonium (trade name: JURYMER AT-210, manufactured by Toagosei Co., Ltd.), alkyl acrylate copolymer-ammonium (trade name: JURYMER ET-410, manufactured by Toagosei Co., Ltd.), alkyl acrylate copolymer-ammonium (trade name: JURYMER AT-510, manufactured by Toagosei Co., Ltd.), or polyacrylic acid (trade name: JURYMER AC-10L, manufactured by Toagosei Co., Ltd.).

—Polymerizable Compound—

In the transfer film of the present invention, the first transparent resin layer preferably includes a polymerizable compound, more preferably includes a polymerizable compound having an ethylenic unsaturated group, and particularly preferably includes a photopolymerizable compound having an ethylenic unsaturated group. The polymerizable compound preferably has at least one ethylenic unsaturated group as the photopolymerizable group and may also have an epoxy group or the like in addition to the ethylenic unsaturated group. As the polymerizable compound in the first transparent resin layer, a compound having a (meth)acryloyl group is more preferably included.

The polymerizable compound that is used in the transfer film may be used singly or two or more polymerizable compounds may be used in combination, but two or more polymerizable compounds are preferably used in combination from the viewpoint of improving the heat and moisture resistance after the supply of saline water after the exposure of the transferred first transparent resin layer. As the polymerizable compound that is used in the transfer film of the present invention, a tri- or higher-functional polymerizable compound and a difunctional polymerizable compound are preferably used in combination from the viewpoint of improving the heat and moisture resistance after the supply of saline water after the exposure of the transferred first transparent resin layer. The content of the difunctional polymerizable compound being used is preferably in a range of 10% to 90% by mass, more preferably in a range of 20% to 85% by mass, and particularly preferably in a range of 30% to 80% by mass of all of the polymerizable compounds. The content of the tri- or higher-functional polymerizable compound being used is preferably in a range of 10% to 90% by mass, more preferably in a range of 15% to 80% by mass, and particularly preferably in a range of 20% to 70% by mass of all of the polymerizable compounds. The transfer film preferably includes, as the polymerizable compounds, at least a compound having two ethylenic unsaturated groups and a compound having at least three ethylenic unsaturated groups and more preferably includes at least a compound having two (meth)acryloyl groups and a compound having at least three (meth)acryloyl groups.

In addition, in the transfer film, at least one polymerizable compound preferably includes a carboxyl group from the viewpoint of further enhancing the heat and moisture resistance after the supply of saline water by a carboxylic acid anhydride being formed by the carboxyl group in the binder polymer and the carboxyl group in the polymerizable compound. The polymerizable compound having a carboxyl group is not particularly limited, and commercially available compounds can be used. For example, ARONIX TO-2349 (manufactured by Toagosei Co., Ltd.), ARONIX M-520 (manufactured by Toagosei Co., Ltd.), ARONIX M-510 (manufactured by Toagosei Co., Ltd.), and the like can be preferably used. The content of the polymerizable compound containing a carboxyl group being used is preferably in a range of 1% to 50% by mass, more preferably in a range of 1% to 30% by mass, and particularly preferably in a range of 5% to 15% by mass of all of the polymerizable compounds.

The first transparent resin layer preferably includes, as the polymerizable compound, an urethane (meth)acrylate compound. The amount of the urethane (meth)acrylate compound mixed is preferably 10% by mass or more and more preferably 20% by mass or more of all of the polymerizable compounds. In the urethane (meth)acrylate compound, the number of functional groups in the photopolymerizable groups, that is, the number of (meth)acryloyl groups is preferably three or more and more preferably four or more.

Photopolymerizable compounds having a difunctional ethylenic unsaturated group are not particularly limited as long as the compounds have two ethylenic unsaturated groups in the molecule, and commercially available (meth)

acrylate compounds can be used. For example, it is possible to preferably use tricyclodecane dimethanol diacrylate (A-DCP, manufactured by Shin-Nakamura Chemical Co., Ltd.), tricyclodecane dimethanol dimethacrylate (DCP, manufactured by Shin-Nakamura Chemical Co., Ltd.), 1,9-nonanediol diacrylate (A-NOD-N, manufactured by Shin-Nakamura Chemical Co., Ltd.), 1,6-hexanediol diacrylate (A-HD-N, manufactured by Shin-Nakamura Chemical Co., Ltd.), and the like.

Photopolymerizable compounds having a tri- or higher-functional ethylenic unsaturated group is not particularly limited as long as the compounds have three or more ethylenic unsaturated groups in the molecule, and, for example, it is possible to use (meth)acrylate compounds having a skeleton such as dipentaerythritol (tri/tetra/penta/hexa)acrylates, pentaerythritol (tri/tetra)acrylates, trimethylolpropane triacrylate, ditrimethylolpropane tetraacrylate (AD-TMP manufactured by Shin-Nakamura Chemical Co., Ltd.), isocyanurate acrylate and glycerine triacrylate, and (meth)acrylate compounds having a long span length between (meth)acrylic acids are preferred. Specifically, it is possible to preferably use caprolactone-modified compounds (KAYARAD DPCA manufactured by Nippon Kayaku Co., Ltd., A-9300-1CL manufactured by Shin-Nakamura Chemical Co., Ltd., and the like), alkylene oxide-modified compounds (KAYARAD RP-1040 manufactured by Nippon Kayaku Co., Ltd., ATM-35E and A-9300 manufactured by Shin-Nakamura Chemical Co., Ltd., EBECRYL 135 manufactured by Daicel-Allnex Ltd., and the like), ethoxylated glycerine triacrylates (A-GLY-9E manufactured by Shin-Nakamura Chemical Co., Ltd. and the like), and the like of the above-described (meth)acrylate compounds having a skeleton such as dipentaerythritol (tri/tetra/penta/hexa) acrylates, pentaerythritol (tri/tetra)acrylates, trimethylolpropane triacrylate, ditrimethylolpropane tetraacrylate, and isocyanurate acrylate. In addition, it is preferable to use tri- or higher-functional urethane (meth)acrylates. As the tri- or higher-functional urethane (meth)acrylates, it is possible to preferably use 8UX-015A (manufactured by Taisei Fine Chemical Co., Ltd.), UA-32P (manufactured by Shin-Nakamura Chemical Co., Ltd.), UA-1100H (manufactured by Shin-Nakamura Chemical Co., Ltd.,), and the like.

The weight-average molecular weight of the polymerizable compound that is used in the transfer film is preferably 200 to 3,000, more preferably 250 to 2,600, and particularly preferably 280 to 2,200.

In the transfer film of the present invention, from the viewpoint of easily controlling P/A in which P represents the peak height of the profile of the thickness-direction distribution of M/C in the second transparent resin layer and A presents the area of the profile in a case in which the first transparent resin layer and the second transparent resin layer are in direct contact with each other to a preferred range, the molecular weight of a polymerizable compound having a minimal molecular weight among all of the polymerizable compounds included in the first transparent resin layer is preferably 250 or more, more preferably 280 or more, and particularly preferably 300 or more.

In the transfer film of the present invention, from the viewpoint of easily controlling P/A in which P represents the peak height of the profile of the thickness-direction distribution of M/C in the second transparent resin layer and A represents the area of the profile in a case in which the first transparent resin layer and the second transparent resin layer are in direct contact with each other to a preferred range, the first transparent resin layer includes the polymerizable compounds, and the ratio of the content of polymerizable compounds having a molecular weight of 300 or less to the content of all of the polymerizable compounds included in the first transparent resin layer is preferably 30% or less, more preferably 25% or less, and particularly preferably 20% or less.

In the transfer film of the present invention, from the viewpoint of easily controlling P/A in which P represents the peak height of the profile of the thickness-direction distribution of M/C in the second transparent resin layer and A represents the area of the profile in a case in which the first transparent resin layer and the second transparent resin layer are in direct contact with each other to a preferred range, the first transparent resin layer includes the polymerizable compounds and the binder polymer, and the mass ratio of the polymerizable compounds to the binder polymer is preferably 0.9 or less, more preferably 0.7 or less, particularly preferably 0.1 to 0.7, and more particularly preferably 0.3 to 0.7.

—Polymerization Initiator—

In the transfer film of the present invention, the first transparent resin layer preferably includes a polymerization initiator and more preferably includes a photopolymerization initiator. In a case in which the first transparent resin layer includes the polymerizable compound and the polymerization initiator, it is possible to facilitate the formation of patterns of the first transparent resin layer.

As the polymerization initiator that can be used in organic solvent-based resin compositions, it is possible to use the photopolymerization initiators described in Paragraphs "0031" to "0042" of JP2011-95716A. For example, it is possible to preferably use 1,2-octane dione, 1-[4-(phenylthio)-, 2-(O-benzoyloxime)] (trade name: IRGACURE OXE-01, manufactured by BASF), additionally, ethanone, 1-[9-ethyl-6-(2-methylbenzoyl)-9H-carbazole-3-yl]-, 1-(O-acetyloxime) (trade name: IRGACURE OXE-02, manufactured by BASF), 2-(dimethylamino)-2-[(4-methylphenyl) methyl]-1-[4-(4-morpholinyl)phenyl]-1-butanone (trade name: IRGACURE 379EG, manufactured by BASF), 2-methyl-1-(4-methyl thiophenyl)-2-morpholino propan-1-one (trade name: IRGACURE 907, manufactured by BASF), 2-hydroxy-1-{4-[4-(2-hydroxy-2-methyl-propionyl)-benzyl]phenyl}-2-methyl-propan-1-one (trade name: IRGACURE 127, manufactured by BASF), 2-benzyl-2-dimethylamino-1-(4-morpholinophenyl)-butanone-1 (trade name: IRGACURE 369, manufactured by BASF), 2-hydroxy-2-methyl-1-phenyl-erypropan-1-one (trade name: IRGACURE 1173, manufactured by BASF), 1-hydroxy-cyclohexyl-phenyl-ketone (trade name: IRGACURE 184, manufactured by BASF), 2,2-dimethoxy-1,2-diphenyl ethane-1-one (trade name: IRGACURE 651, manufactured by BASF), oxime ester-based photopolymerization initiator (trade name: Lunar 6, manufactured by DKSH Japan K.K.), and the like.

The content of the polymerization initiator is preferably 1% by mass or more and more preferably 2% by mass or more of the first transparent resin layer. The content of the polymerization initiator is preferably 10% by mass or less and more preferably 5% by mass or less of the first transparent resin layer from the viewpoint of improving the patterning property and substrate adhesion of the laminate of the present invention.

—Compound Capable of Reacting Acids by Heating—

In the transfer film of the present invention, the first transparent resin layer preferably includes a compound capable of reacting with acids by heating.

The compound capable of reacting with acids by heating is not particularly limited within the scope of the gist of the present invention. The compound capable of reacting with acids by heating is preferably a compound that becomes more highly reactive with acids after being heated to higher than 25° C. compared with the reactivity at 25° C. The compound capable of reacting with acids by heating is preferably a compound which has a group capable of reacting with acids that are temporarily inactivated by blocking agents and in which blocking agent-derived groups are dissociated at a predetermined dissociation temperature.

Examples of the compound capable of reacting with acids by heating include carboxylic acid compounds, alcohol compounds, amine compounds, blocked isocyanates, epoxy compounds, and the like, and the compound capable of reacting with acids by heating is preferably a blocked isocyanate.

The compound capable of reacting with acids by heating which has a hydrophilic group in the molecule is not particularly limited, and well-known compounds can be used. A method for preparing the compound capable of reacting with acids by heating which has a hydrophilic group in the molecule is not particularly limited, and the compound can be prepared by means of, for example, synthesis.

The compound capable of reacting with acids by heating which has a hydrophilic group in the molecule is preferably a blocked isocyanate having a hydrophilic group in the molecule. The detail of the compound capable of reacting with acids by heating which has a hydrophilic group in the molecule will be described in the section of a blocked isocyanate below.

The blocked isocyanate refers to "a compound having a structure in which isocyanate groups in an isocyanate are protected (masked) with a blocking agent".

The initial glass transition temperature (Tg) of the blocked isocyanate is preferably −40° C. to 10° C. and more preferably −30° C. to 0° C.

The dissociation temperature of the blocked isocyanate is preferably 100° C. to 160° C. and more preferably 130° C. to 150° C.

In the present specification, the dissociation temperature of the blocked isocyanate refers to "the temperature of an endothermic peak generated by a deprotection reaction of the blocked isocyanate in the case of being measured by means of differential scanning calorimetry (DSC) using a differential scanning calorimeter (manufactured by Seiko Instruments Inc., DSC6200)".

Examples of the blocking agent having a dissociation temperature of 100° C. to 160° C. include pyrazole-based compounds (3,5-dimethylpyrazole, 3-methylpyrazole, 4-bromo-3,5-dimethylpyrazole, 4-nitro-3,5-dimethylpyrazole, and the like), active methylene-based compounds (malonic acid diesters (dimethyl malonate, diethyl malonate, n-butyl malonate, and di-2-ethylhexyl malonate) and the like), triazole-based compounds (1,2,4-triazole and the like), oxime-based compounds (compounds having a structure represented by —C(=N—OH)— in the molecule such as formaldoxime, acetoaldoxime, acetoxime, methyl ethyl ketoxime, and cyclohexanone oxime), and the like. Among these, from the viewpoint of storage stability, oxime-based compounds and pyrazole-based compounds are preferred, and oxime-based compounds are particularly preferred.

The blocked isocyanate preferably has an isocyanurate structure from the viewpoint of the brittleness of films and base material bonding forces. The blocked isocyanate having an isocyanurate structure can be prepared by, for example, turning hexamethylene diisocyanate into isocyanurate.

Among blocked isocyanates having an isocyanurate structure, compounds having an oxime structure for which an oxime-based compound is used as a blocking agent are more preferred than compounds not having an oxime structure since it is easy to set the dissociation temperature in a preferred range and decrease development residues.

In the blocked isocyanate, the number of blocked isocyanate groups per molecule is preferably 1 to 10, more preferably 2 to 6, and particularly preferably 3 or 4.

As the blocked isocyanate, the blocked isocyanate compounds described in 0074 to 0085 of JP2006-208824A may be used, the content of which is incorporated into the present specification.

Specific examples of the blocked isocyanate that is used in the transfer film of the present invention include the following compounds. However, the blocked isocyanate that is used in the present invention is not limited to the following specific examples.

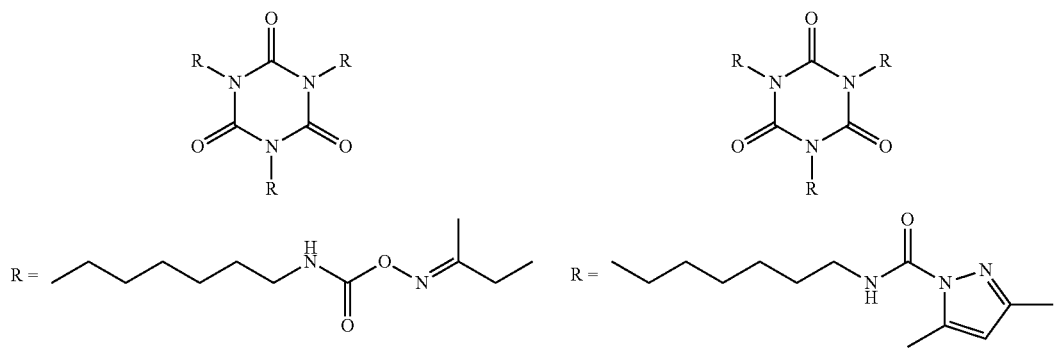

-continued

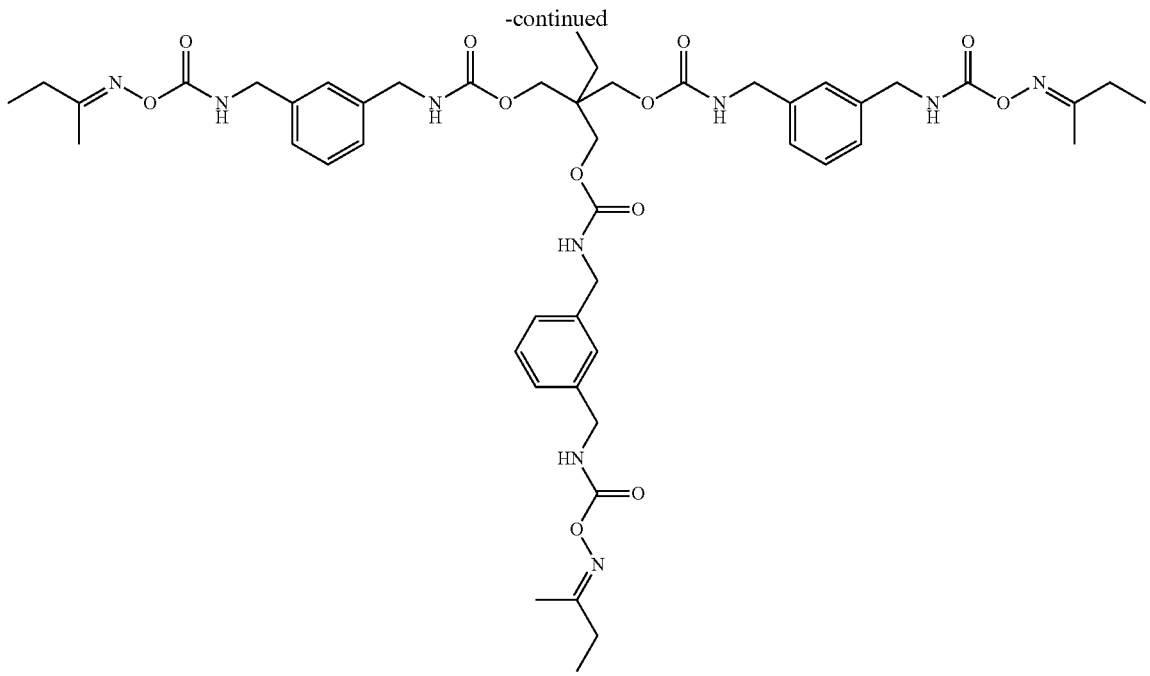

As the blocked isocyanate that is used in the transfer film, it is possible to use commercially available blocked isocyanates. Examples thereof include TAKENATE (registered trademark) B870N (manufactured by Mitsui Chemicals, Inc.) which is a methyl ethyl ketone oxime blocked body of isophorone diisocyanate, DURANATE (registered trademark) MF-K60B, TPA-B80E, X3071. 04 (all manufactured by Asahi Kasei Corporation) which are hexamethylene diisocyanate-based blocked isocyanate compounds, and the like.

In the blocked isocyanate having a hydrophilic group in the molecule, at least some of isocyanate groups are preferably a blocked isocyanate which is an aqueous isocyanate group to which a hydrophilic group is added. The blocked isocyanate having a hydrophilic group in the molecule can be obtained by reacting an isocyanate group in a polyisocyanate and a blocking agent (in some cases, also referred to as the amine-based compound). Examples of the reaction method include a method in which a hydrophilic group is added to some of isocyanate groups in a polyisocyanate by chemical reactions.

The hydrophilic group in the compound capable of reacting with acids by heating is not particularly limited, and specific examples thereof include nonionic hydrophilic groups, cationic hydrophilic groups, and the like.

The nonionic hydrophilic groups are not particularly limited, and specific examples thereof include compounds obtained by adding ethylene oxide or propylene oxide to hydroxyl groups of alcohols such as methanol, ethanol, butanol, ethylene glycol, or diethylene glycol. That is, the hydrophilic group in the compound capable of reacting with acids by heating which has the hydrophilic group in the molecule is preferably an ethylene oxide chain or a propylene oxide chain. These compounds have active hydrogen that reacts with isocyanate groups and thus can be added to isocyanate groups. Among these, monoalcohols that can be dispersed in water in a small amount used are preferred.

In addition, the addition number of ethylene oxide chains or propylene oxide chains is preferably 4 to 30 and more preferably 4 to 20. In a case in which the addition number is 4 or more, there is a tendency that the water dispersibility further improves. In addition, in a case in which the addition number is 30 or less, there is a tendency that the initial Tg of the obtained blocked isocyanate further improves.

Examples of a method for adding the cationic hydrophilic group include a method in which a compound having both the cationic hydrophilic group and active hydrogen that reacts with isocyanate groups is used; a method in which, for example, a functional group such as a glycidyl group is introduced in advance into a polyisocyanate and then, for example, a specific compound such as sulfide or phosphine is reacted with the functional group, and the like, and the former method is easy.

The active hydrogen that reacts with isocyanate groups is not particularly limited, and specific examples thereof include a hydroxyl group, a thiol group, and the like. The compound having both the cationic hydrophilic group and active hydrogen that reacts with isocyanate groups is not particularly limited, and specific examples thereof include dimethylethanolamine, diethylethanolamine, diethanolamine, methyl diethanolamine, and the like. Tertiary amino groups that are introduced using the above-described compound can also be quaternized using dimethyl sulfate, diethyl sulfate, or the like.

The equivalent ratio between the isocyanate group to which the hydrophilic group is added and the blocked isocyanate group is preferably 1:99 to 80:20, more preferably 2:98 to 50:50, and particularly preferably 5:95 to 30:70. The equivalent ratio is preferably set in the above-described range from the viewpoint of satisfying both the isocyanate reactivity and development residues.

As the blocked isocyanate having a hydrophilic group in the molecule and a method for synthesizing the blocked isocyanate, the aqueous blocked polyisocyanate described in 0010 to 0045 of JP2014-065833A can be preferably used, and the content of the publication is incorporated into the present specification by reference.

In a case in which the blocked isocyanate having a hydrophilic group in the molecule is synthesized, the addition reaction of a hydrophilic group or the blocking reaction of an isocyanate group can be caused in the presence of synthesis solvents. The synthesis solvents in this case preferably do not include any active hydrogen, and examples thereof include dipropylene glycol monomethyl ether, propylene glycol monomethyl ether acetate, methoxy propyl acetate, and the like.

In a case in which the blocked isocyanate having a hydrophilic group in the molecule is synthesized, the amount of the compound having a hydrophilic group added is preferably 1% to 100% by mass and more preferably 2% to 80% by mass of the polyisocyanate.

In a case in which the blocked isocyanate having a hydrophilic group in the molecule is synthesized, the amount of a blocking agent added is preferably 20% to 99% by mass and more preferably 10% to 100% by mass of the polyisocyanate.

The weight-average molecular weight of the blocked isocyanate that is used in the transfer film is preferably 200 to 3,000, more preferably 250 to 2,600, and particularly preferably 280 to 2,200.

—Metal Oxide Particles—

The first transparent resin layer may or may not include particles (preferably metal oxide particles) for the purpose of adjusting the refractive index or the light-transmitting property. In order to control the refractive index of the first transparent resin layer in the above-described range, it is possible to add metal oxide particles in an arbitrary ratio depending on the kind of the polymer or the polymerizable compound being used. In the first transparent resin layer, the content of the metal oxide particles is preferably 0% to 35% by mass, more preferably 0% to 10% by mass, and particularly preferably 0% by mass of the first transparent resin layer.

Since the metal oxide particles are highly transparent and light-transmissible, it is possible to obtain positive-type photosensitive resin compositions having a high refractive index and excellent transparency.

The metal oxide particles preferably have a refractive index higher than the refractive index of a composition made of a material obtained by excluding these particles from the first transparent resin layer.

Meanwhile, the metal of the above-described metal oxide particles may also be a semi-metal such as B, Si, Ge, As, Sb, or Te.

The metal oxide particles which are light-transmissible and have a high refractive index are preferably oxide particles including atoms such as Be, Mg, Ca, Sr, Ba, Sc, Y, La, Ce, Gd, Tb, Dy, Yb, Lu, Ti, Zr, Hf, Nb, Mo, W, Zn, B, Al, Si, Ge, Sn, Pb, Sb, Bi, and Te, more preferably titanium oxide, titanium complex oxide, zinc oxide, zirconium oxide, indium/tin oxide, or antimony/tin oxide, still more preferably titanium oxide, titanium complex oxide, or zirconium oxide, particularly preferably titanium oxide or zirconium oxide, and most preferably titanium dioxide. Particularly, titanium dioxide is preferably rutile-type titanium oxide having a high refractive index. The surfaces of these metal oxide particles can also be treated with an organic material in order to impart dispersion stability.

From the viewpoint of the transparency of the first transparent resin layer, the average primary particle diameter of the metal oxide particles is preferably 1 to 200 nm and particularly preferably 3 to 80 nm. Here, the average primary particle diameter of particles refers to the arithmetic average of the diameters of 200 arbitrary particles measured using an electron microscope. In addition, in a case in which the shapes of particles are not spherical, the longest sides are considered as the diameters.

In addition, one kind of the metal oxide particles may be used or two or more kinds of the metal oxide particles can be jointly used.

<Constitution of Second Transparent Resin Layer>

The transfer film of the present invention has the second transparent resin layer, the second transparent resin layer includes metal oxide particles and an organic component, and, in a case in which the area of the profile of the thickness-direction distribution of the ratio of metal atoms constituting the metal oxide particles to carbon atoms constituting the organic component in the second transparent resin layer is represented by A, and the peak height of the profile is represented by P, Expression (1) is satisfied:

$$0.01 \text{ (nm)}^{-1} \leq P/A \leq 0.08 \text{ (nm)}^{-1} \qquad \text{Expression (1)}.$$

In the transfer film of the present invention, the first transparent resin layer and the second transparent resin layer are preferably in direct contact with each other from the viewpoint of the convenience of production. That is, the transfer film preferably has the second transparent resin layer that is disposed adjacent to the first transparent resin layer.

(Profile of Thickness-Direction Distribution of Ratio M/C)

In the transfer film of the present invention, in a case in which the area of the profile of the thickness-direction distribution of the ratio (M/C) of metal atoms (M) constituting the metal oxide particles to carbon atoms (C) constituting the organic component in the second transparent resin layer is represented by A, and the peak height of the profile is represented by P, Expression (1) is satisfied:

$$0.01 \text{ (nm)}^{-1} \leq P/A \leq 0.08 \text{ (nm)}^{-1} \qquad \text{Expression (1)}.$$

In the present specification, the profile of the thickness-direction distribution of the ratio (M/C) of metal atoms (M) constituting the metal oxide particles to carbon atoms (C) constituting the organic component in the second transparent resin layer will be referred to as "the profile of the thickness-direction distribution of M/C" or simply as "profile". Meanwhile, the profile of the thickness-direction distribution will also be referred to as the profile in the depth direction or the depth profile. The ratio of metal atoms constituting the metal oxide particles in the second transparent resin layer is represented by M. The ratio of carbon atoms constituting the organic component in the second transparent resin layer is represented by C.

In the transfer film of the present invention, in a case in which the area of the profile is represented by A, and the peak height of the profile is represented by P, Expression (2) is preferably satisfied, and Expression (2A) is more preferably satisfied.

$$0.02 \text{ (nm)}^{-1} \leq P/A \leq 0.05 \text{ (nm)}^{-1} \qquad \text{Expression (2)}.$$

$$0.02 \text{ (nm)}^{-1} \leq P/A \leq 0.04 \text{ (nm)}^{-1} \qquad \text{Expression (2A)}.$$

In the transfer film of the present invention, the peak height P of the profile is preferably 0.2 to 1.5, more preferably 0.4 to 1.2, and particularly preferably 0.5 to 0.9.

As a method for measuring the profile of the thickness-direction distribution of M/C, a method for obtaining the peak height P of the profile, and a method for obtaining the area A of the profile in the present specification, methods that are used in the examples described below are used. The area A of the profile is obtained from, for example, the area of a region having a strength of 1% or more of the peak height P (maximum value) in the profile of the thickness-direction distribution of M/C. The unit of A is nm. In addition, P/A is computed using the peak height P (maximum value) and the area A. The unit of P/A is $(nm)^{-1}$.

The second transparent resin layer may be thermocurable, photocurable, or thermocurable and photocurable. Among these, the second transparent resin layer is preferably at least a thermocurable transparent resin layer since reliability can be imparted to films by means of thermal curing after transfer and more preferably a thermocurable transparent resin layer and a photocurable transparent resin layer since it is easy to form films by photocuring the layer after transfer and reliability can be imparted to films by means of thermal curing after the formation of films.

In the transfer film of the present invention, the second transparent resin layer is preferably alkali-soluble.

(Refractive Index)

The transfer film of the present invention preferably has the second transparent resin layer on the first transparent resin layer, and the refractive index of the second transparent resin layer is more preferably higher than the refractive index of the first transparent resin layer.

In a case in which the refractive index difference between a transparent electrode pattern (preferably ITO) and the second transparent resin layer and the refractive index difference between the second transparent resin layer and the first transparent resin layer are decreased, light reflection is alleviated and thus the transparent electrode pattern becomes barely visible, and it is possible to improve the visibility of the transparent electrode pattern. In addition, even in a case in which the first transparent resin layer is laminated and then the second transparent resin layer is laminated without curing the first transparent resin layer, layer differentiation becomes favorable, and thus the visibility of the transparent electrode pattern can be improved with the above-described mechanism. Furthermore, after the refractive index-adjusting layers (that is, the first transparent resin layer and the second transparent resin layer) are transferred onto the transparent electrode pattern from the transfer film, it is possible to develop the refractive index-adjusting layers in desired patterns by means of photolithography. Meanwhile, in a case in which the layer differentiation between the first transparent resin layer and the second transparent resin layer is favorable, the refractive index adjustment effect of the above-described mechanism is likely to be sufficient, and the improvement of the visibility of the transparent electrode pattern is likely to be sufficient.

The refractive index of the second transparent resin layer is preferably 1.60 or higher.

Meanwhile, the refractive index of the second transparent resin layer needs to be adjusted using the refractive index of a transparent electrode, and the upper limit value is not particularly limited, but is preferably 2.1 or lower and more preferably 1.78 or lower, and may be 1.74 or lower.

Particularly, in a case in which the refractive index of the transparent electrode exceeds 2.0 as in the case of an oxide of In and Zn (IZO), the refractive index of the second transparent resin layer is preferably 1.7 or higher and 1.85 or lower.

(Thickness)

The film thickness of the second transparent resin layer is preferably 500 nm or less and is more preferably 110 nm or less. The film thickness of the second transparent resin layer is preferably 20 nm or more. The film thickness of the second transparent resin layer is particularly preferably 55 to 100 nm, more particularly preferably 60 to 100 nm, and still more particularly preferably 70 to 100 nm.

(Composition)

The transfer film may be a negative-type material or a positive-type material.

In a case in which the transfer film is a negative-type material, the second transparent resin layer preferably includes the metal oxide particles, a binder resin (preferably an alkali-soluble resin), the polymerizable compound, and the polymerization initiator. Furthermore, additives and the like are used, but the components are not limited thereto.

In the transfer film, the second transparent resin layer preferably includes a polymer binder, the polymerizable compound, and the polymerization initiator.

A method for controlling the refractive index of the second transparent resin layer is not particularly limited, and it is possible to singly use a transparent resin layer having a desired refractive index, use a transparent resin layer to which particles such as metal particles or metal oxide particles are added, or use a complex of a metal salt and a macromolecule.

Furthermore, in the second transparent resin layer, additives may also be used. Examples of the additives include the surfactants described in Paragraph 0017 in the specification of JP4502784B and Paragraphs 0060 to 0071 of JP2009-237362A, the thermal polymerization inhibitors described in Paragraph 0018 in the specification of JP4502784B, and, furthermore, other additives described in Paragraphs 0058 to 0071 of JP2000-310706A. Examples of the additives that are preferably used in the second transparent resin layer include MEGAFACE F-444 (manufactured by DIC Corporation) which is a well-known fluorine-based surfactant.

Hitherto, the case in which the transfer film is a negative-type material has been mainly described, but the transfer film may be a positive-type material. In a case in which the transfer film is a positive-type material, in the second transparent resin layer, for example, the material and the like described in JP2005-221726A can be used, but the components are not limited thereto.

—Ammonium Salt of Monomer Having Acidic Group or Ammonium Salt of Resin Having Acidic Group—

The second transparent resin layer preferably includes a binder polymer and preferably includes an alkali-soluble resin. In addition, the binder polymer in the second transparent resin layer is preferably an acrylic resin.

The second transparent resin layer particularly preferably includes an ammonium salt of a monomer having an acidic group or an ammonium salt of a resin having an acidic group.

The ammonium salt of a monomer having an acidic group or the ammonium salt of a resin having an acidic group is not particularly limited.

The ammonium salt of a monomer having an acidic group or the ammonium salt of a resin having an acidic group in the second transparent resin layer is preferably an ammonium salt of an acrylic monomer or an acrylic resin.

A step of preparing a water-based resin composition including a monomer or a resin obtained by dissolving the monomer having an acidic group or the resin having an acidic group in an ammonia aqueous solution and turning at least some of the acidic group into an ammonium salt is preferably included.

—Resin Having Acidic Group—

The monomer having an acidic group or the resin having an acidic group is preferably a resin having an acidic group and more preferably a resin having a monovalent acidic group (a carboxyl group or the like). The binder polymer in the second transparent resin layer is particularly preferably a binder polymer having a carboxyl group.

The resin which is used in the second transparent resin layer and is soluble in water-based solvents (preferably water or solvent mixtures of a lower alcohol having 1 to 3 carbon atoms and water) is not particularly limited within the scope of the gist of the present invention and can be appropriately selected from well-known resins.

The resin having an acidic group that is used in the second transparent resin layer is preferably an alkali-soluble resin. The alkali-soluble resin can be appropriately selected from alkali-soluble resins which are linear organic macromolecular polymers and have at least one group that accelerates alkali solubility (that is, an acidic group: for example, a carboxyl group, a phosphoric acid group, a sulfonic acid group, or the like) in a molecule (preferably a molecule having an acrylic copolymer or a styrene-based copolymer as the main chain). Among these, alkali-soluble resins which are soluble in organic solvents and can be developed using a weak alkaline aqueous solution are more preferred. The acidic group is preferably a carboxyl group.

To the manufacturing of the alkali-soluble resin, it is possible to apply, for example, a method in which a well-known radical polymerization method is used. The polymerization conditions such as temperature, pressure, the kind and amount of radical initiators, and the kind of solvents in the case of manufacturing the alkali-soluble resin using a radical polymerization method can be easily set by persons skilled in the art, and the conditions can also be experimentally determined.

The linear organic macromolecular polymer is preferably a polymer having a carboxylic acid in the side chain. Examples thereof include poly(meth)acrylates, methacrylic acid copolymers, acrylic acid copolymers, itaconic acid copolymers, crotonic acid copolymers, maleic acid copolymers such as styrene/maleic acid, partially-esterified maleic acid copolymers, and the like, which are respectively described in JP1984-44615A (JP-S59-44615A), JP1979-34327B (JP-S54-34327B), JP1983-12577B (JP-S58-12577B), JP1979-25957B (JP-S54-25957B), JP1984-53836A (JP-S59-53836A), JP1984-71048A (JP-S59-71048A), JP1971-2121A (JP-S46-2121A), and JP1981-40824B (JP-S56-40824B) and, furthermore, acidic cellulose derivatives having a carboxylic acid in the side chain such as carboxyalkyl cellulose and carboxyalkyl starch, polymers obtained by adding an acid anhydride to a polymer having a hydroxyl group, and the like, and, furthermore, macromolecular polymers having a reactive functional group such as a (meth)acryloyl group in the side chain are also preferred.

Among these, particularly, benzyl (meth)acrylate/(meth)acrylic acid copolymers or multicomponent copolymers made of benzyl (meth)acrylate/(meth)acrylic acid/other monomers are preferred.

Additionally, polymers obtained by copolymerizing 2-hydroxyethylmethacrylate are also useful. The amount of the polymer being mixed and used can be arbitrary.

Additionally, examples thereof include 2-hydroxypropyl (meth)acrylate/polystyrene macromonomer/benzyl methacrylate/methacrylic acid copolymers, 2-hydroxy-3-phenoxypropyl acrylate/polymethyl methacrylate macromonomer/benzyl methacrylate/methacrylic acid copolymers, 2-hydroxyethyl methacrylate/polystyrene macromonomer/methyl methacrylate/methacrylic acid copolymers, 2-hydroxyethyl methacrylate/polystyrene macromonomer/benzyl methacrylate/methacrylic acid copolymers, and the like which are described in JP1995-140654A (JP-H07-140654A).

Regarding the specific constitutional unit of the alkali-soluble resin, particularly, copolymers of (meth)acrylic acid and an additional monomer capable of being copolymerized with (meth)acrylic acid are preferred.

Examples of the additional monomer capable of being copolymerized with (meth)acrylic acid include alkyl (meth)acrylates, aryl (meth)acrylates, vinyl compounds, and the like. Here, hydrogen atoms in alkyl groups and aryl groups may be substituted with substituents.

Specific examples of alkyl (meth)acrylate and aryl (meth)acrylate include methyl (meth)acrylates, ethyl (meth)acrylates, propyl (meth)acrylates, butyl (meth)acrylates, isobutyl (meth)acrylates, pentyl (meth)acrylates, hexyl (meth)acrylates, octyl (meth)acrylates, phenyl (meth)acrylates, benzyl acrylates, tolyl acrylates, naphthyl acrylates, cyclohexyl acrylates, and the like.

In addition, examples of the vinyl compounds include styrene, α-methyl styrene, vinyl toluene, glycidyl methacrylate, acrylonitrile, vinyl acetate, N-vinyl pyrrolidone, tetrahydrofurfuryl methacrylate, polystyrene macromonomers, polymethyl methacrylate macromonomers, $CH_2=CR^1R^2$, $CH_2=C(R^1)(COOR^3)$ [here, $R^1$ represents a hydrogen atom or an alkyl group having 1 to 5 carbon atoms, $R^2$ represents an aromatic hydrocarbon ring having 6 to 10 carbon atoms, and $R^3$ represents an alkyl group having 1 to 8 carbon atoms or an aralkyl group having 6 to 12 carbon atoms.], and the like.

The additional monomer capable of being copolymerized with (meth)acrylic acid can be used singly or a combination of two or more monomers capable of being copolymerized with (meth)acrylic acid can be used. A preferred additional monomer capable of being copolymerized with (meth)acrylic acid is at least one monomer selected from $CH_2=CR^1R^2$, $CH_2=C(R^1)(COOR^3)$, phenyl (meth)acrylates, benzyl (meth)acrylates, and styrene and particularly preferably $CH_2=CR^1R^2$ and/or $CH_2=C(R^1)(COOR^3)$.

Additionally, examples thereof include resins having an ethylene unsaturated double bond introduced into a linear macromolecule which are obtained by reacting a (meth)acrylic compound having a reactive functional group, cinnamic acid, or the like with the linear macromolecule having a substituent capable of reacting with this reactive functional group. Examples of the reactive functional group include a hydroxyl group, a carboxyl group, an amino group, and the like, and examples of the substituent capable of being reacted with this reactive functional group include an isocyanate group, an aldehyde group, an epoxy group, and the like.

Among these, the resin having an acidic group is preferably an acrylic resin having an acidic group, preferably a copolymer resin of (meth)acrylic acid/vinyl compound, and particularly preferably a copolymer resin of (meth)acrylic acid/allyl (meth)acrylate. Meanwhile, in the present specification, acrylic resins refer to both methacrylic resins and acrylic resins, and, similarly, (meth)acrylic resins refers to methacrylic resins and acrylic resins.

The weight-average molecular weight of the resin having an acidic group is preferably 10,000 or more and more preferably 20,000 to 100,000.

The content of the resin having an acidic group is preferably 10% to 80% by mass, more preferably 15% to 65% by mass, and particularly preferably 20% to 50% by mass of the second transparent resin layer.

—Monomer Having Acidic Group—

As the monomer having an acidic group, it is possible to preferably use an acrylic monomer such as (meth)acrylic acid or a derivative thereof or the following monomer.

Examples thereof include tri- or tetrafunctional radical polymerizable monomers (monomers obtained by introducing a carboxylic acid group into a pentaerythritol tri- and tetraacrylate [PETA] skeleton (acid value=80 to 120 mg-KOH/g)), penta- or hexafunctional radical polymerizable monomers (monomers obtained by introducing a carboxylic acid group into a dipentaerythritol penta- and hexaacrylate [DPHA] skeleton (acid value=25 to 70 mg-KOH/g)), and the like. Specific titles are not described, but bifunctional alkali-soluble radical polymerizable monomers may also be used as necessary.

Additionally, it is possible to preferably use the monomers having an acidic group described in [0025] to [0030] of JP2004-239942A, the content of which is incorporated into the present invention.

In addition, among the polymerizable compounds exemplified as the polymerizable compound that is used in the first transparent resin layer, monomers having an acidic group can also be preferably used.

Among these, polymerizable compounds containing a carboxyl group are preferred, acrylic monomers such as (meth)acrylic acids or derivatives thereof can be more preferably used, and, among these, ARONIX TO-2349 (manufactured by Toagosei Co., Ltd.) is particularly preferred. Meanwhile, in the present specification, acrylic monomers refer to both methacrylic monomers and acrylic monomers.

In the second transparent resin layer, the content of the monomer having an acidic group is preferably 1% to 50% by mass, more preferably 3% to 20% by mass, and particularly preferably 6% to 15% by mass of the resin having an acidic group.

—Other Binder Polymers—

Other binder polymers having no acidic group which can be used in the second transparent resin layer are not particularly limited, and it is possible to use binder polymers that can be used in organic solvent-based resin compositions that are used to form the first transparent resin layer.

—Polymerizable Compound—

The second transparent resin layer preferably includes a polymerizable compound such as the photopolymerizable compound or thermopolymerizable compound since the resin composition increases the strength or the like of films by being cured. The second transparent resin layer may include only the monomer having an acidic group as the polymerizable compound or may include a polymerizable compound other than the monomer having an acidic group.

As the polymerizable compound that is used in the second transparent resin layer, it is possible to use the polymerizable compounds described in Paragraphs 0023 and 0024 of JP4098550B. Among these, pentaerythritol tetraacrylate, pentaerythritol triacrylate, and tetraacrylates of pentaerythritol ethylene oxide adducts can be preferably used. These polymerizable compounds may be used singly or a plurality of polymerizable compounds may be used in combination. In a case in which a mixture of pentaerythritol tetraacrylate and pentaerythritol triacrylate is used, the percentage of pentaerythritol triacrylate in terms of the mass ratio is preferably 0% to 80% and more preferably 10% to 60%.

Specific examples of the polymerizable compound that is used in the second transparent resin layer include water-soluble polymerizable compounds represented by Structural Formula 1, pentaerythritol tetraacrylate mixtures (NK ester A-TMMT manufactured by Shin-Nakamura Chemical Co., Ltd., containing approximately 10% of triacrylate as an impurity), mixtures of pentaerythritol tetraacrylate and triacrylate (NK ester A-TMM3LM-N manufactured by Shin-Nakamura Chemical Co., Ltd., 37% triacrylate), mixtures of pentaerythritol tetraacrylate and triacrylate (NK ester A-TMM-3L manufactured by Shin-Nakamura Chemical Co., Ltd., 55% triacrylate), mixtures of pentaerythritol tetraacrylate and triacrylate (NK ester A-TMM3 manufactured by Shin-Nakamura Chemical Co., Ltd., 57% triacrylate), tetraacrylates of a pentaerythritol ethylene oxide adduct (KAYARAD RP-1040 manufactured by Nippon Kayaku Co., Ltd.), and the like.

Structural Formula (1)

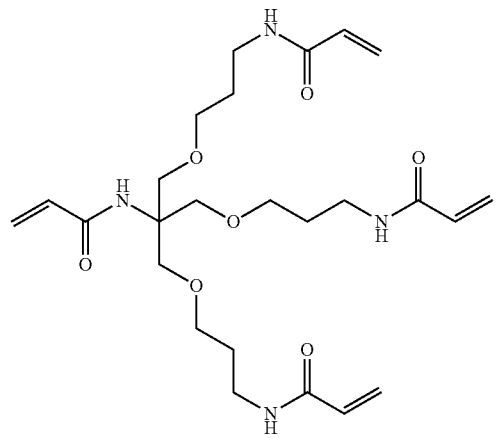

Regarding other polymerizable compounds that can be used in the second transparent resin layer, as polymerizable compounds that are soluble in water or solvent mixtures of a lower alcohol having 1 to 3 carbon atoms and water, it is possible to use a monomer having a hydroxyl group or a monomer having an ethylene oxide or a polypropylene oxide and a phosphoric acid group in the molecule.

—Polymerization Initiator—

As the polymerization initiator which is used in the second transparent resin layer and is soluble in water or solvent mixtures of a lower alcohol having 1 to 3 carbon atoms and water, it is possible to use IRGACURE 2959 or a photopolymerization initiator of Structural Formula 2.

Structural Formula 2

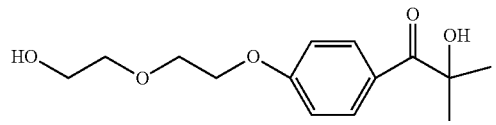

—Metal Oxide Particles—

The second transparent resin layer may or may not include particles (preferably metal oxide particles) for the purpose of adjusting the refractive index or the light transmittance, but preferably includes metal oxide particles from the viewpoint of controlling the refractive index of the second transparent resin layer in the above-described range. To the second transparent resin layer, it is possible to add metal oxide particles in an arbitrary ratio depending on the kind of the polymer or the polymerizable compound being used or the metal oxide particles being used. Regardless of the kind of the metal oxide particles, the content of the metal oxide particles is preferably 30% to 95% by mass of the second transparent resin layer, more preferably 30% to 85% by mass from the viewpoint of defects of the second transparent resin layer not easily becoming visible after transfer, and particularly preferably 30% by mass or more and less than 80% by mass from the viewpoint of defects of the second transparent resin layer not easily becoming visible after transfer. Regarding a more preferred aspect in a case in which zirconium oxide is used as the metal oxide particles, from the viewpoint of a capability of producing laminates in which defects of the transparent resin layer having the metal oxide particles do not easily become visible after being transferred and the transparent electrode pattern-masking property is favorable, the content of the metal oxide particles is preferably 40% to 95% by mass, more preferably 60% to 95% by mass, and particularly preferably 60% by mass or more and less than 80% by mass of the second transparent resin layer. Meanwhile, regarding a more preferred aspect in a case in which titanium oxide is used as the metal oxide particles, from the viewpoint of a capability of producing laminates in which defects of the transparent resin layer having the metal oxide particles do not easily become visible after being transferred and the transparent electrode pattern-masking property is favorable, the content of the metal oxide particles is preferably 30% to 70% by mass and more preferably 40% by mass or more and less than 60% by mass of the second transparent resin layer.

The refractive index of the metal oxide particles is preferably higher than the refractive index of a composition made of a material obtained by removing the particles from the second transparent resin layer. Specifically, in the transfer film, the second transparent resin layer more preferably contains particles having a refractive index of 1.50 or higher, still more preferably contains particles having a refractive index of 1.55 or higher, particularly preferably contains particles having a refractive index of 1.70 or higher, more particularly preferably contains particles having a refractive index of 1.90 or higher, and still more particularly preferably contains particles having a refractive index of 2.00 or higher with respect to light rays having wavelengths of 400 to 750 nm.

Here, the refractive index being 1.50 or higher with respect to light rays having wavelengths of 400 to 750 nm means that the average refractive index is 1.50 or higher with respect to light having wavelengths in the above-described range, and the refractive index is not necessarily 1.50 or higher with respect to all of the light rays having wavelengths in the above-described range. In addition, the average refractive index refers to a value obtained by dividing the sum of the measurement values of the refractive index of individual light rays having wavelengths in the above-described range by the number of measurement points.

In addition, only one kind of metal oxide particles may be used or two or more kinds of metal oxide particles can be jointly used.

The kind of the metal oxide particles is not particularly limited, and well-known metal oxide particles can be used. In the transfer film of the present invention, the second transparent resin layer preferably has at least one of zirconium oxide particles ($ZrO_2$ particles), $Nb_2O_5$ particles, or titanium oxide particles ($TiO_2$) particles from the viewpoint of controlling the refractive index in the range of the refractive index of the second transparent resin layer, and the metal oxide particles are more preferably zirconium oxide particles or titanium oxide particles and particularly preferably zirconium oxide particles.

—Metal Oxidation Suppressor—

The second transparent resin layer preferably includes a metal oxidation suppressor. In a case in which the second transparent resin layer includes a metal oxidation suppressor, it becomes possible to treat the surface of a metal wire portion in direct contact with the second transparent resin layer in a case in which the second transparent resin layer is laminated on a support (a substrate, a transparent electrode, the metal wire portion, or the like). The protection property of the metal wire portion attributed to the surface treatment is considered to remain effective even after the second transparent resin layer (and a support-side functional layer) is removed.

The metal oxidation suppressor that is used in the present invention is preferably a compound having an aromatic ring including a nitrogen atom in the molecule.

In addition, in the metal oxidation suppressor, the aromatic ring including a nitrogen atom is preferably at least one ring selected from the group consisting of an imidazole ring, a triazole ring, a tetrazole ring, a thiadiazole ring, and fused rings of the above-described ring and an additional aromatic ring, and the aromatic ring including a nitrogen atom is more preferably an imidazole ring or a fused ring of an imidazole ring and an additional aromatic ring.

The additional aromatic ring may be a homocyclic ring or a heterocyclic ring, but is preferably a homocyclic ring, more preferably a benzene ring or a naphthalene ring, and still more preferably a benzene ring.

A preferred metal oxidation suppressor is preferably imidazole, benzimidazole, tetrazole, mercaptothiadiazole, or benzotriazole, and more preferably imidazole, benzimidazole, or benzotriazole. As the metal oxidation suppressor, a commercially available product may be used, and, for example, BT120 manufactured by Johoku Chemical Co., Ltd. or the like including benzotriazole can be preferably used.

In addition, the content of the metal oxidation suppressor is preferably 0.1% to 20% by mass, more preferably 0.5% to 10% by mass, and still more preferably 1 to 5% by mass of the total mass of the second transparent resin layer.

<Thermoplastic Resin Layer>

In the transfer film of the present invention, it is also possible to provide a thermoplastic resin layer between the temporary support and the first transparent resin layer. In a case in which a laminate is formed by transferring the first transparent resin layer and the second transparent resin layer using a transfer material having the thermoplastic resin layer, air bubbles are not easily generated in individual elements formed by transferring the layers, image unevenness or the like is not easily caused in image display devices, and excellent display characteristics can be obtained.

The thermoplastic resin layer is preferably alkali-soluble. The thermoplastic resin layer plays a role of a cushion material so as to be capable of absorbing protrusions and recesses (also including protrusions, recesses, and the like caused by images and the like which have been previously formed) on the base surface and is preferably capable of transforming in accordance with protrusions and recesses on the subject surface.

The thermoplastic resin layer preferably includes the organic macromolecular substance described in JP1993-72724A (JP-H05-72724A) as a component and particularly preferably includes at least one substance selected from organic macromolecular substances having a softening point of approximately 80° C. or lower which is obtained using the Vicat method [specifically, the polymer softening point measurement method based on ASTM D1235].

Specific examples thereof include organic macromolecules such as polyolefins such as polyethylene and polypropylene, ethylene copolymers of ethylene and vinyl acetate or a saponified substance thereof, copolymers of ethylene and an acrylic acid ester or a saponified substance thereof, vinyl chloride copolymers of polyvinyl chloride or vinyl chloride and vinyl acetate or a saponified substance thereof, polyvinylidene chloride, vinylidene chloride copolymers, polystyrene, styrene copolymers of styrene and a (meth)acrylic acid ester or a saponified substance thereof, polyvinyl toluene, vinyl toluene copolymers of vinyl toluene and a (meth)acrylic acid ester or a saponified substance thereof, poly(meth)acrylic acid esters, (meth)acrylic acid ester copolymers of butyl (meth)acrylate and vinyl acetate, polyamide resins such as vinyl acetate copolymer nylon, copolymerized nylon, N-alkoxymethylated nylon, and N-dimethylaminated nylon, and the like.

The layer thickness of the thermoplastic resin layer is preferably 3 to 30 μm. In a case in which the layer thickness of the thermoplastic resin layer is less than 3 μm, there are cases in which followability during lamination is insufficient and protrusions and recesses on the base surface cannot be fully absorbed. In addition, in a case in which the layer thickness exceeds 30 μm, there are cases in which loads are applied to drying (solvent removal) during the formation of the thermoplastic resin layer on the temporary support, time is taken for the development of the thermoplastic resin layer, and the process suitability is deteriorated. The layer thickness of the thermoplastic resin layer is more preferably 4 to 25 μm and particularly preferably 5 to 20 μm.

The thermoplastic resin layer can be formed by means of the application or the like of a prepared liquid including a thermoplastic organic macromolecule, and the prepared liquid that is used in the case of application or the like can be prepared using a solvent. The solvent is not particularly limited as long as the solvent is capable of dissolving macromolecular components constituting the thermoplastic resin layer, and examples thereof include methyl ethyl ketone, cyclohexanone, propylene glycol monomethyl ether acetate, n-propanol, 2-propanol, and the like.

(Viscosities of Thermoplastic Resin Layer and Photocurable Resin Layer)

It is preferable that the viscosity of the thermoplastic resin layer measured at 100° C. is in a region of 1,000 to 10,000 Pa·sec and the viscosity of the photocurable resin layer measured at 100° C. is in a region of 2,000 to 50,000 Pa·sec.

<Interlayer>

In the transfer film, it is also possible to provide an interlayer between the thermoplastic resin layer and the first transparent resin layer. The interlayer is described in JP1993-72724A (JP-H05-72724A) as "separation layer".

<Protective Film>

The transfer film of the present invention is preferably further provided with a protective film (protective peeling layer) or the like on the surface of the second transparent resin layer.

As the protective film, it is possible to appropriately use the protective film described in Paragraphs 0083 to 0087 and 0093 of JP2006-259138A.

<Method for Manufacturing Transfer Film>

A method for manufacturing the transfer film is not particularly limited, and well-known methods can be used. The method for manufacturing the transfer film is preferably a method in which it is easy to control the values of P/A and P of the profile of the thickness-direction distribution of M/C in the second transparent resin layer to preferred ranges.

In a case in which the transfer film further having the second transparent resin layer in addition to the first transparent resin layer on the temporary support is manufactured, the method for manufacturing the above-described transfer film preferably includes a step of forming the first transparent resin layer on the temporary support and a step of forming the second transparent resin layer on the first transparent resin layer. The step of forming the first transparent resin layer is preferably a step of applying an organic solvent-based resin composition onto the temporary support. The step of forming the second transparent resin layer preferably has a step of forming the second transparent resin layer directly on the first transparent resin layer and is more preferably a step of applying a water-based resin composition including an ammonium salt of a monomer having an acidic group or an ammonium salt of a resin having an acidic group. In a case in which the above-described constitution is provided, the layers are favorably differentiated from each other. In a case in which the water-based resin composition including an ammonium salt of a monomer having an acidic group or an ammonium salt of a resin having an acidic group is applied onto the first transparent resin layer obtained using the organic solvent-based resin composition, even in a case in which the second transparent resin layer is formed without curing the first transparent resin layer, interlaminar mixing does not occur, and layers are favorably differentiated from each other. Furthermore, when coated film formed using the water-based resin composition including an ammonium salt of a monomer having an acidic group or an ammonium salt of a resin having an acidic group is dried, ammonia having a lower boiling point than water is likely to be volatilized from the ammonium salt of a monomer having an acidic group or the ammonium salt of a resin having an acidic group in the drying step, and thus it is possible to generate (regenerate) and provide acidic groups in the second transparent resin layer as the monomer having an acidic group or the resin having an acidic group. Therefore, in a case in which the transfer film is stored at a high temperature and a high humidity and moisture is absorbed, the monomer having an acidic group or the resin having an acidic group which constitutes the second transparent resin layer has already become insoluble in water, and thus it is possible to suppress problems caused when the transfer film absorbs moisture. In a case in which the second transparent resin layer is formed without curing the first transparent resin layer, the values of P/A and P of the profile of the thickness-direction distribution of M/C in the second transparent resin layer are preferably controlled to preferred ranges by controlling the composition of the second transparent resin layer, coating fluid solvents or drying temperatures in the step of forming the second transparent resin layer, and the like. In addition, in a case in which the second transparent resin layer is formed without curing the first transparent resin layer, in a case in which a constitution in which the first transparent resin layer and the second transparent resin layer are in direct contact with each other is provided, the values of P/A and P of the profile of the thickness-direction distribution of M/C in the second transparent resin layer are preferably controlled to preferred ranges by further controlling the composition of the first transparent resin layer.

Meanwhile, in the method for manufacturing the transfer film, the second transparent resin layer may be formed after the first transparent resin layer is cured. As a method for curing the first transparent resin layer, it is possible to use the same method as a method for curing the transferred first transparent resin layer in a method for manufacturing the laminate described below. In a case in which the second transparent resin layer is formed after the first transparent resin layer is cured, the values of P/A and P of the profile of the thickness-direction distribution of M/C in the second transparent resin layer are preferably controlled to preferred ranges by controlling the composition of the second transparent resin layer, coating fluid solvents or drying temperatures in the step of forming the second transparent resin layer, and the like.

(Step of Forming First Transparent Resin Layer on Temporary Support)

The method for manufacturing the transfer film has a step of forming the first transparent resin layer on the temporary support, and the step of forming the first transparent resin layer is preferably a step of applying an organic solvent-based resin composition onto the temporary support.

—Organic Solvent-Based Resin Composition—

The organic solvent-based resin composition refers to a resin composition that is soluble in organic solvents.

As the organic solvents, ordinary organic solvents can be used. Examples of the organic solvents include methyl ethyl ketone, propylene glycol monomethyl ether, propylene glycol monomethyl ether acetate (1-methoxy-2-propylacetate), cyclohexanone, methyl isobutyl ketone, ethyl lactate, methyl lactate, caprolactam, and the like.

In the method for manufacturing the transfer film, the organic solvent-based resin composition that is used to form the first transparent resin layer preferably includes a binder polymer, a polymerizable compound, and a polymerization initiator.

(Step of Forming Second Transparent Resin Layer)

The method for manufacturing the transfer film has a step of forming the second transparent resin layer directly on the first transparent resin layer, and the step of forming the second transparent resin layer is preferably a step of applying a water-based resin composition including an ammonium salt of a monomer having an acidic group or an ammonium salt of a resin having an acidic group.

—Water-Based Resin Composition—

The water-based resin composition refers to a resin composition that is soluble in water-based solvents.

The water-based solvent is preferably water or a solvent mixture of a lower alcohol having 1 to 3 carbon atoms and water. In a preferred aspect of the method for manufacturing the transfer film, a solvent in the water-based resin composition that is used to form the second transparent resin layer preferably includes water and an alcohol having 1 to 3 carbon atoms and more preferably includes a solvent mixture in which the mass ratio of an alcohol having 1 to 3 carbon atoms to water is 20/80 to 80/20.

Water, a solvent mixture of water and methanol, and a solvent mixture of water and ethanol are preferred, and a solvent mixture of water and methanol is preferred from the viewpoint of drying and coatability.

Particularly, in the case of forming the second transparent resin layer, in a case in which a solvent mixture of water and methanol (MeOH) is used, the mass ratio (in terms of % by mass) of MeOH/water is preferably 20/80 to 80/20, more preferably 30/70 to 75/30, and particularly preferably 40/60 to 70/30. In a case in which the mass ratio is controlled to the above-described range, the first transparent resin layer and the second transparent resin layer can be applied and rapidly dried without being mixed together, and it is easy to control the value of P/A of the profile of the thickness-direction distribution of M/C in the second transparent resin layer to a preferred range. As a result, it is easy to manufacture transfer films that can be used to produce laminates in which defects of the transparent resin layer having the metal oxide particles do not easily become visible after being transferred and the transparent electrode pattern-masking property is favorable.

The power of hydrogen (pH) of the water-based resin composition at 25° C. is preferably 7.0 or more and 12.0 or less, more preferably 7.0 to 10.0, and particularly preferably 7.0 to 8.5. The pH of the water-based resin composition can be adjusted to the above-described preferred range by, for example, adding the monomer having an acidic group or the resin having an acidic group to the acidic groups using an excess amount of ammonia.

In addition, in the method for manufacturing the transfer film, the water-based resin composition that is used to form the second transparent resin layer is preferably at least one of a heat-curable resin composition or a photocurable resin composition. In a case in which the first transparent resin layer and the second transparent resin layer are the above-described curable transparent resin layers, according to the method for manufacturing the transfer film, it is preferable that, even in a case in which the first transparent resin layer is laminated, and then the second transparent resin layer is laminated without curing the first transparent resin layer, the layers are favorably differentiated from each other, and thus it is possible to further improve the visibility of the transparent electrode pattern, and, additionally, it is possible to develop the refractive index-adjusting layers (that is, the first transparent resin layer and the second transparent resin layer) in a desired pattern by means of photolithography after the refractive index-adjusting layers are transferred onto the transparent electrode pattern from the obtained transfer film (transfer material, preferably, the transfer film).

In the method for manufacturing the transfer film, the water-based resin composition that is used to form the second transparent resin layer preferably has an ammonium salt of a monomer having an acidic group or an ammonium salt of a resin having an acidic group and includes a binder polymer, a photo- or thermopolymerizable compound, and a photo- or thermopolymerization initiator. Only the ammonium salt of a resin having an acidic group may be used as the binder polymer, or, in addition to the ammonium salt of a resin having an acidic group, other binder polymers may be further jointly used. The ammonium salt of a monomer having an acidic group may be a photo- or thermopolymerizable compound, and, in addition to the ammonium salt of a monomer having an acidic group, a photo- or thermopolymerizable compound may be further jointly used.

<Volatilization of Ammonia>

Furthermore, the method for manufacturing the transfer film preferably includes a step of generating acidic groups by volatilizing ammonia from the ammonium salt of a monomer having an acidic group or the ammonium salt of a resin having an acidic group. The step of generating acidic groups by volatilizing ammonia from the ammonium salt of a monomer having an acidic group or the ammonium salt of a resin having an acidic group is preferably a step of heating the applied water-based resin composition.

Preferred ranges of the detailed conditions of the step of heating the coated water-based resin composition will be described below.

Examples of the heating and drying method include a method in which the composition is passed through a furnace comprising a heating device and a method in which the composition is heated and dried by means of blasting. The heating and drying conditions may be appropriately set depending on organic solvents and the like being used, and the composition may be heated to a temperature of 40° C. to 150° C. or the like. Among these conditions, from the viewpoint of easily controlling the value of P/A of the profile of the thickness-direction distribution of M/C in the second transparent resin layer to a preferred range, the composition is particularly preferably heated to a temperature of 50° C. to 120° C. and more preferably heated to a temperature of 60° C. to 100° C. In the heated and dried composition, the moisture content is preferably set to 5% by mass or less, more preferably set to 3% by mass or less, and still more preferably set to 1% by mass or less.

<Other Steps>

The method for manufacturing the transfer film may include a step of further forming a thermoplastic resin layer before the formation of the first transparent resin layer on the temporary support.

After the step of further forming the thermoplastic resin layer, a step of forming an interlayer between the thermoplastic resin layer and the first transparent resin layer may be provided. Specifically, in the case of forming a photosensitive material having the interlayer, the photosensitive material can be preferably produced by providing a thermoplastic resin layer by applying and drying a solution obtained by dissolving additives together with a thermoplastic organic macromolecule (coating fluid for the thermoplastic resin layer) on the temporary support, then, laminating the interlayer by applying and drying a preparation liquid obtained by adding resins or additives to a solvent that does not dissolve the thermoplastic resin layer (coating fluid for the interlayer) on the thermoplastic resin layer, and furthermore, laminating the first transparent resin layer on the interlayer by applying and drying a coating fluid for the first transparent resin layer which is prepared using a solvent that does not dissolve the interlayer.

As a method for manufacturing other transparent resin layers, it is possible to employ the method for producing a photosensitive transfer material described in Paragraphs 0094 to 0098 of JP2006-259138A.

<Uses>

The transfer film of the present invention is preferably used as an electrode protective film in electrostatic capacitance-type input devices and, among electrode protective films, preferably used as a transparent insulating layer or a transparent protective layer. The transfer film may have the first transparent resin layer in a non-cured state, and, in such a case, the transfer film can be preferably used as a transfer film for forming a laminate pattern of an electrode protective film in an electrostatic capacitance-type input device on a transparent electrode pattern by means of a photolithography method and more preferably used as a transfer film for forming laminate patterns of a refractive index-adjusting layer and an overcoat layer (transparent protective layer).

[Electrode Protective Film for Electrostatic Capacitance-Type Input Device]

An electrode protective film for an electrostatic capacitance-type input device of the present invention is the transfer film of the present invention from which the temporary support is removed.

The laminate of the present invention described below has the electrode protective film for an electrostatic capacitance-type input device of the present invention.

[Laminate]

A first aspect of the laminate of the present invention is a laminate having a substrate including an electrode of an electrostatic capacitance-type input device, a second transparent resin layer located on the substrate, and a first transparent resin layer in this order, in which the first transparent resin layer and the second transparent resin layer are formed by transferring the first transparent resin layer and the second transparent resin layer from the transfer film of the present invention onto the substrate.

A second aspect of the laminate of the present invention is a laminate having a substrate including an electrode of an electrostatic capacitance-type input device, a second transparent resin layer located on the substrate, and a first transparent resin layer in this order, in which the second transparent resin layer includes metal oxide particles and an organic component, and, in a case in which an area of a profile of a thickness-direction distribution of the ratio of metal atoms constituting the metal oxide particles to carbon atoms constituting the organic component in the second transparent resin layer is represented by A, and a peak height of the profile is represented by P, Expression (1) is satisfied:

$$0.01\ (nm)^{-1} \leq P/A \leq 0.08\ (nm)^{-1} \qquad \text{Expression (1).}$$

Due to the above-described constitution, in the laminate of the present invention, defects of the transparent resin layer having the metal oxide particles are not easily visible and the transparent electrode pattern-masking property is favorable.

Meanwhile, a film obtained by transferring the first transparent resin layer in the transfer film of the present invention onto a transparent electrode pattern and photocuring this layer is also referred to as an electrode protective film. The laminate of the present invention preferably has an electrode protective film that is formed by heating the first transparent resin layer on the substrate.

The electrode of the electrostatic capacitance-type input device may be a transparent electrode pattern or a guidance wire. In the laminate, the electrode of the electrostatic capacitance-type input device is preferably an electrode pattern and more preferably a transparent electrode pattern.

The laminate has a substrate including an electrode of an electrostatic capacitance-type input device and a first transparent resin layer formed on the substrate, preferably has at least a substrate, a transparent electrode pattern, or a first transparent resin layer, and more preferably has a substrate, a transparent electrode pattern, a second transparent resin layer disposed adjacent to the transparent electrode pattern, and a first transparent resin layer disposed adjacent to the second transparent resin layer.

The laminate has a substrate, a transparent electrode pattern, a second transparent resin layer disposed adjacent to the transparent electrode pattern, and a first transparent resin layer disposed adjacent to the second transparent resin layer, the refractive index of the second transparent resin layer is particularly preferably higher than the refractive index of the first transparent resin layer, and the refractive index of the second transparent resin layer is more particularly preferably 1.6 or higher. In a case in which the above-described constitution is provided, it is possible to solve a problem of the transparent electrode pattern becoming visible.

<Constitution of Laminate>

The laminate preferably further has a transparent film having a refractive index of 1.6 to 1.78 and a film thickness of 55 to 110 nm or a transparent film having a different refractive index or film thickness on a side of the transparent electrode pattern opposite to the side on which the second transparent resin layer is formed from the viewpoint of further improving the visibility of the transparent electrode pattern.

The laminate preferably further has a transparent substrate on a side of the transparent film opposite to the side on which the transparent electrode pattern is formed.

Figure 11:
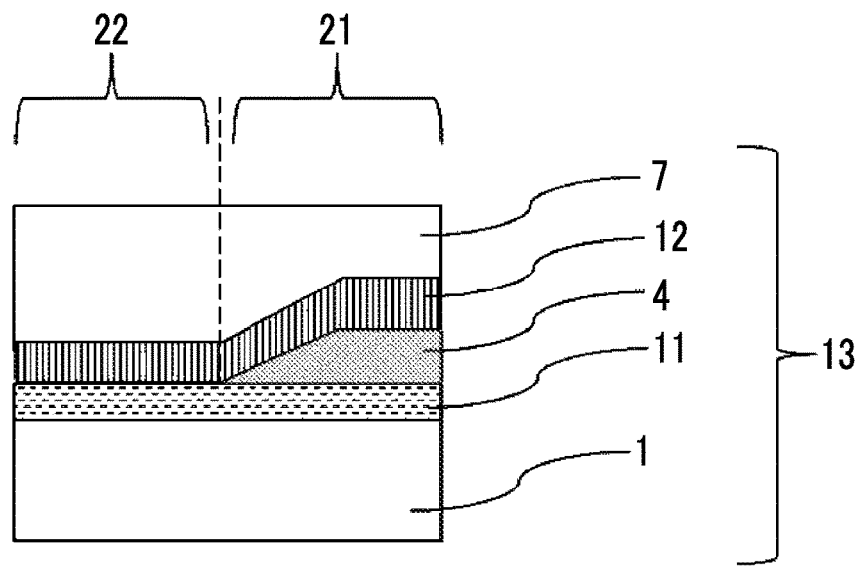
FIG. 11 is a schematic cross-sectional view illustrating an example of a constitution of a laminate of the present invention.

FIG. 11 illustrates an example of the constitution of the laminate of the present invention.

In FIG. 11, a transparent substrate 1 and a transparent film 11 are provided, and, furthermore, a region 21 in which a second transparent electrode pattern 4, the second transparent resin layer 12, and the first transparent resin layer 7 are laminated in this order is provided in the plane. In addition, FIG. 11 illustrates that the laminate includes, in addition to the above-described region, a region in which the transparent substrate 1 and the transparent film 11 are laminated in this order (in the constitution of FIG. 11, a region 22 in which the second transparent resin layer 12 and the first transparent resin layer 7 are laminated in this order (that is, a non-patterned region 22 in which the transparent electrode pattern is not formed)).

In other words, the laminate includes the region 21 in which the transparent substrate 1, the transparent film 11, the second transparent electrode pattern 4, the second transparent resin layer 12, and the first transparent resin layer 7 are laminated in this order in the in-plane direction.

The in-plane direction refers to a direction that is substantially parallel to a surface parallel to the transparent substrate in the laminate. Therefore, the fact that the region in which the second transparent electrode pattern 4, the second transparent resin layer 12, and the first transparent resin layer 7 are laminated in this order is included in the in-plane direction means that the orthogonal projection of the region in which the second transparent electrode pattern 4, the second transparent resin layer 12, and the first transparent resin layer 7 are laminated in this order on the surface parallel to the transparent substrate in the laminate is present in a plane parallel to the transparent substrate in the laminate.

Figure 3:
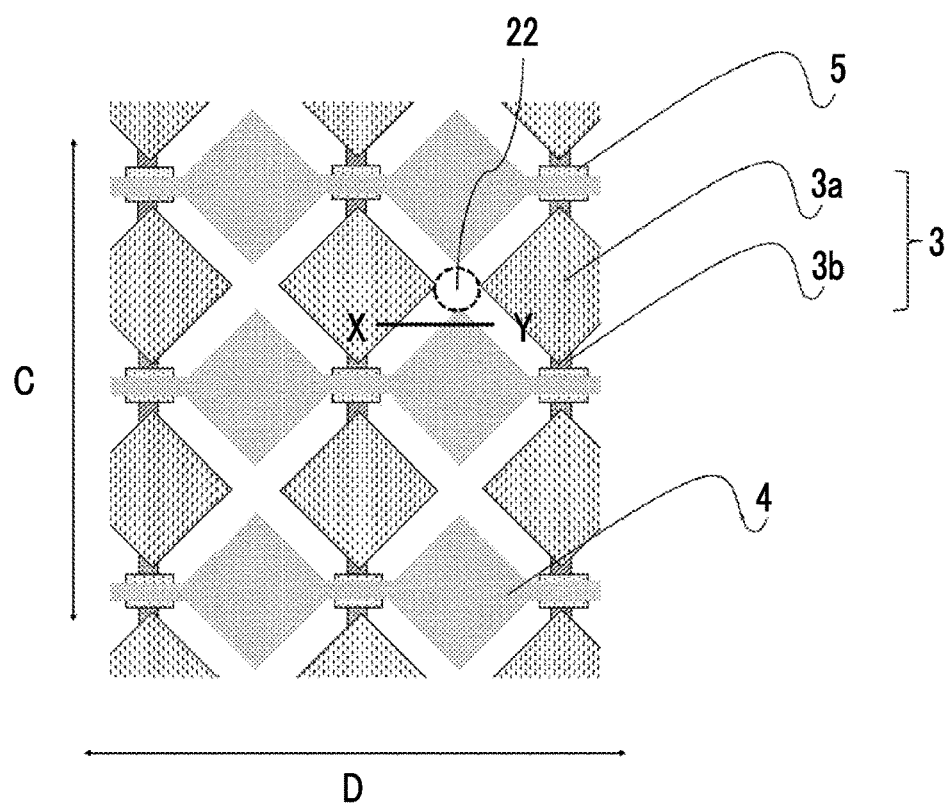
FIG. 3 is an explanatory view illustrating an example of a relationship between a transparent electrode pattern and non-patterned regions in the present invention.

Here, in a case in which the laminate of the present invention is used in an electrostatic capacitance-type input device described below, there are cases in which the transparent electrode pattern is provided in two substantially orthogonal directions that are the row direction and the column direction as a first transparent electrode pattern and a second transparent electrode pattern (for example, refer to FIG. 3). For example, in the constitution of FIG. 3, the transparent electrode pattern in the laminate of the present invention may be the second transparent electrode pattern 4 or a pad portion 3a of a first transparent electrode pattern 3. In other words, in the following description of the laminate of the present invention, there are cases in which the transparent electrode pattern is representatively indicated using a reference sign "4", but the application of the transparent electrode pattern in the laminate of the present invention is not limited to the second transparent electrode pattern 4 in the electrostatic capacitance-type input device of the present invention, and the transparent electrode pattern may be used as the pad portion 3a of the first transparent electrode pattern 3.

The laminate of the present invention preferably includes a non-patterned region in which the transparent electrode pattern is not formed. In the present specification, the non-patterned region refers to a region in which the second transparent electrode pattern 4 is not formed.

FIG. 11 illustrates an aspect in which the laminate of the present invention includes the non-patterned region 22.

The laminate preferably includes the region in which the transparent substrate, the transparent film, and the second transparent resin layer are laminated in this order in the plane at least in a part of the non-patterned region 22 in which the transparent electrode pattern is not formed.

In the laminate, in the region in which the transparent substrate, the transparent film, and the second transparent resin layer are laminated in this order, the transparent film and the second transparent resin layer are preferably adjacent to each other.

In the other region of the non-patterned region 22, other members may be disposed in arbitrary locations within the scope of the gist of the present invention, and, for example, in a case in which the laminate of the present invention is used in the electrostatic capacitance-type input device described below, it is possible to laminate a mask layer 2, an insulating layer 5, a conductive element 6, and the like in FIG. 1A.

In the laminate, the transparent substrate and the transparent film are preferably adjacent to each other.

FIG. 11 illustrates an aspect in which the transparent film 11 is adjacently laminated on the transparent substrate 1.

Within the scope of the gist of the present invention, a third transparent film may be laminated between the transparent substrate and the transparent film. For example, a third transparent film having a refractive index of 1.5 to 1.52 (not illustrated in FIG. 11) is preferably provided between the transparent substrate and the transparent film.

In the laminate, the thickness of the transparent film is preferably 55 to 110 nm, more preferably 60 to 110 nm, and particularly preferably 70 to 90 nm.

Here, the transparent film may have a monolayer structure or a laminate structure of two or more layers. In a case in which the transparent film has a laminate structure of two or more layers, the film thickness of the transparent film refers to the total film thickness of all the layers.

In the laminate, the transparent film and the transparent electrode pattern are preferably adjacent to each other.

FIG. 11 illustrates an aspect in which the second transparent electrode pattern 4 is adjacently laminated on a region of a part of the transparent film 11.

As illustrated in FIG. 11, the shape of the end portion of the second transparent electrode pattern 4 is not particularly limited and may be a taper shape, and, for example, the end portion may have a taper shape in which the surface on the transparent substrate side is wider than the surface on the side opposite to the transparent substrate.

Here, when the end portion of the transparent electrode pattern has a taper shape, the angle of the end portion of the transparent electrode pattern (hereinafter, also referred to as the taper angle) is preferably 30° or less, more preferably 0.1° to 15°, and particularly preferably 0.5° to 5°.

In the present specification, the taper angle can be obtained using the following method for measuring the taper angle: a microscopic photograph of the end portion of the transparent electrode pattern is captured, the taper portion in the microscopic photograph is approximated to a triangle, and the taper angle is directly measured.

Figure 10:
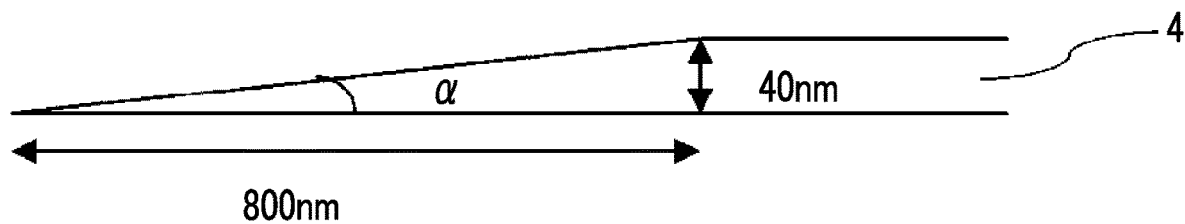
FIG. 10 is an explanatory view illustrating an example of a taper shape of an end portion of the transparent electrode pattern.

FIG. 10 illustrates an example of a case in which the end portion of the transparent electrode pattern has a taper shape. In a triangle obtained by approximating a taper portion in FIG. 10, the bottom surface is 800 nm, the height (the film thickness at the top portion substantially parallel to the bottom surface) is 40 nm, and the taper angle $\alpha$ at this time is approximately 3°. The bottom surface of the triangle obtained by approximating the taper portion is preferably 10 to 3,000 nm, more preferably 100 to 1,500 nm, and particularly preferably 300 to 1,000 nm.

Meanwhile, a preferred range of the height of the triangle obtained by approximating the taper portion is the same as the preferred range of the film thickness of the transparent electrode pattern.

The laminate preferably includes a region in which the transparent electrode pattern and the second transparent resin layer are adjacent to each other.

FIG. 11 illustrates an aspect in which the transparent electrode pattern, the second transparent resin layer, and the first transparent resin layer are adjacent to each other in the region 21 in which the transparent electrode pattern, the second transparent resin layer, and the first transparent resin layer are laminated in this order.

In addition, in the laminate, both of the transparent electrode pattern and the non-patterned region 22 in which the transparent electrode pattern is not formed are preferably continuously coated with the transparent film and the second transparent resin layer directly or through other layers.

Here, "being continuously coated" means that the transparent film and the second transparent resin layer are not patterned films but continuous films. That is, the transparent film and the second transparent resin layer preferably have no opening portions since the transparent electrode pattern is made to be rarely visible.

In addition, the transparent electrode pattern and the non-patterned region 22 are more preferably directly coated with the transparent film and the second transparent resin layer than coated through other layers. In a case in which the transparent electrode pattern and the non-patterned region are coated through other layers, examples of "other layers" include the insulating layer 5 included in the electrostatic capacitance-type input device described below, a transparent electrode pattern on the second layer in a case in which two or more transparent electrode patterns are included as in the electrostatic capacitance-type input device described below, and the like.

FIG. 11 illustrates an aspect in which the second transparent resin layer 12 is laminated. The second transparent resin layer 12 is laminated so as to astride the region in which the second transparent electrode pattern 4 on the transparent film 11 is not laminated and the region in which the second transparent electrode pattern 4 is laminated. That is, the second transparent resin layer 12 is adjacent to the transparent film 11 and, furthermore, the second transparent resin layer 12 is adjacent to the second transparent electrode pattern 4.

In addition, in a case in which the end portion of the second transparent electrode pattern 4 has a taper shape, the second transparent resin layer 12 is preferably laminated along the taper shape (at the same slope as the taper angle).

FIG. 11 illustrates an aspect in which the first transparent resin layer 7 is laminated on the surface on a side opposite to the surface of the second transparent resin layer 12 on which the transparent electrode pattern is formed.

<Material of Laminate>
(Substrate)

The laminate of the present invention has a substrate including the electrode of the electrostatic capacitance-type input device. In the substrate including the electrode of the electrostatic capacitance-type input device, the substrate and the electrode are preferably separate members.

The substrate is preferably a glass substrate or a transparent film substrate. In addition, the substrate is preferably a transparent substrate. In the laminate, the substrate is more preferably a transparent film substrate.

The refractive index of the substrate is particularly preferably 1.5 to 1.52.

The substrate may be constituted of a translucent substrate such as a glass substrate, and it is possible to use reinforced glass or the like represented by Corning's GORILLA glass. In addition, as the transparent substrate, it is possible to preferably use the materials used in JP2010-86684A, JP2010-152809A, and JP2010-257492A.

In a case in which a film substrate is used as the substrate, a transparent film substrate causing no optical distortion or a transparent film substrate having high transparency is more preferably used, and specific examples of materials include polyethylene terephthalate (PET), polyethylene naphthalate, polycarbonate (PC), triacetyl cellulose (TAC), or cycloolefin polymers (COP).

(Transparent Electrode Pattern)

The refractive index of the transparent electrode pattern is preferably 1.75 to 2.1.

The material of the transparent electrode pattern is not particularly limited, and well-known materials can be used. For example, it is possible to produce the transparent electrode pattern using a translucent conductive metal oxide film such as indium tin oxide (ITO) or indium zinc oxide (IZO). Examples of the above-described metal film include ITO films; metal films of Al, Zn, Cu, Fe, Ni, Cr, Mo, and the like; metal oxide films of $SiO_2$ and the like. In this case, the film thicknesses of the respective elements can be set to 10 to 200 nm. In addition, since amorphous ITO films are turned into polycrystalline ITO films by means of firing, it is also possible to reduce the electrical resistance. In addition, the first transparent electrode pattern 3, the second transparent electrode pattern 4, and the conductive element 6 described below can also be manufactured using the photosensitive film having a photocurable resin layer for which a conductive fiber is used. Additionally, in a case in which the first conductive pattern and the like are formed using ITO or the like, it is possible to refer to Paragraphs 0014 to 0016 of JP4506785B. Among these, the transparent electrode pattern is preferably an ITO film.

In the laminate of the present invention, the transparent electrode pattern is preferably an ITO film having a refractive index of 1.75 to 2.1.

(First Transparent Resin Layer and Second Transparent Resin Layer)

Preferred ranges of the first transparent resin layer and the second transparent resin layer included in the laminate of the present invention are the same as the preferred ranges of the above-described first transparent resin layer and the above-described second transparent resin layer in the transfer film of the present invention.

Among those, in the laminate, the first transparent resin layer preferably includes a carboxylic acid anhydride from the viewpoint of the first transparent resin layer serving as an electrode protective film having excellent heat and moisture resistance in an electrostatic capacitance-type input device. It is assumed that, in a case in which a carboxyl group-containing resin of the first transparent resin layer is thermally crosslinked by adding a blocked isocyanate, the three-dimensional crosslinking density increases, an anhydride of the carboxyl group in the carboxyl group-containing resin is formed and hydrophobilized, or the like, which contributes to the improvement of the heat and moisture resistance after the supply of saline water.

A method for adding a carboxylic acid anhydride to the first transparent resin layer is not particularly limited, but is preferably a method in which at least a part of a carboxyl group-containing acrylic resin is turned into a carboxylic acid anhydride by heating the transferred first transparent resin layer. In addition, in a case in which at least one polymerizable compound contains a carboxyl group, a carboxyl group-containing acrylic resin and the polymerizable compound containing a carboxyl group may form a carboxylic acid anhydride or polymerizable compounds containing a carboxyl group may form a carboxylic acid anhydride.

(Transparent Film)

In the laminate, the refractive index of the transparent film is preferably 1.6 to 1.78 and more preferably 1.65 to 1.74. Here, the transparent film may have a monolayer structure or a laminate structure of two or more layers. In a case in which the transparent film has a laminate structure of two or more layers, the refractive index of the transparent film refers to the refractive index of all the layers.

The material of the transparent film is not particularly limited as long as the above-described range of the refractive index is satisfied.

A preferred range of the material of the transparent film and a preferred range of the physical properties such as the refractive index are the same as the preferred ranges of those of the second transparent resin layer.

In the laminate, the transparent film and the second transparent resin layer are preferably constituted of the same material from the viewpoint of optical homogeneity.

In the laminate of the present invention, the transparent film is preferably a transparent resin film.

The metal oxide particles, the binder polymer, and other additives that are used in the transparent resin film are not particularly limited within the scope of the gist of the present invention, and it is possible to preferably use the resin and other additives that are used in the second transparent resin layer in the transfer film of the present invention.

In the laminate, the transparent film may be an inorganic film. As the material that is used in the inorganic film, the materials that are used in the second transparent resin layer in the transfer film of the present invention can be preferably used.

(Third Transparent Film)

The refractive index of the third transparent film is preferably 1.5 to 1.55 since the refractive index is approximated to the refractive index of the transparent substrate and the visibility of the transparent electrode pattern improves and more preferably 1.5 to 1.52.

[Method for Manufacturing Laminate]

The method for manufacturing the laminate preferably includes a step of transferring the second transparent resin layer from the transfer film of the present invention to the substrate including the electrode of the electrostatic capacitance-type input device.

The method for manufacturing the laminate preferably includes a step of laminating the second transparent resin layer and the first transparent resin layer of the transfer film of the present invention in this order on the transparent electrode pattern.

In a case in which the above-described constitution is provided, it is possible to collectively transfer the second transparent resin layer and the first transparent resin layer of the laminate and easily manufacture laminates having no problems of the transparent electrode pattern being visible with favorable productivity.

Meanwhile, the second transparent resin layer is formed on the transparent electrode pattern and, in the non-patterned region, on the transparent film directly or through other layers.

(Surface Treatment of Transparent Substrate)

In addition, in order to enhance the adhesion of the respective layers by means of lamination in the subsequent transfer step, it is possible to carry out a surface treatment on the noncontact surface of the transparent substrate (front surface plate) in advance. As the surface treatment, it is preferable to carry out a surface treatment using a silane compound (silane coupling treatment). A silane coupling agent is preferably an agent having a functional group that interacts with photosensitive resins. For example, a silane coupling liquid (an aqueous solution of 0.3% by mass of N-β(aminoethyl)γ-aminopropyltrimethoxysilane, trade name: KBM603, manufactured by Shin-Etsu Chemical Co., Ltd.) is showered on the surface for 20 seconds, and the surface is cleaned by means of pure water showering. After that, a reaction is caused by means of heating. A heating tank may be used, and the reaction can also be accelerated by preliminarily heating the substrate using a laminator.

(Formation of Transparent Electrode Pattern)

The transparent electrode pattern can be formed on the transparent substrate or the transparent film having a refractive index of 1.6 to 1.78 and a film thickness of 55 to 110 nm using a method for forming the first transparent electrode pattern 3, the second transparent electrode pattern 4, and the additional conductive element 6 or the like in the description of the electrostatic capacitance-type input device described below or the like, and a method in which a photosensitive film is used is preferred.

(Formation of First Transparent Resin Layer and Second Transparent Resin Layer)

Examples of a method for forming the first transparent resin layer and the second transparent resin layer include methods having a protective film-removing step of removing the protective film from the transfer film of the present invention, a transfer step of transferring the first transparent resin layer and the second transparent resin layer in the transfer film of the present invention from which the protective film has been removed onto the transparent electrode pattern, an exposure step of exposing the first transparent resin layer and the second transparent resin layer which have been transferred onto the transparent electrode pattern, and a development step of developing the first transparent resin layer and the second transparent resin layer which have been exposed.

—Transfer Step—

The transfer step is preferably a step of transferring the first transparent resin layer and the second transparent resin layer in the transfer film of the present invention from which the protective film has been removed onto the transparent electrode pattern.

In this case, a method including a step of removing the base material (temporary support) after laminating the first transparent resin layer and the second transparent resin layer in the transfer film of the present invention on the transparent electrode pattern is preferred.

The first transparent resin layer and the second transparent resin layer are transferred (attached) onto the surface of the temporary support by overlaying, pressurizing, and heating the first transparent resin layer and the second transparent resin layer on the surface of the transparent electrode pattern. For the attachment, well-known laminators such as a laminator, a vacuum laminator, and an auto-cut laminator capable of enhancing productivity can be used.

—Exposure Step, Development Step, and Other Steps—

As examples of the exposure step, the development step, and other steps, it is possible to preferably use the method described in Paragraphs 0035 to 0051 of JP2006-23696A even in the present invention.

The exposure step is a step of exposing the first transparent resin layer and the second transparent resin layer which have been transferred onto the transparent electrode pattern.

Specific examples thereof include a method in which a predetermined mask is disposed above the first transparent resin layer and the second transparent resin layer which has been formed on the transparent electrode patterns and then the first transparent resin layer and the second transparent resin layer are exposed to light sources above the mask through the mask and the temporary support.

Here, as the light sources for the exposure, it is possible to appropriately select and use light sources as long as the light sources are capable of radiating light having wavelengths in a range (for example, 365 nm, 405 nm, or the like) with which the first transparent resin layer and the second transparent resin layer can be cured. Specific examples thereof include an ultrahigh-pressure mercury lamp, a high-pressure mercury lamp, a metal halide lamp, and the like. The exposure amount is generally approximately 5 to 200 mJ/cm$^2$ and preferably approximately 10 to 100 mJ/cm$^2$.

The development step is a step of developing the exposed photocurable resin layers.

In the present invention, the development step is a narrowly-defined development step in which the first transparent resin layer and the second transparent resin layer which have been pattern-exposed are pattern-developed using a developer.

The development can be carried out using a developer. The developer is not particularly limited, and it is possible to use well-known developers such as the developer described in JP1993-72724A (JP-H05-72724A). Furthermore, the developer is preferably a developer in which photocurable resin layers perform dissolution-type development behaviors and, for example, preferably a developer including a compound having a power of Ka (pKa; Ka represents the acid dissociation constant) of 7 to 13 at a concentration of 0.05 to 5 mol/L. Meanwhile, in a case in which the first transparent resin layer and the second transparent resin layer do not form any patterns, the developer is preferably a developer which performs development behaviors so as not to dissolve the non-alkali development-type coloring composition layer and, for example, preferably a developer including a compound having a pKa of 7 to 13 at a concentration of 0.05 to 5 mol/L. To the developer, a small amount of a water-miscible organic solvent may be further added. Examples of the water-miscible organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, N-methyl pyrrolidone, and the like. The concentration of the organic solvent is preferably 0.1% by mass to 30% by mass.

In addition, to the developer, it is possible to further add a well-known surfactant. The concentration of the surfactant is preferably 0.01% by mass to 10% by mass.

The development method may be any one of puddle development, shower development, shower and spin development, dip development, and the like. In the case of the shower development, a developer is showered onto the first transparent resin layer and the second transparent resin layer which have been exposed, whereby it is possible to remove non-cured portions. Furthermore, in a case in which the thermoplastic resin layer or the interlayer is provided, it is preferable to shower an alkaline liquid that does not easily dissolve photocurable resin layers and remove the thermoplastic resin layer, the interlayer, and the like before development. In addition, after the development, it is preferable to shower a cleaning agent or the like and remove development residue by rubbing the surface with a brush or the like. The liquid temperature of the developer is preferably 20° C. to 40° C., and the pH of the developer is preferably 8 to 13.

The method for manufacturing the laminate may have other steps such as a post exposure step.

Furthermore, patterning exposure or full-surface exposure may be carried out after the peeling of the base material (temporary support) or may be carried out before the peeling of the temporary support, which is followed by the peeling of the temporary support. The exposure may be exposure through a mask or digital exposure using a laser or the like.

—Heating Step—

The method for manufacturing the laminate preferably includes a step of heating the transferred first transparent resin layer and more preferably includes a step of turning at least a part of the carboxyl group-containing acrylic resin into a carboxylic acid anhydride by heating the transferred first transparent resin layer from the viewpoint of enhancing heat and moisture resistance after the supply of saline water. The transferred first transparent resin layer is preferably heated after exposure and development, that is, the step is preferably a post-baking step carried out after exposure and development. In a case in which the first transparent resin layer and the second transparent resin layer are heat-curable, particularly, a post-baking step is preferably carried out. In addition, the post-baking step is preferably carried out from the viewpoint of adjusting the resistance value of the transparent electrode such as ITO.

The heating temperature in the step of turning at least a part of the carboxyl group-containing acrylic resin into a carboxylic acid anhydride by heating the transferred first transparent resin layer is preferably 100° C. to 160° C. in a case in which a film substrate is used as the substrate and more preferably 140° C. to 150° C.

(Formation of Transparent Film)

In a case in which the laminate further has a transparent film having a refractive index of 1.6 to 1.78 and a film thickness of 55 to 110 nm on a side of the transparent electrode pattern opposite to the side on which the second transparent resin layer is formed, the transparent film is produced on the transparent electrode pattern directly or through other layers such as the third transparent film.

A method for forming the transparent film is not particularly limited, but the transparent film is preferably formed by means of transfer or sputtering.

Among these, the transparent film is preferably formed by transferring a transparent curable resin film formed on the temporary support onto the transparent substrate and more preferably formed by transferring and then curing the transparent curable resin film. Examples of a method for transferring and curing include a method in which the photosensitive film described in the section of the electrostatic capacitance-type input device of the present invention described below is used and transfer, exposure, development, and other steps are carried out in the same manner as in the method for transferring the first transparent resin layer and the second transparent resin layer in the method for manufacturing the laminate. In this case, the refractive index of the transparent film is preferably adjusted to the above-described range by dispersing the metal oxide particles in a photocurable resin layer in the photosensitive film.

Meanwhile, in a case in which the transparent film is an inorganic film, the transparent film is preferably formed by means of sputtering. That is, the transparent film is also preferably formed by means of sputtering.

As a method for sputtering, it is possible to preferably use the method used in JP2010-86684A, JP2010-152809A, and JP2010-257492A.

(Formation of Third Transparent Film)

A method for forming the third transparent film is the same as a method for forming the transparent film having a refractive index of 1.6 to 1.78 and a film thickness of 55 to 110 nm on the transparent substrate.

The method for manufacturing the laminate preferably includes a step of curing the first transparent resin layer and the second transparent resin layer at the same time and more preferably includes a step of pattern-curing the layers at the same time. For the transfer film of the present invention, it is preferable to laminate the first transparent resin layer and then laminate the second transparent resin layer without curing the first transparent resin layer. The first transparent resin layer and the second transparent resin layer which have been transferred from the transfer film of the present invention obtained in the above-described manner can be cured at the same time. Therefore, the first transparent resin layer and the second transparent resin layer can be developed in a desired pattern by means of photolithography after being transferred onto the transparent electrode pattern from the transfer film of the present invention.

The method for manufacturing the laminate more preferably includes a step of developing and removing non-cured portions (in the case of light-curing, only non-exposed portions or only exposed portions) in the first transparent resin layer and the second transparent resin layer after the step of curing the first transparent resin layer and the second transparent resin layer at the same time.

[Electrostatic Capacitance-Type Input Device]

The electrostatic capacitance-type input device of the present invention includes the electrode protective film for an electrostatic capacitance-type input device of the present invention or the laminate of the present invention.

The electrostatic capacitance-type input device of the present invention is preferably produced by transferring the second transparent resin layer and the first transparent resin layer from the transfer film onto the transparent electrode pattern in the electrostatic capacitance-type input device.

The electrostatic capacitance-type input device of the present invention is preferably produced by curing the first transparent resin layer and the second transparent resin layer which have been transferred from the transfer film of the present invention at the same time and more preferably produced by pattern-curing the first transparent resin layer and the second transparent resin layer at the same time.

The electrostatic capacitance-type input device of the present invention is more preferably produced by developing and removing the non-cured portion of the first transparent resin layer and the second transparent resin layer which have been transferred from the transfer film of the present invention and pattern-cured at the same time. The electrostatic capacitance-type input device of the present invention needs to be connected to a flexible wire formed on a polyimide film at the terminal portion of a guidance wire and is thus preferably not covered with the first transparent resin layer (and the second transparent resin layer).

Figure 13:
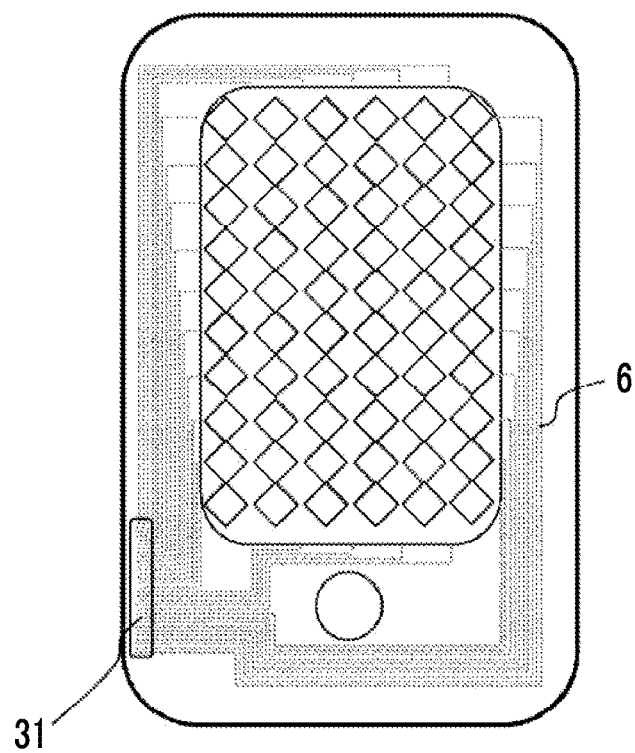
FIG. 13 is a top view illustrating still another example of the constitution of the electrostatic capacitance-type input device of the present invention and illustrates an aspect including a terminal portion (end portion) of a guidance wire which is pattern-exposed and is not covered with a first transparent resin layer.

The above-described aspect is illustrated in FIG. 13. FIG. 13 illustrates an electrostatic capacitance-type input device having the following constitution which includes a guidance wire (the additional conductive element 6) of the transparent electrode pattern and a terminal portion 31 of the guidance wire.

The first transparent resin layer (and the second transparent resin layer) on the terminal portion 31 of the guidance wire forms a non-cured portion (non-exposed portion) and is thus removed by means of development, whereby the terminal portion 31 of the guidance wire is exposed.

Figure 14:
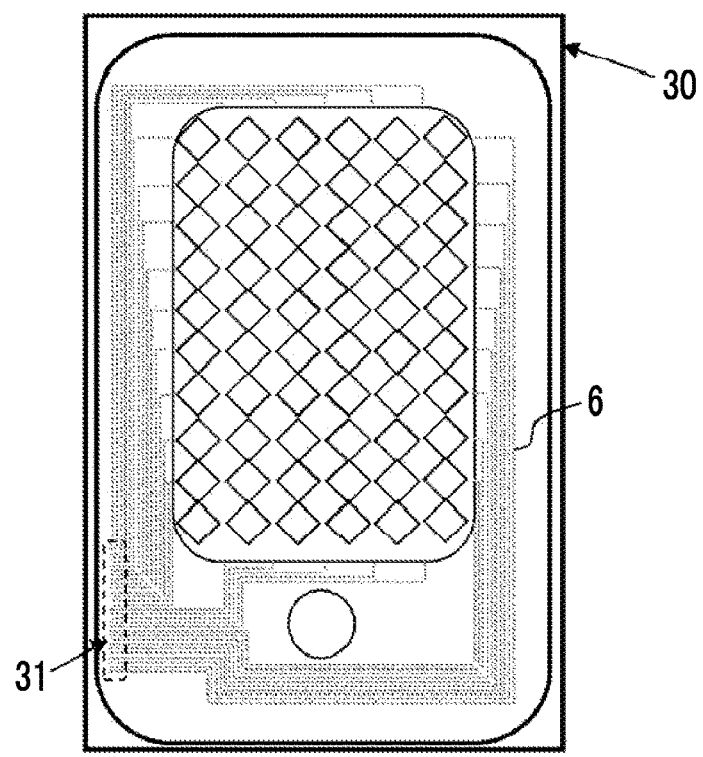
Figure 15:
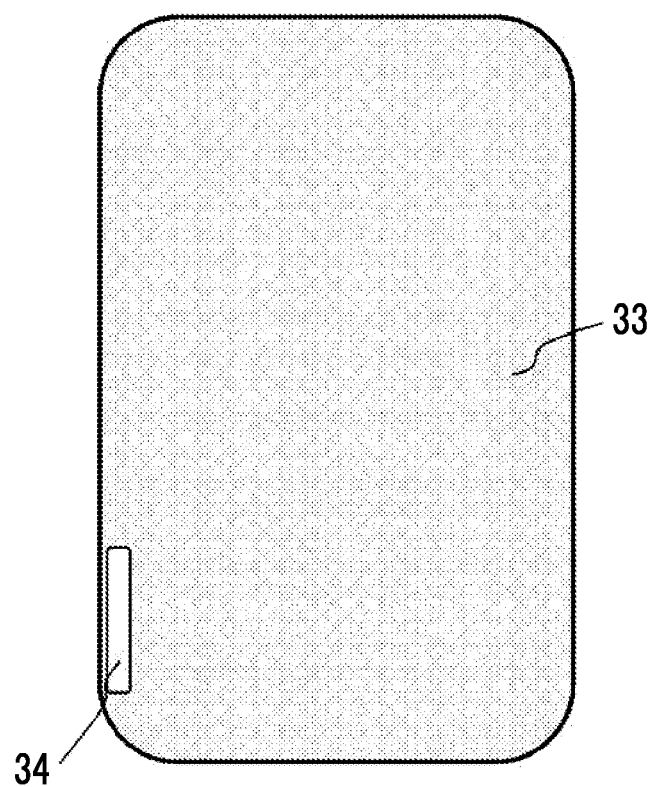
FIG. 15 is a schematic view illustrating an example of a desired pattern in which the first transparent resin layer and the second transparent resin layer are cured.

Specific exposure and development aspects are illustrated in FIGS. 14 and 15. FIG. 14 illustrates a state in which the transfer film 30 of the present invention having the first transparent resin layer and the second transparent resin layer is laminated on the transparent electrode pattern in the electrostatic capacitance-type input device by means of lamination and is to be cured by means of exposure or the like. In a case in which photolithography is used, that is, a case in which the transfer film is cured by means of exposure, the electrostatic capacitance-type input device can be obtained by pattern-exposing the cured portion (exposed portion) 33 of the first transparent resin layer and the second transparent resin layer having a shape illustrated in FIG. 15 using a mask and developing the non-exposed portions. Specifically, in FIG. 15, a cured portion (desired pattern) of the first transparent resin layer and the second transparent resin layer for preventing the terminal portion (the ejection wire portion) of the guidance wire from being covered, from which an opening portion 34 corresponding to the terminal portion of the guidance wire as the non-cured portion of the first transparent resin layer and the second transparent resin layer and the end portions of the transfer film of the present invention having the first transparent resin layer and the second transparent resin layer which protrude outside the contour of the frame portion of the electrostatic capacitance-type input device has been removed, are obtained.

Therefore, it is possible to directly connect the flexible wire produced on the polyimide film to the terminal portion 31 of the guidance wire, and thus it becomes possible to send signals from sensors to electric circuits.

The electrostatic capacitance-type input device of the present invention preferably has a laminate having the transparent electrode pattern, the second transparent resin layer disposed adjacent to the transparent electrode pattern, and the first transparent resin layer disposed adjacent to the second transparent resin layer, in which the refractive index of the second transparent resin layer is higher than the refractive index of the first transparent resin layer and the refractive index of the second transparent resin layer is 1.6 or higher.

Hereinafter, the detail of a preferred aspect of the electrostatic capacitance-type input device of the present invention will be described.

The electrostatic capacitance-type input device of the present invention has a front surface plate (corresponding to the transparent substrate in the laminate of the present invention) and at least the following elements (3) to (5), (7), or (8) on the noncontact surface side of the front surface plate and preferably has the laminate of the present invention:

(3) a plurality of first transparent electrode patterns in which a plurality of pad portions are formed so as to extend in a first direction through a connection portion;

(4) a plurality of second electrode patterns which are electrically insulated from the first transparent electrode patterns and are made of a plurality of pad portions formed so as to extend in a direction orthogonal to the above-described first direction;

(5) an insulating layer that electrically insulates the first transparent electrode pattern and the second electrode pattern;

(7) a second transparent resin layer formed so as to fully or partially cover the elements (3) to (5); and (8) a first transparent resin layer adjacently formed so as to cover the element (7).

Here, the second transparent resin layer (7) corresponds to the second transparent resin layer in the laminate of the present invention. In addition, the first transparent resin layer (8) corresponds to the first transparent resin layer in the laminate of the present invention. Meanwhile, generally, the first transparent resin layer is preferably a so-called transparent protective layer in well-known electrostatic capacitance-type input devices.

In the electrostatic capacitance-type input device of the present invention, the second electrode pattern (4) may or may not be a transparent electrode pattern but is preferably a transparent electrode pattern.

The electrostatic capacitance-type input device of the present invention preferably further has an additional conductive element other than the first transparent electrode pattern and the second electrode pattern which is electrically connected to at least one of the first transparent electrode pattern or the second electrode pattern (6).

Here, in a case in which the second electrode pattern (4) is not a transparent electrode pattern and the additional conductive element (6) is not provided, the first transparent electrode pattern (3) corresponds to the transparent electrode pattern in the laminate of the present invention.

In a case in which the second electrode pattern (4) is a transparent electrode pattern and the additional conductive element (6) is not provided, at least one of the first transparent electrode pattern (3) or the second electrode pattern (4) corresponds to the transparent electrode pattern in the laminate of the present invention.

In a case in which the second electrode pattern (4) is not a transparent electrode pattern and the additional conductive element (6) is provided, at least one of the first transparent electrode pattern (3) or the additional conductive element (6) corresponds to the transparent electrode pattern in the laminate of the present invention.

In a case in which the second electrode pattern (4) is a transparent electrode pattern and the additional conductive element (6) is provided, at least one of the first transparent electrode pattern (3), the second electrode pattern (4), or the additional conductive element (6) corresponds to the transparent electrode pattern in the laminate of the present invention.

The electrostatic capacitance-type input device of the present invention preferably further has the transparent film (2) between the first transparent electrode pattern (3) and the front surface plate, between the second electrode pattern (4) and the front surface plate, or between the additional conductive element (6) and the front surface plate. Here, the transparent film (2) preferably corresponds to the transparent film having a refractive index of 1.6 to 1.78 and a film thickness of 55 to 110 nm in the laminate of the present invention from the viewpoint of further improving the visibility of the transparent electrode pattern.

The electrostatic capacitance-type input device of the present invention preferably has the mask layer (1) and/or a decorative layer as necessary. The mask layer is also provided as a black trim around a region touched by a finger, a stylus, or the like in order to prevent the guidance wire of the transparent electrode pattern from being visible from the touch side or decorate the input device. The decorative layer is provided as a trim around the region touched by a finger, a stylus, or the like in order for decoration, and, for example, a white decorative layer is preferably provided.

The mask layer (1) and/or the decorative layer are preferably provided between the transparent film (2) and the front surface plate, between the first transparent electrode pattern (3) and the front surface plate, between the second transparent electrode pattern (4) and the front surface plate, or between the additional conductive element (6) and the front surface plate. The mask layer (1) and/or the decorative layer are more preferably provided adjacent to the front surface plate.

Even in a case in which the electrostatic capacitance-type input device includes a variety of members described above, in a case in which the electrostatic capacitance-type input device of the present invention includes the second transparent resin layer disposed adjacent to the transparent electrode pattern and the first transparent resin layer disposed adjacent to the second transparent resin layer, it is possible to prevent the transparent electrode pattern from becoming visible and improve the problem of the visibility of the transparent electrode pattern. Furthermore, as described above, in a case in which a constitution in which the transparent electrode pattern is sandwiched using the transparent film having a refractive index of 1.6 to 1.78 and a film thickness of 55 to 110 nm and the second transparent resin layer is provided, it is possible to further improve the problem of the visibility of the transparent electrode pattern.

<Constitution of Electrostatic Capacitance-Type Input Device>

First, a preferred constitution of the electrostatic capacitance-type input device of the present invention will be described together with methods for manufacturing the respective members constituting the device. FIG. 1A is a cross-sectional view illustrating a preferred constitution of the electrostatic capacitance-type input device of the present invention. FIG. 1A illustrates an aspect in which an electrostatic capacitance-type input device 10 is composed of the transparent substrate (front surface plate) 1, the mask layer 2, the transparent film 11 having a refractive index of 1.6 to 1.78 and a film thickness of 55 to 110 nm, the first transparent electrode pattern 3, the second transparent electrode pattern 4, the insulating layer 5, the conductive element 6, the second transparent resin layer 12, and the first transparent resin layer 7.

In addition, FIG. 1B which illustrates a cross-sectional view in a direction of X-Y direction in FIG. 3 described below is also, similarly, a cross-sectional view illustrating a preferred constitution of the electrostatic capacitance-type input device of the present invention. FIG. 1B illustrates an aspect in which the electrostatic capacitance-type input device 10 is composed of the transparent substrate (front surface plate) 1, the transparent film 11 having a refractive index of 1.6 to 1.78 and a film thickness of 55 to 110 nm, the first transparent electrode pattern 3, the second transparent electrode pattern 4, the second transparent resin layer 12, and the first transparent resin layer 7.

For the transparent substrate (front surface plate) 1, the material exemplified as the material of the transparent electrode pattern in the laminate of the present invention can be used. In addition, in FIG. 1A, the side of the transparent substrate 1 on which the respective elements are provided is referred to as the noncontact surface side. In the electrostatic capacitance-type input device 10 of the present invention, input is carried out by bringing a finger or the like into contact with the contact surface (the surface opposite to the noncontact surface) of the transparent substrate 1.

In addition, on the noncontact surface side of the transparent substrate 1, the mask layer 2 is provided. The mask layer 2 is a trim-shaped pattern around a display region formed on the noncontact surface side of a touch panel front surface plate and is formed in order to prevent the guidance wire and the like from being visible.

Figure 2:
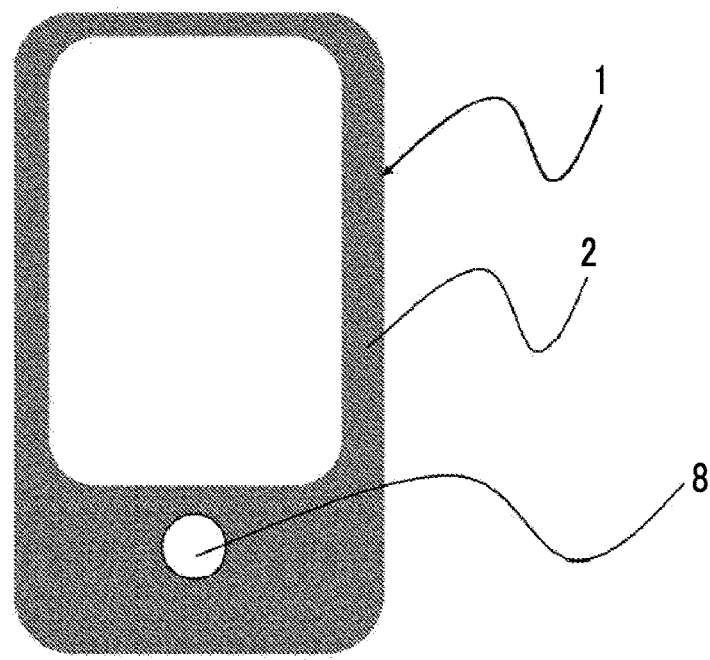
FIG. 2 is an explanatory view illustrating an example of a front surface plate in the present invention.

In the electrostatic capacitance-type input device 10 of the present invention, the mask layer 2 is provided so as to cover a part of the region (a region other than the input surface in FIG. 2) of the transparent substrate 1 as illustrated in FIG. 2. Furthermore, an opening portion 8 can be provided in a part of the transparent substrate 1 as illustrated in FIG. 2. In the opening portion 8, a press-type mechanical switch can be installed.

On the contact surface of the transparent substrate 1, a plurality of first transparent electrode patterns 3 in which a plurality of the pad portions are formed so as to extend in the first direction through the connection portions, a plurality of second transparent electrode patterns 4 which are electrically insulated from the first transparent electrode pattern 3 and are made of a plurality of pad portions formed so as to extend in a direction orthogonal to the first direction, and the insulating layer 5 that electrically insulates the first transparent electrode pattern 3 and the second transparent electrode pattern 4 are formed. For the first transparent electrode pattern 3, the second transparent electrode pattern 4, and the conductive element 6 described below, the materials exemplified as the material of the transparent electrode pattern in the laminate of the present invention can be used, and ITO films are preferred.

In addition, at least one of the first transparent electrode pattern 3 or the second transparent electrode pattern 4 can be installed so as to astride both regions of the noncontact surface of the transparent substrate 1 and the surface of the mask layer 2 opposite to the transparent substrate 1. FIG. 1A illustrates a view in which the second transparent electrode pattern is installed so as to astride both regions of the noncontact surface of the transparent substrate 1 and the surface of the mask layer 2 opposite to the transparent substrate 1.

As described above, even in a case in which a photosensitive film is laminated so as to astride the mask layer which requires a certain thickness and the rear surface of the transparent substrate, in a case in which a photosensitive film having a specific layer constitution described below is used, lamination causing no generation of foam in the boundary with the mask portion becomes possible with a simple step without using an expensive facility such as a vacuum laminator.

The first transparent electrode pattern 3 and the second transparent electrode pattern 4 will be described using FIG. 3. FIG. 3 is an explanatory view illustrating an example of the first transparent electrode pattern and the second transparent electrode pattern in the present invention. As illustrated in FIG. 3, in the first transparent electrode pattern 3, the pad portions 3a are formed so as to extend in the first direction C through the connection portion 3b. In addition, the second transparent electrode pattern 4 is electrically insulated from the first transparent electrode pattern 3 using the insulating layer 5 and is composed of a plurality of the pad portions formed so as to extend in a direction orthogonal to the first direction (a second direction D in FIG. 3). Here, in a case in which the first transparent electrode pattern 3 is formed, the pad portions 3a and the connection portions 3b may be integrally produced or it is also possible to produce the connection portions 3b alone and integrally produce (pattern) the pad portions 3a and the second transparent electrode pattern 4. In a case in which the pad portions 3a and the second transparent electrode pattern 4 are integrally produced (patterned), the respective layers are formed so that some of the connection portions 3b and some of the pad portions 3a are coupled together as illustrated in FIG. 3 and the first transparent electrode pattern 3 and the second transparent electrode pattern 4 are electrically insulated from each other using the insulating layer 5.

In addition, in FIG. 3, a region in which the first transparent electrode pattern 3, the second transparent electrode pattern 4, or the conductive element 6 described below is not formed corresponds to the non-patterned region 22 in the laminate of the present invention.

Figure 1B:
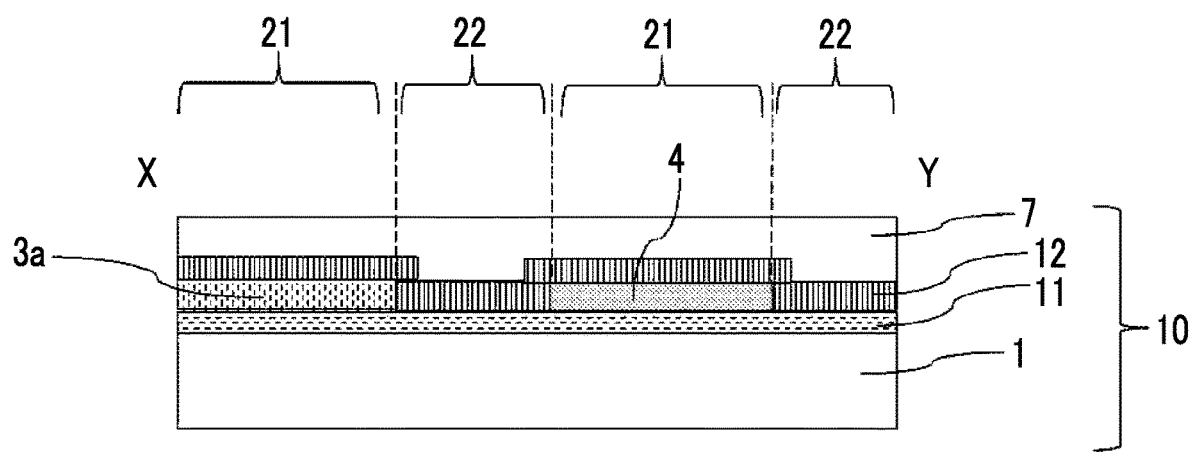
FIG. 1B is a schematic cross-sectional view illustrating another example of the constitution of the electrostatic capacitance-type input device of the present invention.

In FIG. 1A, the conductive element 6 is installed on the surface side of the mask layer 2 opposite to the transparent substrate 1. The conductive element 6 is electrically connected to at least one of the first transparent electrode pattern 3 or the second transparent electrode pattern 4 and is a separate element from the first transparent electrode pattern 3 and the second transparent electrode pattern 4.

FIG. 1A illustrates a view in which the conductive element 6 is connected to the second transparent electrode pattern 4.

In addition, in FIG. 1A, the first transparent resin layer 7 is installed so as to cover all of the respective constituent elements. The first transparent resin layer 7 may be composed so as to cover only part of the respective constituent elements. The insulating layer 5 and the first transparent resin layer 7 may be made of the same material or different materials. As the material constituting the insulating layer 5, it is possible to preferably use the material exemplified as the material of the first or second transparent resin layer in the laminate of the present invention.

<Method for Manufacturing Electrostatic Capacitance-Type Input Device>

Figure 4:
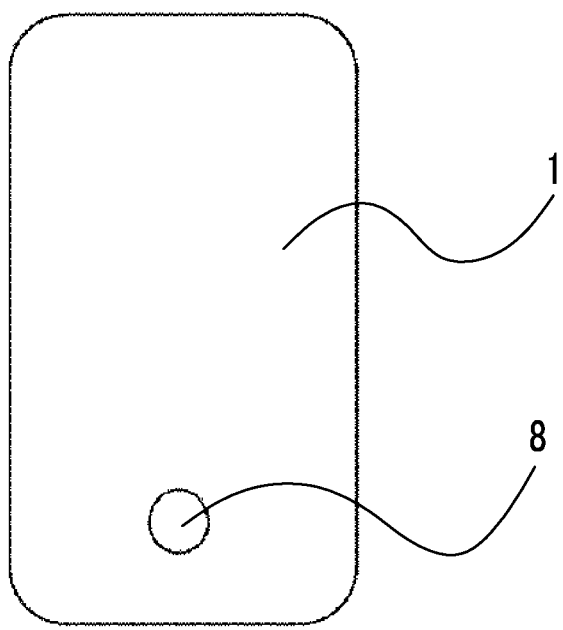
FIG. 4 is a top view illustrating an example of the front surface plate in which an opening portion is formed.
Figure 5:
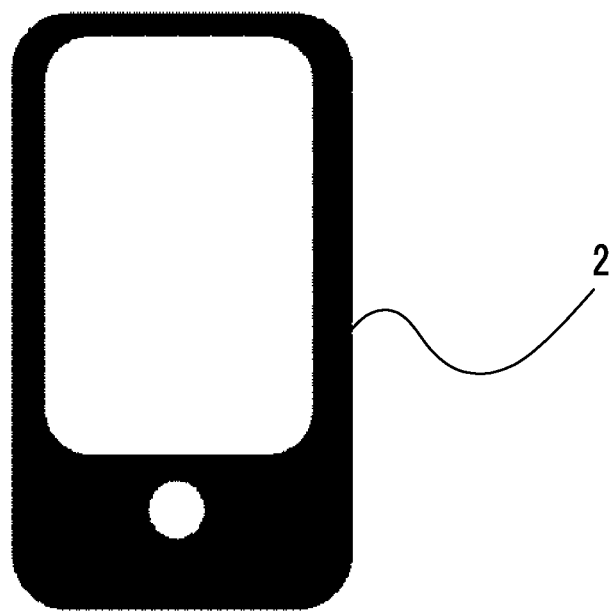
FIG. 5 is a top view illustrating an example of the front surface plate on which a mask layer is formed.
Figure 6:
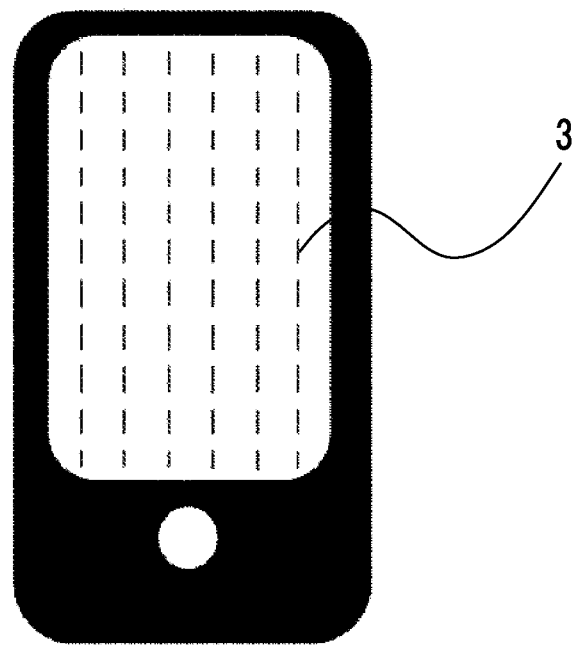
FIG. 6 is a top view illustrating an example of the front surface plate on which a first transparent electrode pattern is formed.
Figure 7:
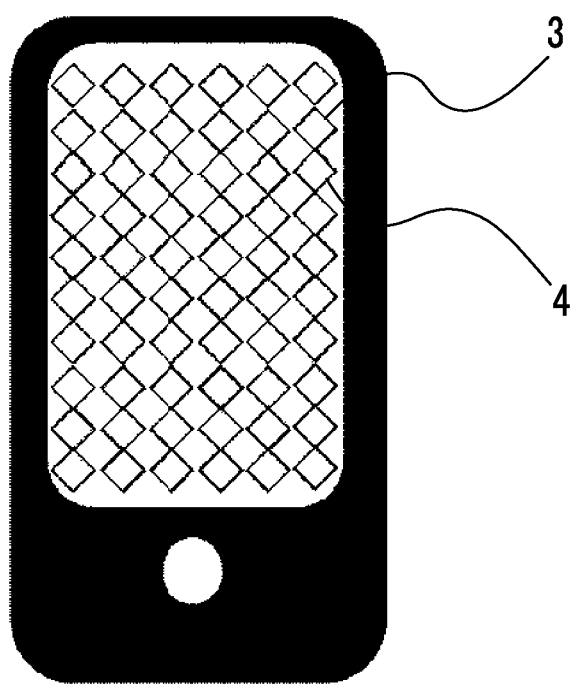
FIG. 7 is a top view illustrating an example of the front surface plate on which the first transparent electrode pattern and a second transparent electrode pattern are formed.
Figure 8:
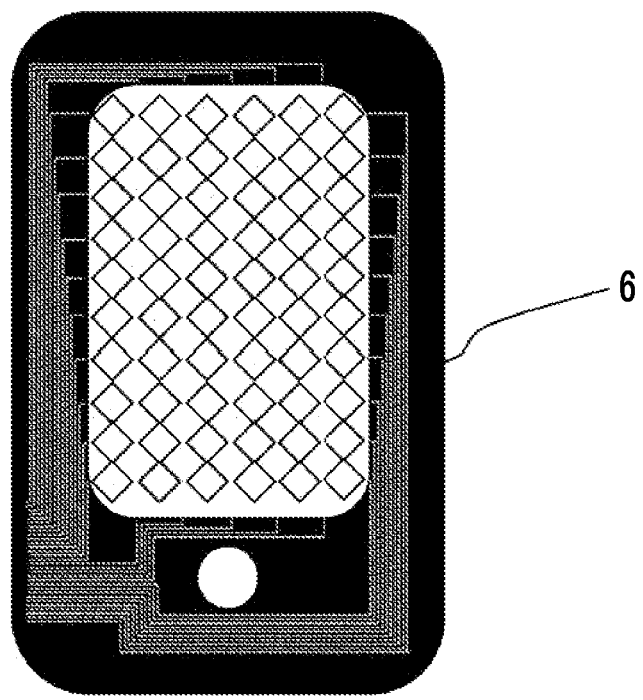
FIG. 8 is a top view illustrating an example of the front surface plate on which a conductive element different from the first and second transparent electrode patterns is formed.

Examples of an aspect being formed in a process for manufacturing the electrostatic capacitance-type input device of the present invention include aspects of FIGS. 4 to 8. FIG. 4 is a top view illustrating an example of the transparent substrate 1 in which the opening portion 8 is formed and which is made of reinforced glass. FIG. 5 is a top view illustrating an example of the front surface plate in which the mask layer 2 is formed. FIG. 6 is a top view illustrating an example of the front surface plate in which the first transparent electrode pattern 3 is formed. FIG. 7 is a top view illustrating an example of the front surface plate in which the first transparent electrode pattern 3 and the second transparent electrode pattern 4 are formed. FIG. 8 is a top view illustrating an example of the front surface plate in which the conductive element 6 other than the first and second transparent electrode patterns is formed. These aspects illustrate examples in which the following description is specified, and the scope of the present invention is not interpreted to be limited by these drawings.

In a method for manufacturing the electrostatic capacitance-type input device, in a case in which the second transparent resin layer 12 and the first transparent resin layer 7 are formed, the layers can be formed by transferring the second transparent resin layer and the first transparent resin layer onto the surface of the transparent substrate 1 on which the respective elements are arbitrarily formed using the transfer film of the present invention.

In the method for manufacturing the electrostatic capacitance-type input device, at least one element of the mask layer 2, the first transparent electrode pattern 3, the second transparent electrode pattern 4, the insulating layer 5, or the conductive element 6 is preferably formed using the photosensitive film having the temporary support and the photocurable resin layer in this order.

In a case in which the respective elements are formed using the transfer film or the photosensitive film of the present invention, even in the substrate (the front surface plate) having the opening portion, resist components do not leak through the opening portion, and, particularly, in the mask layer in which a light-blocking pattern needs to be formed up to immediately above the boundary line of the front surface plate, resist components do not leak from a glass end, and thus the rear side of the front surface plate is not contaminated, and it is possible to manufacture touch panels having a reduced thickness and a reduced weight with simple steps.

In a case in which the mask layer, the insulating layer, and the conductive photocurable resin layer are used, in a case in which the permanent materials of the first transparent electrode pattern, the second transparent electrode pattern, the conductive element, and the like are formed using the photosensitive film, the photosensitive film is laminated on the base material, then, is exposed in a pattern shape as necessary, and the non-exposed portions in the case of a negative-type material or the exposed portions in the case of a positive-type material are removed by means of a development treatment, whereby patterns can be obtained. In the development, the thermoplastic resin layer and the photocurable resin layer may be developed and removed using separate fluids or may be removed using the same fluid. Well-known development facilities such as a brush and a high-pressure jet may be combined together as necessary. After the development, post exposure and post baking may be carried out as necessary.

(Photosensitive Film)

Figure 9:
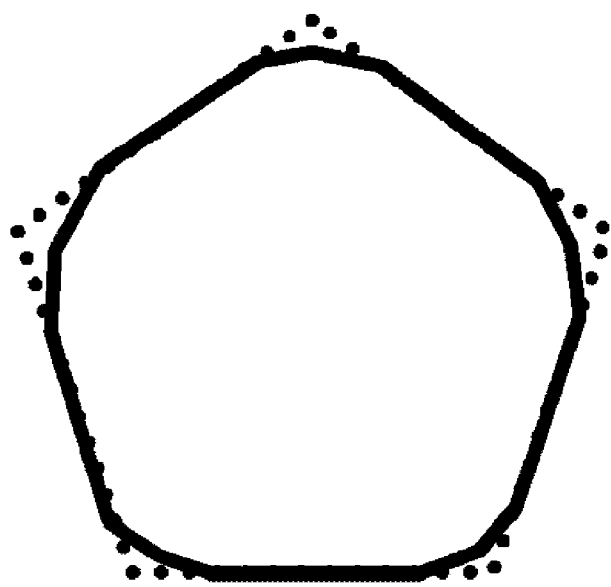
FIG. 9 is an explanatory view illustrating a cross section of a metal nanowire.

The photosensitive film other than the transfer film of the present invention which is preferably used when the electrostatic capacitance-type input device of the present invention is manufactured is described in [0222] to [0255] of JP2014-178922A, the content of which is incorporated herein by reference. The cross section of a metal nanowire mentioned in this publication is the same cross section of a metal nanowire illustrated in FIG. 9 of the present specification.

<Image Display Device>

To the electrostatic capacitance-type input device of the present invention and image display devices comprising this electrostatic capacitance-type input device as a constituent element, it is possible to apply the constitution disclosed by "Advanced touch panel technology" (published by Techno Times Co., Ltd. on Jul. 6, 2009), "Technology and development of touch panels" edited by Yuji Mitani, CMC Publishing Co., Ltd. (December 2004), FPD International 2009 Forum T-11 lecture textbook, Cypress Semiconductor Corporation application note AN2292, and the like.

EXAMPLES

Hereinafter, the present invention will be more specifically described using examples. Materials, amounts used, ratios, processing contents, processing orders, and the like described in the following examples can be appropriately modified within the scope of the gist of the present invention. Therefore, the scope of the present invention is not limited to specific examples described below. Meanwhile, unless particularly otherwise described, "parts" and "%" are mass-based.

Examples 1 to 10 and Comparative Examples 1 to 5

<Preparation of Coating Fluid for First Transparent Resin Layer>

Materials A-1 to A-7 which were coating fluids for a first transparent resin layer were prepared so as to have compositions shown in Table 1. The molecular weights of polymerizable compounds are weight-average molecular weights.

TABLE 1

| | | Molecular weight | Material A-1 | Material A-2 | Material A-3 | Material A-4 | Material A-5 | Material A-6 | Material A-7 |
|---|---|---|---|---|---|---|---|---|---|
| Polymerizable compound | Tricyclodecane dimethanol diacrylate (A-DCP manufactured by Shin-Nakamura Chemical Co., Ltd.) | 304 | 5.63 | | 4.23 | 5.63 | 6.67 | 5.89 | 5.63 |
| | Carboxylic acid-containing monomer ARONIX TO-2349 (manufactured by Toagosei Co., Ltd.) | 611 | 0.93 | 0.93 | 0.93 | 0.93 | 1.10 | 1.30 | 0.93 |
| | Ditrimethylolpropane tetraacrylate (AD-TMP manufactured by Shin-Nakamura Chemical Co., Ltd.) | 466 | | 5.63 | | | | | |
| | 1,9-Nonanediol diacrylate (A-NOD-N manufactured by Shin-Nakamura Chemical Co., Ltd.) | 282 | | | 1.40 | | | 1.97 | |
| | Urethane acrylate 8UX-015A (manufactured by Taisei Fine Chemical Co., Ltd.) | 1500 | 2.81 | 2.81 | 2.81 | | 3.34 | 3.93 | |
| | Ethoxylated glycerine triacrylate (A-GLY-9E manufactured by Shin-Nakamura Chemical Co., Ltd.) | 811 | | | | 2.81 | | | |
| | 1,6-Hexanediol diacrylate (A-HD-N manufactured by Shin-Nakamura Chemical Co., Ltd.) | 226 | | | | | | | 4.56 |
| Binder polymer | Compound A (acid value 95 mgKOH/g) | — | 15.63 | 15.63 | | | 13.89 | 11.91 | 13.89 |
| | Compound B (acid value: 65 mgKOH/g) | — | | | 15.63 | 15.63 | | | |
| Polymerization initiator | Ethanone, 1-[9-ethyl-6-(2-methylbenzoyl)-9H-carbazole-3-yl]-, 1-(O-acetyloxime) (trade name: OXE-02, manufactured by BASF) | — | 0.11 | 0.11 | 0.11 | 0.11 | 0.11 | 0.11 | 0.11 |
| | 2-Methyl-1-(4-methyl thiophenyl)-2-morpholino-propan-1-one (trade name IRGACURE 907, manufactured by BASF) | — | 0.21 | 0.21 | 0.21 | 0.21 | 0.21 | 0.21 | 0.21 |
| Blocked isocyanate | DURANATE TPA-B80E (manufactured by Asahi Kasei Corporation) | — | 3.63 | | 3.63 | 3.63 | 3.63 | 3.63 | 3.63 |
| | DURANATE X3071.04 (manufactured by Asahi Kasei Corporation) | — | | 3.63 | | | | | |
| Additive | MEGAFACE F551 (manufactured by DIC Corporation) | — | 0.02 | 0.02 | 0.02 | 0.02 | 0.02 | 0.02 | 0.02 |

TABLE 1-continued

|  |  | Molecular weight | Material A-1 | Material A-2 | Material A-3 | Material A-4 | Material A-5 | Material A-6 | Material A-7 |
|---|---|---|---|---|---|---|---|---|---|
| Solvent | 1-Methoxy-2-propyl acetate | — | 31.03 | 31.03 | 31.03 | 31.03 | 31.03 | 31.03 | 31.03 |
|  | Methyl ethyl ketone | — | 40.00 | 40.00 | 40.00 | 40.00 | 40.00 | 40.00 | 40.00 |
|  | Ratio of content of polymerizable compounds having molecular weight of 300 or less |  | 0% | 0% | 15% | 0% | 0% | 15% | 41% |
|  | Polymerizable compound/binder polymer mass ratio |  | 0.60 | 0.60 | 0.60 | 0.60 | 0.80 | 1.10 | 0.80 |
|  | Total (parts by mass) |  | 100 | 100 | 100 | 100 | 100 | 100 | 100 |

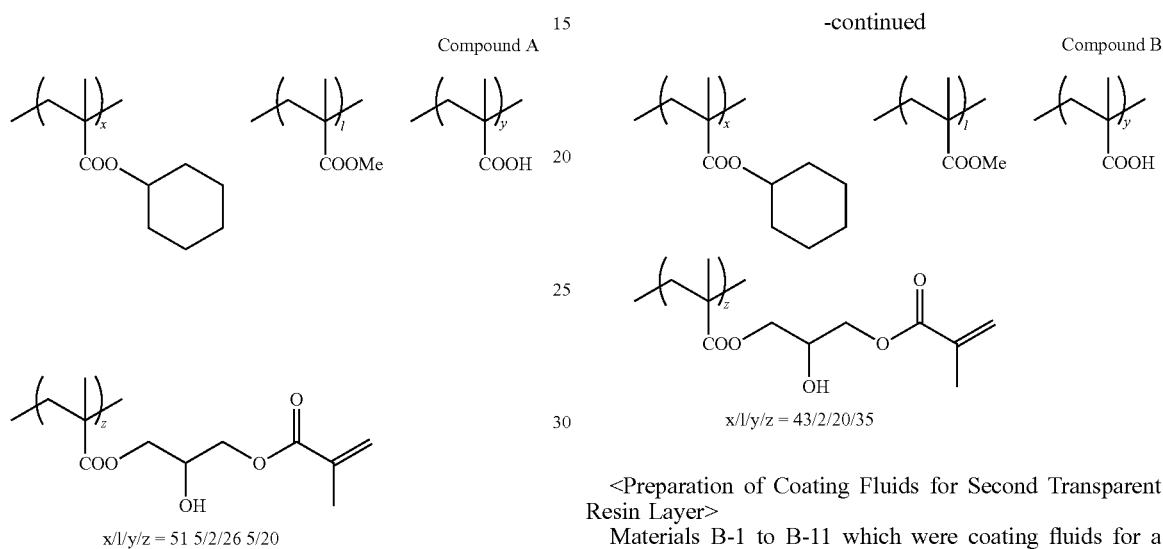

<Preparation of Coating Fluids for Second Transparent Resin Layer>

Materials B-1 to B-11 which were coating fluids for a second transparent resin layer were prepared so as to obtain compositions shown in Table 2.

TABLE 2

|  |  | Material B-1 | Material B-2 | Material B-3 | Material B-4 | Material B-5 | Material B-6 | Material B-7 | Material B-8 | Material B-9 | Material B-10 | Material B-11 |
|---|---|---|---|---|---|---|---|---|---|---|---|---|
| Metal oxide particles | NanoUse OZ-S30M: $ZrO_2$ particles, methanol dispersion liquid (nonvolatile component: 30.5%) manufactured by Nissan Chemical Industries, Ltd. | 4.26 | 2.74 | 3.35 | 5.18 |  |  | 4.57 | 2.74 | 4.87 | 4.87 | 1.22 |
|  | TS-020: $TiO_2$ particles, water dispersion (non-volatile component: 25.6%), manufactured by TAYCA |  |  |  |  | 3.27 | 6.17 |  |  |  |  |  |
| Resin having acidic group | Copolymer resin of methacrylic acid/allyl methacrylate (weight-average molecular weight: 25,000, compositional ratio = 40/60, nonvolatile component: 99.8%) | 0.47 | 0.94 | 0.75 | 0.20 | 0.50 | 0.50 | 0.50 | 0.94 | 0.50 | 0.50 | 0.50 |
| Monomer having acidic group | ARONIX TO-2349: Carboxylic acid-containing monomer (manufactured by Toagosei Co., Ltd.) | 0.04 | 0.04 | 0.04 | 0.04 | 0.04 | 0.04 | 0.04 | 0.04 | 0.04 | 0.04 | 0.04 |
| Metal oxidation suppressor | Benzotriazole BT120 (manufactured by Johoku Chemical Co., Ltd.) | 0.04 | 0.04 | 0.04 | 0.04 | 0.04 | 0.04 | 0.04 | 0.04 | 0.04 | 0.04 | 0.04 |

TABLE 2-continued

| | | Material | | | | | | | | | | |
|---|---|---|---|---|---|---|---|---|---|---|---|---|
| | | Material B-1 | Material B-2 | Material B-3 | Material B-4 | Material B-5 | Material B-6 | Material B-7 | Material B-8 | Material B-9 | Material B-10 | Material B-11 |
| Additive | MEGAFACE F444 (manufactured by DIC Corporation) | 0.01 | 0.01 | 0.01 | 0.01 | 0.01 | 0.01 | 0.01 | 0.01 | 0.01 | 0.01 | 0.01 |
| Solvent | Ammonia water (2.5%) | 7.84 | 7.84 | 7.84 | 7.84 | 7.84 | 7.84 | 7.84 | 7.84 | 7.84 | 7.84 | 7.84 |
| | Ion-exchange water | 29.5 | 29.4 | 29.5 | 29.4 | 27.4 | 24.5 | 49.0 | 68.7 | 68.5 | 9.6 | 30.4 |
| | Methanol | 65.7 | 66.8 | 66.3 | 65.1 | 68.7 | 68.7 | 45.9 | 27.5 | 26.0 | 84.9 | 67.8 |
| | Total (parts by mass) | 108 | 108 | 108 | 108 | 108 | 108 | 108 | 108 | 108 | 108 | 108 |

Production of Transfer Films of Examples 1 to 9 and Comparative Examples 1 to 5

Any one of Materials A-1 to A-7 for a first transparent resin layer was applied onto a 16 μm-thick temporary support which was a polyethylene terephthalate film using slit-shaped nozzles while adjusting the application amount so that the dried film thickness reached 8.0 μm, thereby forming a first transparent resin layer. After a solvent was volatilized in a drying zone at 120° C., any one of Materials B-1 to B-11 for a second transparent resin layer was applied onto the first transparent resin layer using slit-shaped nozzles in a combination shown in Table 4 while adjusting the application amount so that the dried film thickness reached approximately 80 nm. After that, the film was dried at a drying temperature shown in Table 4, thereby forming a second transparent resin layer. A protective film (12 μm-thick polypropylene film) was pressed onto the second transparent resin layer, thereby producing a transfer film of each of Examples 1 to 9 and Comparative Examples 1 to 5.

Production of Transfer Films of Example 10

A coated film of Material A-1 for a first transparent resin layer was formed on a 16 μm-thick temporary support which was a polyethylene terephthalate film using slit-shaped nozzles while adjusting the application amount so that the dried film thickness reached 8.0 μm. After a solvent was volatilized in a drying zone at 120° C., the coated film of Material A-1 for a first transparent resin layer was irradiated using an UV lamp, thereby forming a first transparent resin layer (at an exposure amount of 80 mJ/cm$^2$, metal halide lamp). After that, Material B-1 for a second transparent resin layer was applied onto the first transparent resin layer while adjusting the application amount so that the dried film thickness reached 80 nm. After that, the film was dried at a drying temperature shown in Table 4. A protective film (12 μm-thick polypropylene film) was pressed onto the second transparent resin layer, thereby producing a transfer film of Example 10.

<Production of Transparent Electrode Pattern Films used to Produce Laminates>

(Formation of Transparent Film)

A cycloolefin resin film having a film thickness of 38 μm and a refractive index of 1.53 was prepared. A surface of this cycloolefin resin was reformed using a high-frequency oscillator. The surface was reformed by carrying out a corona discharge treatment using a wire electrode having a diameter of 1.2 mm under conditions of an electrode length of 240 mm, a distance between working electrodes of 1.5 mm, an output voltage of 100%, an output of 250 W, and a treatment time of three seconds. The surface-reformed cycloolefin resin was used as a transparent film substrate.

Next, the material of Material-C shown in Table 3 was applied onto the transparent film substrate using slit-shaped nozzles. After that, the material was irradiated with ultraviolet rays (at an integral of light of 300 mJ/cm$^2$), and dried at approximately 110° C., thereby producing a transparent film having a refractive index of 1.60 and a film thickness of 80 nm.

TABLE 3

| Material | Material-C |
|---|---|
| ZrO$_2$: manufactured by Solar Co., Ltd., ZR-010 | 2.08 |
| DPHA liquid (dipentaerythritol hexaacrylate: 38%, dipentaerythritol pentaacrylate: 38%, 1-methoxy-2-propyl acetate: 24%) | 0.29 |
| Urethane-based monomer: NK OLIGOMER UA-32P, manufactured by Shin-Nakamura Chemical Co., Ltd., nonvolatile component: 75%, 1-methoxy-2-propyl acetate: 25% | 0.14 |
| Monomer mixture (the polymerizable compound (b2-1) described in Paragraph [0111] of JP2012-78528A, n = 1: the content ratio of tripentaerythritol octaacrylate: 85%, the sum of n = 2 and n = 3 as impurities: 15%) | 0.36 |
| Polymer solution 1 (Structural Formula P-25 described in [0058] of JP2008-146018A: the weight-average molecular weight = 35,000, solid content: 45%, 1-methoxy-2-propyl acetate: 15%, 1-methoxy-2-propanol: 40%) | 1.89 |
| Photoradical polymerization initiator: 2-benzyl-2-dimethylamino-1-(4-morpholinophenyl)-butanone (IRGACURE 379, manufactured by BASF) | 0.03 |
| Photopolymerization initiator: KAYACURE DETX-S (alkylthioxanthone manufactured by Nippon Kayaku Co., Ltd.) | 0.03 |
| Polymer solution 2 (polymer having a structural formula represented by Formula (3): solution having a weight-average molecular weight = 15,000, nonvolatile content: 30% by mass, methyl ethyl ketone: 70% by mass) | 0.01 |
| 1-Methoxy-2-propyl acetate | 38.73 |
| Methyl ethyl ketone | 56.80 |
| Total (parts by mass) | 100 |

Meanwhile, "wt %" in the specification is identical to "% by mass".

The fluorine-based polymer was a copolymer of 40 parts of $C_6F_{13}CH_2CH_2OCOCH=CH_2$, 55 parts of $H(OCH(CH_3)$ Formula (3)

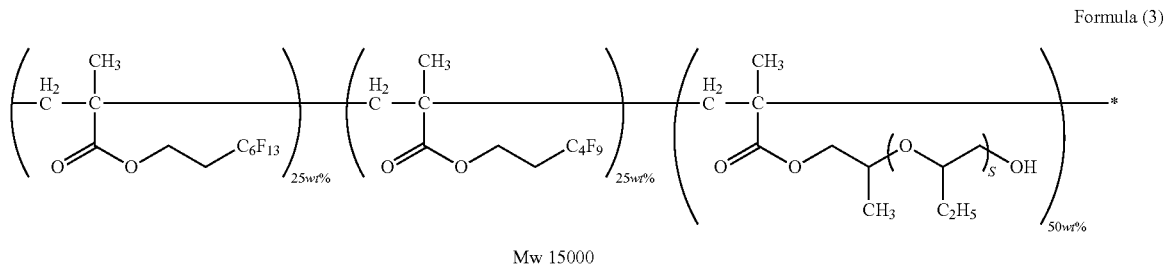

Mw 15000

(Formation of Transparent Electrode Pattern)

A film on which the transparent film obtained above had been laminated was introduced into a vacuum chamber. Next, a 40 nm-thick ITO thin film having a refractive index of 1.82 was formed using an ITO target (indium:tin=95:5 (molar ratio)) in which the content ratio of $SnO_2$ was 10% by mass by means of DC magnetron sputtering (conditions: the temperature of the transparent film substrate was 150° C., the argon pressure was 0.13 Pa, and the oxygen pressure was 0.01 Pa). A film having the transparent film and a transparent electrode layer formed on the transparent film substrate was obtained in the above-described manner. The surface electrical resistance of the ITO thin film was 80Ω/☐ (Ω per square).

—Preparation of Photosensitive Film for Etching E1—

A coating fluid for a thermoplastic resin layer made of Formulation H1 was applied and dried on a 75 μm-thick polyethylene terephthalate film temporary support using slit-shaped nozzles. Next, a coating fluid for an interlayer made of Formulation P1 was applied and dried. Furthermore, a coating fluid for a photocurable resin layer for etching made of Formulation E1 was applied and dried. A laminate having a thermoplastic resin layer having a dried film thickness of 15.1 μm, an interlayer having a dried film thickness of 1.6 μm, and a photocurable resin layer for etching having a film thickness of 2.0 μm was obtained on a temporary support in the above-described manner. Next, a protective film (12 μm-thick polypropylene film) was pressed onto this laminate. A photosensitive film for etching E1 which is a transfer material in which the temporary support, the thermoplastic resin layer, the interlayer (oxygen-blocking film), and the photocurable resin layer for etching were integrated together was produced.

—Coating Fluid for Thermoplastic Resin Layer: Formulation H1—

Methanol: 11.1 parts by mass
Propylene glycol monomethyl ether acetate: 6.36 parts by mass
Methyl ethyl ketone: 52.4 parts by mass
Methyl methacrylate/2-ethylhexyl acrylate/benzyl methacrylate/methacrylic acid copolymer (copolymerization compositional ratio (molar ratio)=55/11.7/4.5/28.8, weight-average molecular weight=100,000, glass transition temperature (Tg)≈70° C.): 5.83 parts by mass
Styrene/acrylic acid copolymer (copolymerization compositional ratio (molar ratio)=63/37, weight-average molecular weight=10,000, Tg≈100° C.): 13.6 parts by mass
Monomer 1 (trade name: BPE-500, manufactured by Shin-Nakamura Chemical Co., Ltd.): 9.1 parts by mass
Fluorine-based polymer: 0.54 parts by mass $CH_2)_7OCOCH=CH_2$, and 5 parts of $H(OCHCH_2)_7OCOCH=CH_2$ and a solution of 30% by mass of methyl ethyl ketone having a weight-average molecular weight of 30,000 (trade name: MEGAFACE F780F, manufactured by DIC Corporation).

—Coating Fluid for Interlayer: Formulation P1—

Polyvinyl alcohol: 32.2 parts by mass
(trade name: PVA205, manufactured by Kuraray Co., Ltd., degree of saponification=88%, degree of polymerization 550)
Polyvinyl pyrrolidone: 14.9 parts by mass
(trade name: K-30, manufactured by ISP Japan K.K.)
Distilled water: 524 parts by mass
Methanol: 429 parts by mass —Coating Fluid for Photocurable Resin Layer for Etching: Formulation E1—

Methyl methacrylate/styrene/methacrylic acid copolymer (copolymer composition (% by mass): 31/40/29, mass-average molecular weight: 60,000, and acid value: 163 mgKOH/g): 16 parts by mass
Monomer 1 (trade name: BPE-500, manufactured by Shin-Nakamura Chemical Co., Ltd.): 5.6 parts by mass
Adduct of hexamethylene diisocyanate and 0.5 mol of tetraethylene oxide monomethacrylate: 7 parts by mass
Cyclohexane dimethanol monoacrylate as a compound having one polymerizable group in the molecule: 2.8 parts by mass
2-Chloro-N-butylacridone: 0.42 parts by mass
2,2-Bis(ortho-chlorophenyl)-4,4',5,5'-tetraphenyl biimidazole: 2.17 parts by mass
Malachite green oxalate: 0.02 parts by mass
Leuco crystal violet: 0.26 parts by mass
Phenothiazine: 0.013 parts by mass
Surfactant (trade name: MEGAFACE F-780F, manufactured by DIC Corporation): 0.03 parts by mass
Methyl ethyl ketone: 40 parts by mass
1-Methoxy-2-propanol: 20 parts by mass Meanwhile, the viscosity of the coating fluid for a photocurable resin layer for etching E1 after the removal of the solvent at 100° C. was 2,500 Pa·sec.

—Formation of Transparent Electrode Pattern—

The film having the transparent film and the transparent electrode layer formed on the transparent film substrate was washed. The photosensitive film for etching E1 from which the protective film had been removed was laminated on this film (the temperature of the transparent film substrate: 130° C., the rubber roller temperature: 120° C., the linear pressure: 100 N/cm, and the transportation rate: 2.2 m/minute). After the peeling of the temporary support from this film, the distance between a surface of an exposure mask (a silica exposure mask having a transparent electrode pattern) and the photocurable resin layer for etching was set to 200 µm, and pattern exposure was carried out at an exposure amount of 50 mJ/cm² (i rays).

Next, this exposed film was treated at 25° C. for 100 seconds using a triethanolamine-based developer (containing 30% by mass of triethanolamine, a liquid obtained by diluting T-PD2 (trade name, manufactured by Fujifilm Corporation) with pure water ten times) and was then treated at 33° C. for 20 seconds using a surfactant-containing washing liquid (a liquid obtained by diluting T-SD3 (trade name, manufactured by Fujifilm Corporation) with pure water ten times). After that, residue was removed using a rotary brush and ultrahigh-pressure washing nozzles. Furthermore, a post-baking treatment was carried out at 130° C. for 30 minutes, thereby obtaining a film having the transparent film, the transparent electrode layer, and a photocurable resin layer pattern for etching formed on the transparent film substrate.

The film having the photocurable resin layer pattern for etching formed thereon was immersed in an etching tank filled with ITO etchants (hydrochloric acid and an aqueous solution of potassium chloride, liquid temperatures: 30° C.) and treated for 100 seconds, thereby dissolving and removing the transparent electrode layer in exposed regions which were not covered with the photocurable resin layer for etching. A transparent electrode pattern-attached film to which the photocurable resin layer pattern for etching was attached was obtained in the above-described manner.

Next, this transparent electrode pattern-attached film was immersed in a resist peeling tank filled with a resist peeling liquid (N-methyl-2-pyrrolidone, monoethanolamine, surfactant (trade name: SURFYNOL 465, manufactured by Air Products and Chemicals, Inc.), liquid temperatures: 45° C.) and treated for 200 seconds, thereby removing the photocurable resin layer for etching. A film having the transparent film and a transparent electrode pattern formed on the transparent film substrate was obtained in the above-described manner.

Production of Laminates of Individual Example and Comparative Examples

The protective film was peeled off from the transfer film of each of the examples and the comparative examples. This transfer film was transferred so that the transparent film and the transparent electrode pattern of "the film having the transparent film and the transparent electrode pattern formed on the transparent film substrate" was covered with the second transparent resin layer. Specifically, the second transparent resin layer, the first transparent resin layer, and the temporary support were transferred in this order to the film on which the transparent electrode pattern was formed (the temperature of the transparent film substrate: 40° C., the rubber roller temperature: 110° C., the linear pressure: 3 N/cm, and the transportation rate: 2 m/minute).

After that, using a proximity-type stepper having an ultrahigh-pressure mercury lamp (manufactured by Hitachi High-Tech Fielding Corporation), the distance between a surface of an exposure mask (a silica exposure mask having a pattern for forming an overcoat) and the temporary support was set to 125 µm, and pattern exposure was carried out at an exposure amount of 100 mJ/cm² (i rays) through the temporary support. After the peeling of the temporary support, a washing treatment was carried out at 32° C. for 60 seconds using an aqueous solution of 2% soda carbonate. Ultrapure water was sprayed from ultrahigh-pressure washing nozzles to the washed transparent film substrate, thereby removing residues. Subsequently, moisture on the transparent film substrate was removed by blowing the air, and a post baking treatment was carried out at 145° C. for 30 minutes. A laminate of each of the examples and the comparative examples in which the transparent film, the transparent electrode pattern, the second transparent resin layer, and the first transparent resin layer were continued in this order on the transparent film substrate was obtained in the above-described manner.

[Evaluation of Transfer Film]

<P/A and P of Profile of Second Transparent Resin Layer>

For the transfer film of each of the examples and the comparative examples, the profile of the thickness-direction distribution of M/C was analyzed by means of Ar⁺ sputter/XPS (XPS stands for X-ray Photoelectron Spectroscopy) using a Quantera SXM-type XPS (manufactured by ULVAC-PHI, Incorporated). M/C represents the ratio of metal atoms (M) constituting the metal oxide particles to carbon atoms (C) constituting the organic component in the second transparent resin layer. The measurement conditions were set as described below.

X-ray: Al—Kα ray (100 µm, 25 W, and 15 kV),
Measurement area: 300 µm☐ (square micrometer),
Photoelectron Take Off Angle: 45°
Pass Energy: 112 eV
Step Energy: 0.1 eV
Ar⁺ Sputter Conditions Accelerated voltage: 2 kV,
Irradiation Range: 2 mm☐ (square millimeter)

As the metal atoms M constituting the metal oxide particles in the second transparent resin layer, Zr and Ti were used. The profiles of the thickness-direction distributions of Zr/C and Ti/C were analyzed. Among these, the maximum values of Zr/C and Ti/C in the thickness direction were considered as "the peak heights P". P is a dimensionless number and does not have any units.

The thickness of the second transparent resin layer was measured using a transmission electron microscope (TEM). Regions having a strength of 1% or more of the peak heights P of the profiles of the thickness-direction distributions of Zr/C and Ti/C were considered to belong to the second transparent resin layer. In the profile of the thickness-direction distribution of M/C, the area of regions having a strength of 1% or more of the peak height P (maximum value) was obtained as the area A of the profile of the thickness-direction distribution of M/C. The unit of A is nanometer. In addition, P/A was computed using the peak height P (maximum value) and the area A. The unit of P/A is (nm)⁻¹. The obtained values of P/A and P are shown in Table 4.

Figure 16:
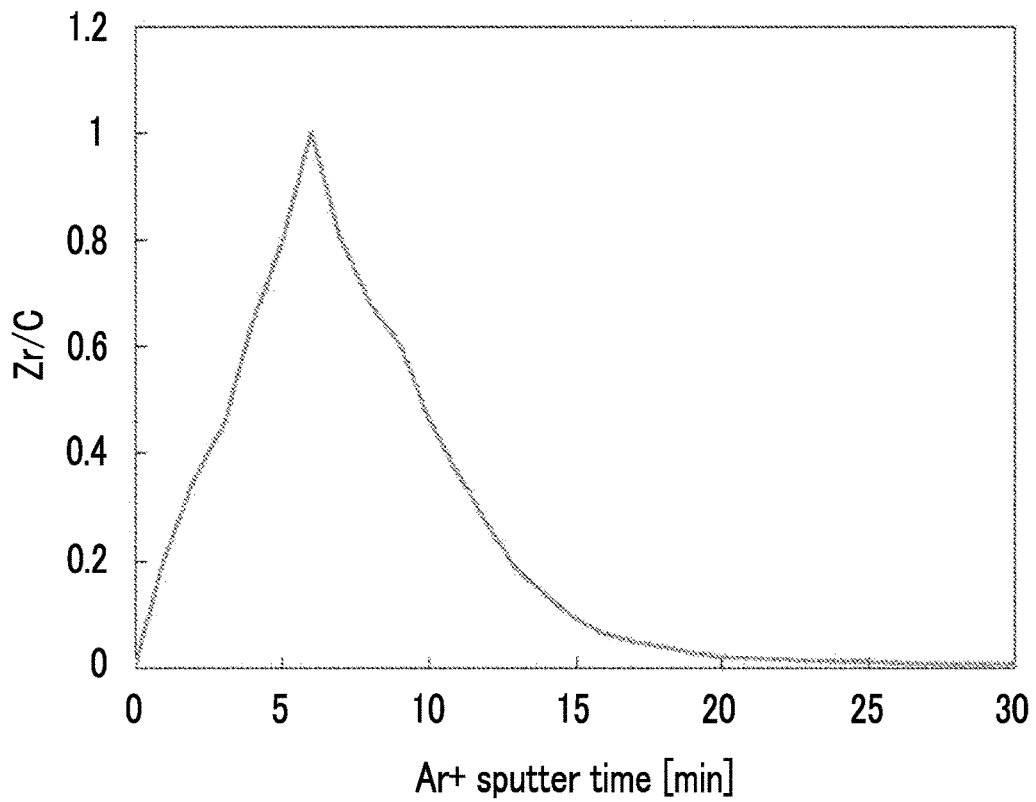
FIG. 16 is a graph illustrating a relationship between an Ar$^+$ sputter time and a ratio M/C of a transfer film of Example 1.
Figure 17:
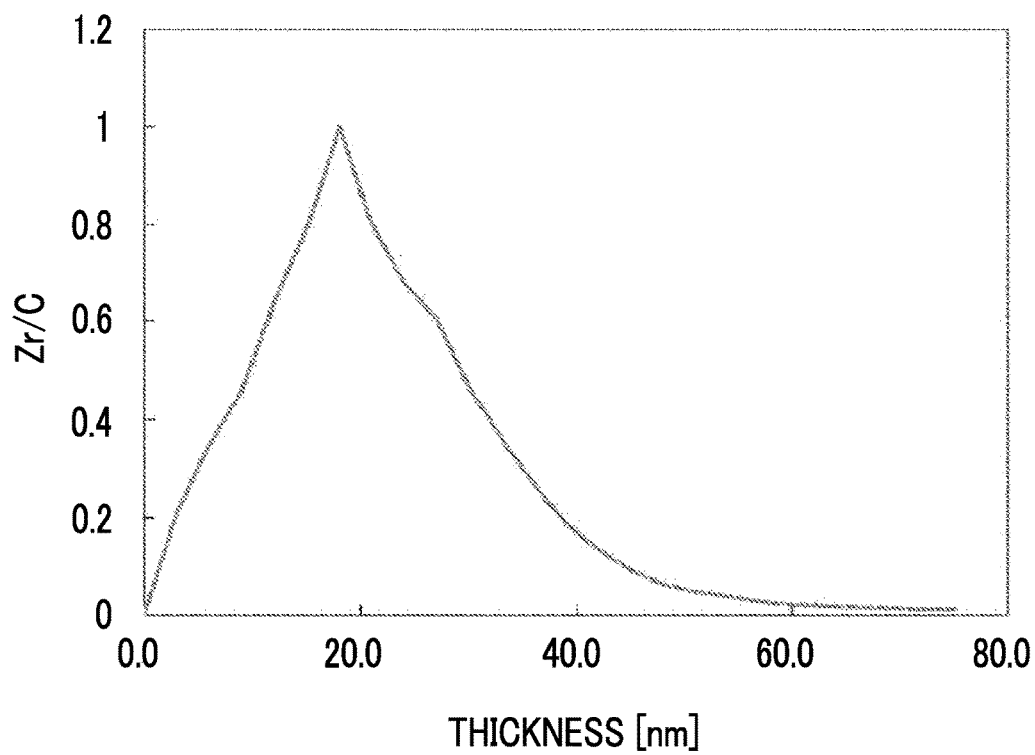
FIG. 17 is a graph illustrating a relationship between a thickness of the transfer film of Example 1 from a surface of the second transparent resin layer and the ratio M/C of the transfer film of Example 1.

In addition, the results of the profile of the thickness-direction distribution of the ratio M/C in the transfer film of Example 1 are illustrated in FIG. 16 and FIG. 17. FIG. 16 is a graph illustrating a relationship between the Ar⁺ sputter time and the ratio M/C of the transfer film of Example 1. FIG. 17 is a graph illustrating a relationship between the thickness of the transfer film of Example 1 from the surface of the second transparent resin layer and M/C. Meanwhile, the Ar⁺ sputter rate was set to 3 nm/minute. FIG. 17 is obtained by converting the Ar⁺ sputter time in FIG. 16 to the thickness (depth) on the basis of the Ar⁺ sputter rate and the Ar⁺ sputter time.

<Defects of Second Transparent Resin Layer After Transfer>

The transfer film of each of the examples and the comparative examples was transferred onto the transparent film substrate which was used to produce the laminate of each of the examples and the comparative examples. After that, using a proximity-type stepper having an ultrahigh-pressure mercury lamp (manufactured by Hitachi High-Tech Fielding Corporation), the distance between a surface of an exposure mask (a silica exposure mask having a pattern for forming an overcoat) and the temporary support was set to 125 µm, and pattern exposure was carried out at an exposure amount of 100 mJ/cm$^2$ (i rays) through the temporary support. After the peeling of the temporary support, on "the member on which the transparent film substrate, the second transparent resin layer, and the first transparent resin layer were laminated in this order", microscopic dark view observation was carried out, and defects through which light leaked linearly were observed. The observation results were evaluated using the following evaluation standards. The results are shown in Table 4. The evaluation of defects of the second transparent resin layer after lamination is preferably A, B, or C, more preferably A or B, and particularly preferably A.

<<Evaluation Standards>>

A: Defects are not observed.

B: Defects are slightly observed, but do not attract attention.

C: Defects are observed, but do not cause any practical problems.

D: Defects are clearly observed and cause practical problems.

<Alkali Developability>

The transfer film of each of the examples and the comparative examples was transferred onto "the film having the transparent film and the transparent electrode pattern formed on the transparent film substrate (a substrate including an electrode of an electrostatic capacitance-type input device)". After that, using a proximity-type stepper having an ultrahigh-pressure mercury lamp (manufactured by Hitachi High-Tech Fielding Corporation), the distance between a surface of an exposure mask (a silica exposure mask having a pattern for forming an overcoat) and the temporary support was set to 125 µm, and pattern exposure was carried out at an exposure amount of 100 mJ/cm$^2$ (i rays) through the temporary support. After the peeling of the temporary support, a washing treatment was carried out at 32° C. for 60 seconds using an aqueous solution of 2% soda carbonate. After that, observation was carried out visually and using an optical microscope. Evaluation was carried out using the following evaluation standards.

A is a level in which pattern formation was possible by pattern exposure and development. B is a level in which pattern formation by pattern exposure and development was difficult and a method such as die cutting was required to form a pattern. The evaluation is preferably A. The evaluation results are shown in Table 4.

<<Evaluation Standards>>

A: No residues can be observed in non-exposure portions even with microscopes.

B: There are portions that are not developed in non-exposure portions, and a number of residues can be visually observed.

<Measurement of Refractive Indexes and Thicknesses of Individual Layers of Transfer Film>

As a method for measuring refractive indexes and thicknesses, there are a method in which refractive indexes and thickness are computed by means of fitting from spectral reflectivity spectra to theoretical values, a method in which refractive indexes and thicknesses are obtained using an ellipsometry method, and the like. In each of the examples and the comparative examples, the refractive indexes and thicknesses of the respective layers were computed from spectral reflectivity spectra. As a measurement instrument, a reflection spectroscopic film thickness meter FE-3000 (manufactured by Otsuka Electronics Co., Ltd.) was used. The refractive indexes and thicknesses of the respective layers were specifically obtained as described below.

(1) A laminate was produced by bringing a black polyethylene terephthalate (PET) material into contact with one surface of the temporary support that was used in each of the examples and the comparative examples through transparent adhesive tape (Optically Clear Adhesive (OCA) tape 8171CL: manufactured by 3M Company). The reflection spectrum (wavelengths: 430 to 800 nm) of "the laminate made up of the temporary support and the black PET" was measured using the reflection spectroscopic film thickness meter FE-3000, and the refractive indexes of the temporary support at the respective wavelengths were obtained by means of operation.

(2) A laminate was produced by bringing a black PET material into contact with a surface of a temporary support in a sample having only the first transparent resin layer formed on the temporary support through transparent adhesive tape (OCA tape 8171CL: manufactured by 3M Company). The reflection spectrum (wavelengths: 430 to 800 nm) of "the laminate made up of the first transparent resin layer, the temporary support, and the black PET" was measured using the reflection spectroscopic film thickness meter FE-3000, and the refractive indexes of the first transparent resin layer at the respective wavelengths and the thickness of the first transparent resin layer were obtained by means of fitting operation using the Fast Fourier Transform (FFT) method and the least-square method. At this time, as the initial value of the thickness that was used in the operation, the thickness of the first transparent resin layer measured using a transmission electron microscope (TEM) was used.

(3) A black PET material was adhered to a sample of "a laminate made up of a temporary support, the first transparent resin layer, and the second transparent resin layer" in the same manner. The refractive indexes and thicknesses of the respective layers were computed while sequentially measuring the reflection spectrum of this laminate.

Meanwhile, the refractive indexes of the first transparent resin layers formed using Materials A-1 to A-7 were 1.5 to 1.53.

[Evaluation of Laminate]

<Transparent Electrode Pattern-Masking Property>

A black PET material was adhered to the laminate of each of the examples and the comparative examples in which the transparent film, the transparent electrode pattern, the second transparent resin layer, and the first transparent resin layer were laminated in this order on the transparent film substrate through transparent adhesive tape (manufactured by 3M Company, trade name: OCA tape 8171CL), thereby shielding the entire substrate from light. That is, the black PET material was provided on a surface on which the first transparent resin layer and the like were not laminated out of two surfaces of the transparent film substrate.

Next, to this laminate, light was made incident on the surface on which the black PET material was not provided, and the reflected light was observed. Specifically, light was incident through the first transparent resin layer side of the laminate using a fluorescent lamp (light source) in a dark room, and reflected light from the first transparent resin layer side was visually observed at an inclined angle. The visible observation results were evaluated using the following evaluation standards. A, B, C, or D is a practical level, A, B, or C is preferred, A or B is more preferred, and A is particularly preferred. The evaluation results are summarized in Table 4.

<<Evaluation Standards>>

A: The transparent electrode pattern is not observed.

B: The transparent electrode pattern is slightly observed, but barely observed.

C: The transparent electrode pattern is observed (not easy to be recognized).

D: The transparent electrode pattern is observed within a practically permissible range.

E: The transparent electrode pattern is clearly observed (easy to be recognized).

TABLE 4

| | First transparent resin layer | | | | | Second transparent resin layer | | |
|---|---|---|---|---|---|---|---|---|
| | Material | Polymerizable compound/binder polymer mass ratio | Minimum molecular amount among polymerizable compounds | Ratio of content of polymerizable compounds having molecular weight of 300 or less | UV curing | Material | Metal oxide particles Kind | Amount added (% by mass) |
| Example 1 | Material A-1 | 0.6 | 304 | 0% | No | Material B-1 | ZrO$_2$ | 70 |
| Example 2 | Material A-1 | 0.6 | 304 | 0% | No | Material B-2 | ZrO$_2$ | 45 |
| Example 3 | Material A-1 | 0.6 | 304 | 0% | No | Material B-3 | ZrO$_2$ | 55 |
| Example 4 | Material A-2 | 0.6 | 466 | 0% | No | Material B-4 | ZrO$_2$ | 85 |
| Example 5 | Material A-3 | 0.6 | 282 | 15% | No | Material B-5 | TiO$_2$ | 45 |
| Example 6 | Material A-4 | 0.6 | 304 | 0% | No | Material B-6 | ZrO$_2$ | 85 |
| Example 7 | Material A-5 | 0.8 | 304 | 0% | No | Material B-4 | ZrO$_2$ | 85 |
| Example 8 | Material A-1 | 0.6 | 304 | 0% | No | Material B-7 | ZrO$_2$ | 75 |
| Example 9 | Material A-1 | 0.6 | 304 | 0% | No | Material B-8 | ZrO$_2$ | 45 |
| Example 10 | Material A-1 | 0.6 | 304 | 0% | Yes | Material B-3 | ZrO$_2$ | 55 |
| Comparative Example 1 | Material A-6 | 1.1 | 282 | 15% | No | Material B-4 | ZrO$_2$ | 85 |
| Comparative Example 2 | Material A-7 | 0.8 | 226 | 41% | No | Material B-4 | ZrO$_2$ | 85 |
| Comparative Example 3 | Material A-1 | 0.6 | 304 | 0% | No | Material B-9 | ZrO$_2$ | 80 |
| Comparative Example 4 | Material A-1 | 0.6 | 304 | 0% | No | Material B-10 | ZrO$_2$ | 80 |
| Comparative Example 5 | Material A-1 | 0.6 | 304 | 0% | No | Material B-11 | ZrO$_2$ | 20 |

| | Second transparent resin layer | | | | | Evaluation of transfer film | | Evaluation of laminate: transparent electrode pattern-masking property |
|---|---|---|---|---|---|---|---|---|
| | Coating fluid solvent | Drying temperature | Refractive index | P/A (nm)$^{-1}$ | P | Profile of second transparent resin layer after transfer | Defects of second transparent resin layer Alkali developability | |
| Example 1 | MeOH(70%)/water(30%) | 70° C. | 1.65 | 0.046 | 1.0 | B | A | A |
| Example 2 | MeOH(70%)/water(30%) | 70° C. | 1.57 | 0.020 | 0.5 | A | A | D |
| Example 3 | MeOH(70%)/water(30%) | 70° C. | 1.60 | 0.035 | 0.8 | A | A | C |
| Example 4 | MeOH(70%)/water(30%) | 70° C. | 1.70 | 0.055 | 1.2 | B | A | A |
| Example 5 | MeOH(70%)/water(30%) | 70° C. | 1.65 | 0.030 | 0.6 | A | A | A |
| Example 6 | MeOH(70%)/water(30%) | 70° C. | 1.80 | 0.050 | 1.2 | B | A | B |
| Example 7 | MeOH(70%)/water(30%) | 70° C. | 1.70 | 0.065 | 1.4 | C | A | A |
| Example 8 | MeOH(50%)/water(50%) | 70° C. | 1.65 | 0.030 | 0.6 | A | A | A |
| Example 9 | MeOH(30%)/water(70%) | 120° C. | 1.56 | 0.015 | 0.3 | A | A | D |
| Example 10 | MeOH(70%)/water(30%) | 70° C. | 1.63 | 0.030 | 0.6 | A | B | A |
| Comparative Example 1 | MeOH(70%)/water(30%) | 70° C. | 1.70 | 0.090 | 1.6 | D | A | A |
| Comparative Example 2 | MeOH(70%)/water(30%) | 70° C. | 1.70 | 0.090 | 1.7 | D | A | A |
| Comparative Example 3 | MeOH(30%)/water(70%) | 70° C. | 1.65 | 0.090 | 1.6 | D | A | A |
| Comparative Example 4 | MeOH(90%)/water(10%) | 70° C. | 1.65 | 0.090 | 1.7 | D | A | A |

TABLE 4-continued

| | | | | | | | | |
|---|---|---|---|---|---|---|---|---|
| Comparative Example 5 | MeOH(50%)/ water(50%) | 70° C. | 1.53 | 0.005 | 0.1 | A | A | E |

From Table 4, it was found that, in a case in which P/A is within the range determined in the present invention, it is possible to produce laminates in which defects of the transparent resin layer having the metal oxide particles (the second transparent resin layer) do not easily become visible after being transferred and the transparent electrode pattern-masking property is favorable.

On the other hand, from Comparative Examples 1 to 4, it was found that, in a case in which P/A is above the upper limit value determined in the present invention, defects of the second transparent resin layer become clearly visible after being transferred.

From Comparative Example 5, it was found that, in a case in which P/A is below the lower limit value determined in the present invention, the transparent electrode pattern-masking property is poor.

In the same manner as in the method for computing the refractive indexes and thicknesses of the respective layers in a state of the transfer film, a black PET was adhered to the rear surface of a laminate obtained by sequentially laminating layers one by one on a transparent film substrate, the reflection spectrum was measured using the reflection spectroscopic film thickness meter FE-3000, and the refractive indexes and thicknesses of the respective layers of the laminate were computed by means of operation. As a result, the refractive indexes and thicknesses of the respective layers of the laminate were the same as those computed in a state of the transfer film.

Furthermore, the content of the metal oxide particles in the first transparent resin layer or the second transparent resin layer of the transfer film or the laminate of each of the examples and the comparative examples was measured using the following method.

A cross section of the transfer film or the laminate is cut and then observed using a transmission electron microscope (TEM). The ratios of the occupancy area of the metal oxide particles to the film cross-sectional area of the first transparent resin layer or the second transparent resin layer of the laminate are measured at three arbitrary places, and the average value thereof is considered as the volume ratio (VR).

The volume ratio (VR) and the weight ratio (WR) are converted using the following expression, thereby computing the weight ratio (WR) of the metal oxide particles in the first transparent resin layer or the second transparent resin layer of the transfer film or the laminate.

$$WR = D*VR/(1.1*(1-VR)+D*VR)$$

D: The specific weight of the metal oxide particles

The ratios can be computed with D that is 4.0 in a case in which the metal oxide particles are titanium oxide or 6.0 in a case in which the metal oxide particles are zirconium oxide.

Meanwhile, the content of the metal oxide particles in the first transparent resin layer or the second transparent resin layer of the transfer film or the laminate of each of the examples and the comparative examples can also be computed from the composition of the first transparent resin layer or the second transparent resin layer. The content of the metal oxide particles in the first transparent resin layer or the second transparent resin layer of the transfer film or the laminate was the same as the content computed from the composition of the first transparent resin layer or the second transparent resin layer.

Examples of methods for obtaining, from the transfer film of each of the examples and the comparative examples, the mass ratio of the polymerizable compound to the binder polymer in the first transparent resin layer, the molecular weight of the polymerizable compound having the minimum molecular weight among all of the polymerizable compounds included in the first transparent resin layer, and the ratio of the content of polymerizable compounds having a molecular weight of 300 or less to the content of all of the polymerizable compounds included in the first transparent resin layer include the following method in addition to a method in which those are obtained from the materials that are used to form the first transparent resin layer.

A constant amount of the transfer film is immersed in a suitable solvent which does not dissolve the binder polymer but dissolves the polymerizable compounds (for example, methanol or acetone) for one day, and a solution from which monomer components are extracted is produced. For this solution, the molecular weights of the polymerizable compounds and the amounts blended are analyzed from analyses using gas chromatography and liquid chromatography. In addition, the weight of polymer components that are not dissolved is measured, and the ratio of the weight to the amounts of the polymerizable compounds blended which are analyzed as described above is obtained. The mass ratio of the polymerizable compounds to the binder polymer is obtained in the above-described manner.

[Production of Electrostatic Capacitance-Type Input Device and Image Display Device (Touch Panel)]

To a liquid crystal display device manufactured using the method described in [0097] to [0119] of JP2009-47936A, a film including the previously-manufactured laminate of each example was attached, and, furthermore, a front glass plate was bound, thereby producing an image display device which had the laminate of each of the examples and included the electrostatic capacitance-type input device as a constituent element using a well-known method.

<<Evaluation of Electrostatic Capacitance-Type Input Devices and Image Display Devices>>

The electrostatic capacitance-type input devices and the image display devices including the laminate of each of the examples did not have a problem of the transparent electrode pattern becoming visible.

In the first transparent resin layer and the second transparent resin layer of the electrostatic capacitance-type input device did not have any defects such as air bubbles, and image display devices having excellent display characteristics were obtained.

EXPLANATION OF REFERENCES

1: transparent substrate (front surface plate)
2: mask layer
3: transparent electrode pattern (first transparent electrode pattern)
3a: pad portion
3b: connection portion 4: transparent electrode pattern (second transparent electrode pattern)
5: insulating layer
6: additional conductive element
7: first transparent resin layer (preferably having a function of a transparent protective layer)
8: opening portion
10: electrostatic capacitance-type input device
11: transparent film
12: second transparent resin layer (which may have a function of a transparent insulating layer)
13: laminate
21: region in which transparent electrode pattern, second transparent resin layer, and first transparent resin layer are laminated in this order
22: non-patterned region
α: taper angle
26: temporary support
27: thermoplastic resin layer
28: interlayer
29: protective film
30: transfer film
31: terminal portion of guidance wire
33: cured portion of first transparent resin layer and second transparent resin layer
34: opening portion corresponding to terminal portion of guidance wire (non-cured portion of first transparent resin layer and second transparent resin layer)
C: first direction
D: second direction

What is claimed is:

1. A transfer film comprising:
a temporary support;
a first transparent resin layer; and
a second transparent resin layer in this order,
wherein the second transparent resin layer includes metal oxide particles and an organic component including a monomer having an acidic group, and, in a case in which an area of a profile of a thickness-direction distribution of a ratio of metal atoms constituting the metal oxide particles to carbon atoms constituting the organic component in the second transparent resin layer is represented by A, and a peak height of the profile is represented by P, Expression (1) is satisfied:

$$0.01 \text{ (nm)}^{-1} \leq P/A \leq 0.08 \text{ (nm)}^{-1} \quad \text{Expression (1),}$$

a unit of the area A is nm, and the peak height P is a dimensionless number.

2. The transfer film according to claim 1, wherein, in a case in which the area of the profile is represented by A, and the peak height of the profile is represented by P, Expression (2) is satisfied:

$$0.02 \text{ (nm)}^{-1} \leq P/A \leq 0.05 \text{ (nm)}^{-1} \quad \text{Expression (2).}$$

3. The transfer film according to claim 1, wherein the peak height P of the profile is 0.2 to 1.5.

4. The transfer film according to claim 1, wherein the peak height P of the profile is 0.4 to 1.2.

5. The transfer film according to claim 1, wherein the first transparent resin layer and the second transparent resin layer are alkali-soluble.

6. The transfer film according to claim 1, wherein the first transparent resin layer includes polymerizable compounds and a binder polymer, and a mass ratio of the polymerizable compounds to the binder polymer is 0.9 or less.

7. The transfer film according to claim 6, wherein the binder polymer is an alkali-soluble resin.

8. The transfer film according to claim 1, wherein the first transparent resin layer includes polymerizable compounds, and a molecular weight of a polymerizable compound having a minimal molecular weight among all of the polymerizable compounds included in the first transparent resin layer is 250 or more.

9. The transfer film according to claim 1, wherein the first transparent resin layer includes polymerizable compounds, and a ratio of a content of polymerizable compounds having a molecular weight of 300 or less to a content of all of the polymerizable compounds included in the first transparent resin layer is 30% or less.

10. The transfer film according to claim 1, wherein the metal oxide particles are zirconium oxide particles or titanium oxide particles.

11. The transfer film according to claim 1, wherein the first transparent resin layer and the second transparent resin layer are in direct contact with each other.

12. An electrode protective film for an electrostatic capacitance-type input device which is obtained by removing the temporary support from the transfer film according to claim 1.

13. A laminate comprising:
a substrate including an electrode of an electrostatic capacitance-type input device;
a second transparent resin layer located on the substrate; and
a first transparent resin layer in this order,
wherein the first transparent resin layer and the second transparent resin layer are formed by transferring the first transparent resin layer and the second transparent resin layer from the transfer film according to claim 1 onto the substrate.

14. An electrostatic capacitance-type input device comprising:
the electrode protective film for an electrostatic capacitance-type input device according to claim 12.

15. An electrostatic capacitance-type input device comprising:
the laminate according to claim 13.

* * * * *